United States Patent
Chumbley et al.

(10) Patent No.: US 11,086,148 B2
(45) Date of Patent: Aug. 10, 2021

(54) WEARABLE DEVICES SUCH AS EYEWEAR CUSTOMIZED TO INDIVIDUAL WEARER PARAMETERS

(71) Applicant: Oakley, Inc., Foothill Ranch, CA (US)

(72) Inventors: Wayne Chumbley, Mission Viejo, CA (US); Jason Belbey, Fullerton, CA (US); Benjamin John Meunier, San Clemente, CA (US); Ryan Saylor, Mission Viejo, CA (US)

(73) Assignee: Oakley, Inc., Foothill Ranch, CA (US)

( * ) Notice: Subject to any disclaimer, the term of this patent is extended or adjusted under 35 U.S.C. 154(b) by 149 days.

(21) Appl. No.: 15/561,494

(22) PCT Filed: Apr. 29, 2016

(86) PCT No.: PCT/US2016/030227
§ 371 (c)(1),
(2) Date: Sep. 25, 2017

(87) PCT Pub. No.: WO2016/176630
PCT Pub. Date: Nov. 3, 2016

(65) Prior Publication Data
US 2018/0067340 A1 Mar. 8, 2018

Related U.S. Application Data

(60) Provisional application No. 62/155,369, filed on Apr. 30, 2015.

(51) Int. Cl.
*G02C 13/00* (2006.01)
*G06F 3/01* (2006.01)
(Continued)

(52) U.S. Cl.
CPC .......... *G02C 13/003* (2013.01); *B29D 12/02* (2013.01); *G02C 5/12* (2013.01); *G02C 7/027* (2013.01);
(Continued)

(58) Field of Classification Search
CPC ...... G02C 13/003; G02C 13/005; G02C 5/12; G02C 5/122; G02C 5/124; G02C 5/126;
(Continued)

(56) References Cited

U.S. PATENT DOCUMENTS

| | | | |
|---|---|---|---|
| 1,936,319 A | | 11/1933 | Wingate |
| 2,337,866 A | * | 12/1943 | Kurtz ................... G02C 13/003 351/227 |

(Continued)

FOREIGN PATENT DOCUMENTS

| WO | WO 1998/033086 A1 | 7/1998 |
|---|---|---|
| WO | WO 2012/123346 A2 | 9/2012 |

(Continued)

OTHER PUBLICATIONS

International Search Report and Written Opinion of the International Searching Authority, dated Aug. 5, 2016 in related PCT Application No. PCT/US2016/030227; 16 pages.

(Continued)

*Primary Examiner* — Travis S Fissel
(74) *Attorney, Agent, or Firm* — Sterne, Kessler, Goldstein & Fox P.L.L.C.

(57) ABSTRACT

Features are disclosed relating to an article such as eyewear customized to individual wearer parameters (e.g., measurements, preferences, etc.), and to systems and methods for customizing eyewear to individual wearer parameters. The system includes an input for receiving data representative of a three dimensional configuration of a portion of a wearer's face and an input for receiving data representative of a (Continued)

desired position where the wearer would like an eyewear frame to reside on the wearer's face. One system also includes a processor for determining a change in configuration of an eyewear component blank to allow the eyewear frame to reside in the desired position, and an eyewear component modifier for modifying the eyewear component blank so that the frame will reside in the desired position.

33 Claims, 24 Drawing Sheets

(51) Int. Cl.
| | |
|---|---|
| *G06T 19/20* | (2011.01) |
| *G02C 5/12* | (2006.01) |
| *B29D 12/02* | (2006.01) |
| *G02C 7/02* | (2006.01) |
| *G06F 30/00* | (2020.01) |

(52) U.S. Cl.
CPC .............. *G02C 7/028* (2013.01); *G06F 3/01* (2013.01); *G06F 30/00* (2020.01); *G06T 19/20* (2013.01); *G06T 2219/2004* (2013.01)

(58) Field of Classification Search
CPC .......... G02C 5/14; G02C 5/143; G02C 5/146; G02C 5/16; G02C 5/18; G02C 5/20; G02C 7/027; G02C 7/028; G06F 3/01; G06F 17/50; G06T 19/20; G06T 2219/2004
USPC ......... 351/111, 116, 124, 128, 137, 138, 178
See application file for complete search history.

(56) References Cited

U.S. PATENT DOCUMENTS

| | | | | |
|---|---|---|---|---|
| 4,045,137 | A | * | 8/1977 | Bradley, Jr. ............ G02C 5/122 |
| | | | | 351/132 |
| 4,331,393 | A | | 5/1982 | Bradley, Jr. |
| 4,704,015 | A | | 11/1987 | Grendol et al. |
| 4,730,915 | A | | 3/1988 | Jannard |
| 4,848,893 | A | | 7/1989 | Grendol |
| 6,010,218 | A | | 1/2000 | Houston et al. |
| 6,142,628 | A | | 11/2000 | Saigo |
| 6,144,388 | A | | 11/2000 | Bornstein |
| 6,533,418 | B1 | | 3/2003 | Izumitani et al. |
| 6,624,843 | B2 | | 9/2003 | Lennon |
| 6,692,127 | B2 | | 2/2004 | Abitbol et al. |
| 6,903,756 | B1 | | 6/2005 | Giannini |
| 6,944,327 | B1 | | 9/2005 | Soatto |
| 7,016,824 | B2 | | 3/2006 | Waupotitsch et al. |
| 7,062,454 | B1 | | 6/2006 | Giannini et al. |
| 7,079,158 | B2 | | 7/2006 | Lambertsen |
| 7,346,543 | B1 | | 3/2008 | Edmark |
| 7,347,545 | B1 | | 3/2008 | Jannard et al. |
| 7,479,956 | B2 | | 1/2009 | Shaw-Weeks |
| 7,712,035 | B2 | | 5/2010 | Giannini |
| 7,982,750 | B2 | | 7/2011 | Xie |
| 8,078,498 | B2 | | 12/2011 | Edmark |
| 8,275,590 | B2 | | 9/2012 | Szymczyk et al. |
| 8,321,301 | B2 | | 11/2012 | Manea et al. |
| 8,359,247 | B2 | | 1/2013 | Vock |
| 8,380,586 | B2 | | 2/2013 | Paolini |
| 8,556,420 | B2 | | 10/2013 | Sayag |
| 9,285,606 | B1 | | 3/2016 | Ramsdell |
| 2006/0098157 | A1 | * | 5/2006 | Lee ........................ G02C 1/00 |
| | | | | 351/44 |
| 2006/0109419 | A1 | | 5/2006 | Yves et al. |
| 2010/0026955 | A1 | * | 2/2010 | Fisher .................. G02C 13/003 |
| | | | | 351/205 |
| 2010/0053543 | A1 | | 3/2010 | Silver et al. |
| 2010/0306082 | A1 | | 12/2010 | Wolper et al. |
| 2012/0062555 | A1 | | 3/2012 | O'Connor et al. |
| 2012/0127199 | A1 | | 5/2012 | Aarabi |
| 2012/0287122 | A1 | | 11/2012 | Nadar et al. |
| 2013/0006814 | A1 | | 1/2013 | Inoue et al. |
| 2013/0125406 | A1 | * | 5/2013 | Delort .................. G02C 13/005 |
| | | | | 33/200 |
| 2013/0169922 | A1 | | 7/2013 | Austin |
| 2014/0104568 | A1 | | 4/2014 | Cuta et al. |
| 2014/0268007 | A1 | | 9/2014 | Ben-Shahar |
| 2015/0055086 | A1 | * | 2/2015 | Fonte ...................... G06F 16/22 |
| | | | | 351/178 |
| 2015/0338682 | A1 | | 11/2015 | Benoit et al. |
| 2015/0359423 | A1 | * | 12/2015 | Chuang ................ G02C 13/003 |
| | | | | 351/227 |
| 2018/0017815 | A1 | | 1/2018 | Chumbley et al. |

FOREIGN PATENT DOCUMENTS

| | | |
|---|---|---|
| WO | WO 2014/164347 A1 | 10/2014 |
| WO | WO 2015/027196 A1 | 2/2015 |

OTHER PUBLICATIONS

International Preliminary Report on Patentability, dated Oct. 31, 2017 in related PCT Application No. PCT/US2016/030227; 9 pages.

Supplementary European Search Report and European Search Opinion, dated Sep. 20, 2018 in related EP Application No. 16787263.9; 8 pages.

* cited by examiner

WEARABLE DEVICES SUCH AS EYEWEAR CUSTOMIZED TO INDIVIDUAL WEARER PARAMETERS

BACKGROUND

Field

This disclosure relates generally to wearable devices, including head mounted devices such as eyewear, customized for individual wearers, and to systems and methods for creating wearable devices customized for individual wearers.

Description of Related Art

Eyewear, such as spectacles, sunglasses, goggles, and the like, includes various structural components, such as: one or more lenses to convey light; earstems or headbands to secure the eyewear to the heads of wearers; nosepieces or faceplates to position the eyewear correctly on the wearers' faces; etc. Certain types of eyewear may be customized for individual wearers. For example, some eyewear may be adjusted for a particular wear via adjustments to the lenses (e.g., selection of prescription lenses), earstems (e.g., adjustments to flexible or re-orientable earstems), nosepieces (adjustments to flexible or re-orientable nosepieces), etc.

SUMMARY

Example embodiments described herein have several features, no single one of which is indispensable or solely responsible for their desirable attributes. Without limiting the scope of the claims, some of the advantageous features will now be summarized.

Some embodiments provide a system for customizing eyewear, including an input for receiving first data representative of a three dimensional configuration of a portion of a wearer's face, an input for receiving second data representative of a wearer preference regarding a desired position at which an eyewear frame is to reside with respect to the wearer's face, a processor for determining a change to at least a portion of an eyewear frame based at least partly on the first data and the second data, the change allowing the eyewear frame to reside substantially in the desired position, and an eyewear modifier for modifying the portion of the eyewear frame so that the eyewear frame will reside substantially in the desired position.

In some embodiments, the input for receiving first data includes an electrical connector, a wireless link, and/or a camera array. In some embodiments, the first data representative of the three dimensional configuration of the portion of the wearer's face includes data regarding a tear duct location, an eye corner location, a pupil location, a brow location, an ear location, a nasion location, a distance between eyes, a surface contour of a nose, a surface contour of a cheek, an eye plane, a vertical center plane, a nasion plane, and/or a rearward nasion plane. In some embodiments, the second data representative of the wearer preference includes data regarding a location of a portion of the eyewear frame with respect to a facial structure of the wearer, a degree of pantoscopic tilt of a lens, and/or an amount of wrap of a lens. In some embodiments, the second data representative of the wearer preference includes data regarding a material of the eyewear frame, a pressure exerted by an earstem on the wearer's head, and/or a size of a portion of the eyewear frame. In some embodiments, determining the change includes selecting a modular component, for installation in a portion of the eyewear frame, from a plurality of modular components configured to be installed in the portion of the eyewear frame. In some embodiments, the modular component includes a modular nosepad, a modular nosepiece, a modular earstem, a modular orbital, a modular bridge, and/or a modular component comprising a nosepiece and a bridge. In some embodiments, modifying the portion of the eyewear frame includes installing the modular component. In some embodiments, the portion of the eyewear frame includes an integral portion of the eyewear frame. In some embodiments, modifying the portion of the eyewear frame includes removing material from the portion of the eyewear frame. In some embodiments, modifying the portion of the eyewear frame includes adding material to the portion of the eyewear frame. In some embodiments, determining the change to the portion of the eyewear frame includes determining, based at least partly on third data representative of a three-dimensional configuration of the eyewear frame, a range of measurements within which the portion of the eyewear frame is permitted to be modified, determining that modifying the portion of the eyewear frame to correspond to a measurement within the range of measurements will cause, at least in part, the eyewear frame to reside substantially in the desired position, and determining a change to the portion of the eyewear frame that will cause the portion of the eyewear frame to correspond to the measurement. In some embodiments, the system determines that the change to the portion of the eyewear frame will not cause any portion of the eyewear frame to reside within a threshold distance of at least one of: a tear duct, a brow, and a cheek. In some embodiments, at least a portion of a three-dimensional model of the eyewear frame is deflected, with respect to a default configuration an undeflected state, when the three-dimensional model of the eyewear frame is placed in an as-worn configuration on a three-dimensional model of the wearer, and deflection to at least the portion of the three dimensional model of the eyewear is reversed, subsequent to determining the change, to generate a customized eyewear model in an undeflected state. In some embodiments, the customized eyewear model includes a lens having an optical centerline, and a deflection causes, at least in part, the optical centerline to move from a first orientation that is non-parallel with respect to a calculated straight-ahead line of sight of the wearer to a second orientation that is substantially parallel to the calculated straight ahead line of sight of the wearer.

Some embodiments provide a method of making customized eyewear, including obtaining a first data set representative of a three dimensional configuration of a portion of a wearer's face, obtaining a second data representative of a wearer preference regarding a desired position at which eyewear is to reside on the wearer's face, determining a change in configuration of at least a portion of the eyewear based at least partly on the first data and the second data, the change allowing the eyewear to reside in the desired position, and modifying the portion of the eyewear so that the eyewear will reside in the desired position.

In some embodiments, obtaining the first data set includes obtaining data captured as photographic images of the wearer. In some embodiments, determining the change includes determining a positive or negative variance between the nose region and the three dimensional configuration of the portion of the wearer's face to position the eyewear in the desired position. In some embodiments, modifying the portion of the eyewear includes removing material from the nose region. In some embodiments, modifying the portion of the eyewear comprises adding material to the nose region. In some embodiments, modifying the portion of the eyewear comprises adding a nosepiece subassembly to the eyewear. In some embodiments, the eyewear includes an eyeglass. In some embodiments, the eyewear includes a goggle.

Some embodiments provide a three dimensional orientationally corrected eyeglass including a frame, at least one lens, a left earstem, a right earstem, and a nonadjustable nosepiece, wherein the nosepiece comprises bilateral asymmetry configured to complement a bilateral asymmetry of a wearer's face, to position the eyeglass in a preselected orientation with respect to the wearer's face.

In some embodiments, at least a portion of the eyeglass conforms to a surface of a wearer model representative of a three-dimensional configuration of at least a portion of the wearer's head. In some embodiments, the wearer model defines a calculated straight-ahead line of sight crossing the center of a pupil and extending in an anterior-posterior direction along a horizontal plane parallel to the wearer model's central transverse plane, and at least a portion of an eyeglass model representative of a three-dimensional configuration of the eyeglass is deflected, with respect to a default configuration, when the eyeglass model is placed in an as-worn configuration on the wearer model such that the optical centerline of the lens is substantially parallel to the calculated straight ahead line of sight.

Some embodiments provide a nosepiece for eyeglasses, the nosepiece having left and right dermal contact surfaces having a total dermal contact surface area, wherein at least 85% of the total dermal contact surface area conforms to the three dimensional configuration of a corresponding surface of a wearer's nose. In some embodiments, at least 95% of the total dermal contact surface area conforms to the three dimensional configuration of the corresponding surface of the wearer's nose.

Some embodiments provide non-transitory computer-readable storage storing executable instructions that, when executed by a computing system, cause the computing system to perform a process including obtaining a data set representative of a three dimensional configuration of a portion of a wearer's body, obtaining a data set representative of a wearer preference regarding a desired position at which the wearable device is to reside on the wearer's body, determining a change in a configuration of a surface on the wearable device that brings the surface of the wearable device into conformity with the data set representative of the three dimensional configuration of the portion of the wearer's body, and modifying the surface on the wearable device to cause the wearable device to conform to the data set representative of the three dimensional configuration of the portion of the wearer's body in the desired position.

In some embodiments, the wearable device includes a head worn device. In some embodiments, the wearable device includes a helmet. In some embodiments, the wearable device includes an eyeglass. In some embodiments, the wearable device includes a goggle. In some embodiments, the nosepiece includes the surface. In some embodiments, modifying the surface includes selecting a modular nosepiece from a plurality of modular nosepieces, and installing the modular nosepiece Some embodiments provide an eyeglass including a frame, a first lens having a first optical centerline, and a second lens having a second optical centerline, wherein the first optical centerline and the second optical centerline form an angle of at least 2 degrees when the eyeglass is in an undeflected state.

In some embodiments, the first optical centerline and the second optical centerline form an angle of at least 15 degrees when the eyeglass is in an undeflected state. In some embodiments, a wearer model corresponding to a three dimensional model of at least a portion of a wearer's head defines a calculated straight ahead line of sight which crosses a center of a pupil and extends in an anterior posterior direction along a horizontal plane parallel to the wearer model's central transverse plane, and the first optical centerline is substantially parallel to the calculated straight ahead line of sight when a three dimensional configuration of the eyeglass is positioned in an as-worn orientation configuration on the wearer model. In some embodiments, the angle formed by the first optical centerline and the second optical centerline is reduced by at least 50% in the as-worn configuration as compared to the undeflected state. In some embodiments, the angle formed by the first optical centerline and the second optical centerline is reduced by at least 90% in the as-worn configuration as compared to the undeflected state.

Some embodiments provide an eyeglass including a frame and at least one lens having at least a first power and a second power, wherein a wearer model corresponding to a three dimensional model of at least a portion of a wearer's head defines at least a first line of sight corresponding to the first power and a second line of sight corresponding to the second power, and wherein the at least one lens is configured such that the first line of sight is aligned with a first portion of the lens corresponding to the first power and the second line of sight is aligned with a second portion of the lens corresponding to the second power when a three dimensional configuration of the eyeglass is positioned in an as-worn orientation on the wearer model. In some embodiments, the at least one lens includes a progressive lens power transition corridor extending between the first portion and the second portion.

BRIEF DESCRIPTION OF DRAWINGS

Throughout the drawings, reference numbers may be re-used to indicate correspondence between referenced elements. The drawings are provided to illustrate example embodiments described herein and are not intended to limit the scope of the disclosure.

FIG. 19A illustrates the profile of a properly configured and oriented lens for use in an eyeglass having downward rake, in accordance with some embodiments.

FIG. 19B illustrates the profile of a centrally oriented lens with no rake.

FIG. 19C illustrates a lens exhibiting downward rake but which is not configured and oriented to minimize prismatic distortion for the straight ahead line of sight.

DETAILED DESCRIPTION OF ILLUSTRATIVE EMBODIMENTS

Figure 1:
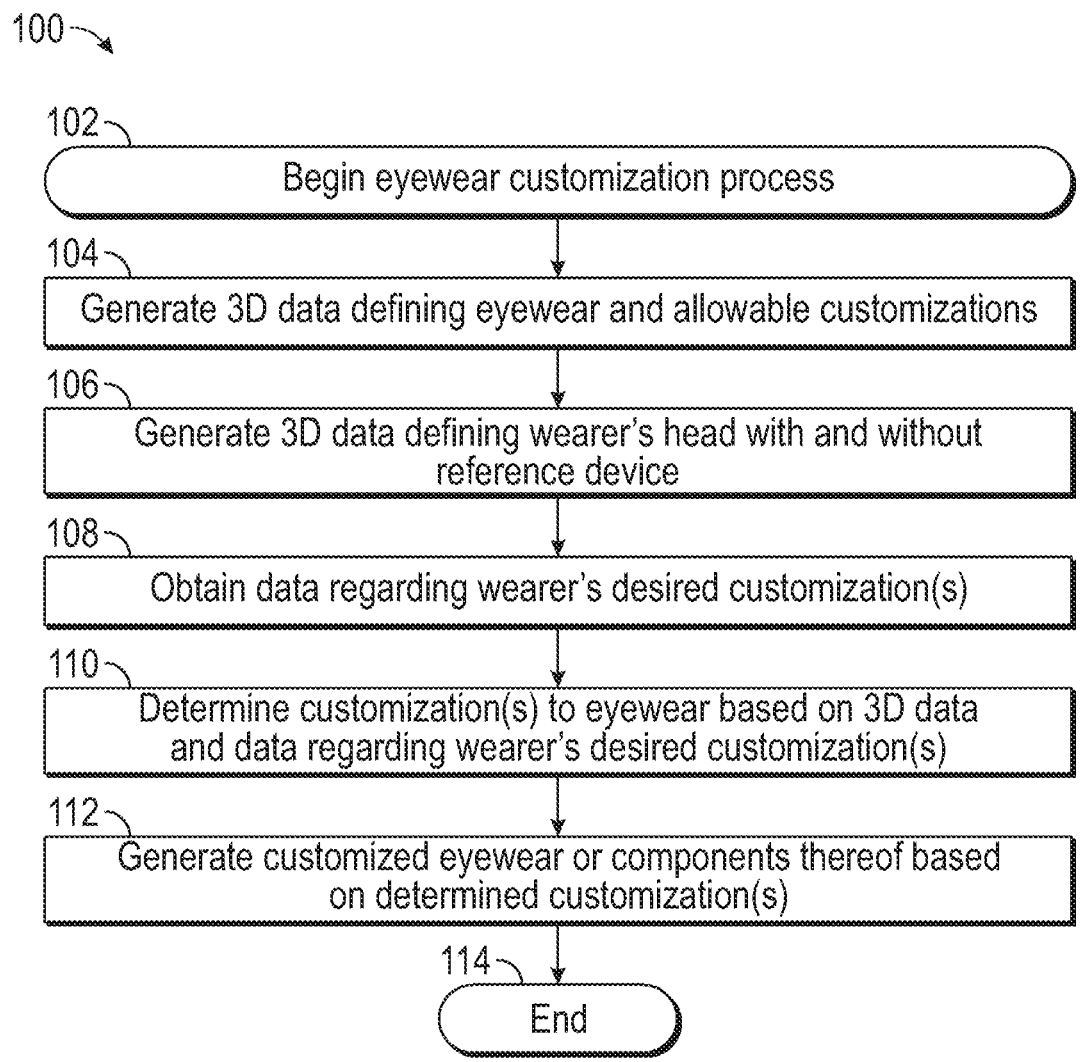
FIG. 1 is a flow diagram of an illustrative process for generating customized eyewear or components thereof according to some embodiments.

The present disclosure is directed to wearable devices which include at least one component or surface customized to complement an adjacent structure or surface of the wearer's body, in the as-worn orientation. The inventions will be disclosed primarily using the example of head worn devices such as eyewear, customized for individual wearers, and to systems and methods for creating eyewear customized for individual wearers. Three-dimensional ("3D") computer models of eyewear (e.g., prescription glasses, sunglasses, goggles, and the like) may be generated such that individual components of the eyewear, or the eyewear as a whole, may be customized or selected according to the parameters of individual wearers.

For example, a 3D model of eyewear may be generated and the model may define a range of measurements within which a particular component, such as a nosepiece, may be customized. The customizations may be made according to the facial structures and other features of an individual wearer. The measurements and/or other manufacturing parameters of the nosepiece (or other component) may be determined for a particular wearer by manipulating the 3D model of the eyewear with respect to a 3D model of the wearer's head. In this way, a nosepiece may be created or selected (or the eyewear may be otherwise customized) so the lens or lenses of the eyewear are at an optimal or desired location and orientation with respect to the wearer's line of sight, the frame of the eyewear sits at an optimal or desired location and orientation with respect to the wearer's facial structures, etc.

Customization may be accomplished to achieve any of a variety of objectives, including increasing or decreasing pantoscopic tilt, increasing or decreasing a degree of wrap, accommodating a desired base curve lens, increasing or decreasing the vertex distance or ventilation spacing, raising or lowering the lens in the vertical relative to the wearer's straight ahead line of sight, levelling the horizontal meridian of the eyewear such as to correct for tilting which might result from a wearer's nose structure or dissimilar ear height, and precisely controlling contact between the eyewear and the wearer.

The foregoing customizations may be accomplished by, e.g.: configuration of the wearer contacting surfaces of the nosepiece; increasing or decreasing the horizontal separation or angular relationship between opposing nose pads; elevating or lowering the nosepiece relative to the upper frame or upper lens edge; selecting a particular nosepiece from a set of pre-configured nosepieces, selecting a particular set of nosepads or individual left/right nosepads from a set of pre-configured nosepads, curving one or both earstems in the vertical or inclining one or both earstems in the vertical such as to level the eyewear on the wearer's face; curving one or both earstems in the horizontal or spacing the posterior portions of the earstems in the horizontal to account for different cranial geometries or wearer preferences; lengthening or shortening one or both earstems, selecting a particular earstem or pair of earstems from a set of pre-configured earstems, etc. For example, inclination of the earstem may be accomplished in either an up or down direction by providing a preformed bend in the earstem, or changing the launch angle at the hinge where the earstem connects to an orbital or other component of an eyeglass. The latter may be accomplished by providing a custom hinge, or by modifying the hinge attachment surface of the corresponding orbital, frame, lens or anterior hinge attachment surface on the earstem, depending upon the eyeglass configuration and desired result. In the example of customization to achieve levelling of the eyewear in the horizontal, the earstems will normally exhibit bilateral asymmetry in the vertical such that the posterior portion of the earstem that contacts the attachment point between the outer ear and the scalp will be vertically higher on one earstem than the other in the as-constructed configuration (i.e., without the need for a post manufacturing bending step). In the example of curving one or both earstems in the horizontal or otherwise spacing the posterior portions of the earstems in the horizontal, the distance between the posterior portions of the left and right earstems may be preset to correspond to the distance between the respective left and right attachment points of the wearer in the as-constructed configuration (e.g., the left and right attachment points between the scalp and the left and right ears, respectively, of the wearer). Alternatively, one or both earstems may be curved to exert a desired pressure on the respective left and right attachment points of the wearer in the as-worn configuration.

Some aspects of the present disclosure relate to generating eyewear, or individual components thereof, that conform to the dimensions, surface contours, and/or other features of a particular wearer's head without requiring manual adjustments or trial-and-error processes. In some embodiments, a component of eyewear may be manufactured using an additive process, such as 3D printing. For example, a nosepiece may be created from scratch, or the nosepiece may be created through addition of material to a base component, a structure that facilitates attachment with an eyewear frame, etc. In other embodiments, a component of eyewear may be manufactured using a subtractive process. For example, a base component that corresponds to the maximum dimensions of a nosepiece may be used as a starting point from which material is removed to achieve the desired customizations. In some embodiments, a component of eyewear may be created using a customized mold. For example, an injection mold or mold insert may be customized or produced (e.g., 3D printed). Such a customized injection mold may be used to create a limited number of custom-made injection molded components. In some embodiments, the three dimensional data described herein enables selection of a best fit component or eyeglass subassembly from an array of preformed stock parts (e.g., an array of up to about 5 different versions, up to about 10 different versions, up to about 20 different versions, etc. of a particular component), to construct a best fit eyewear without the need for true customization at the component level. Regardless of whether the eyewear or component is created using one of the aforementioned processes or using some other process, the end product component such as a nosepiece may be sized and/or contoured such that the dermal contact area of the nosepiece (e.g., the portion that comes in contact with the skin on wearer's nose during regular use) conforms closely to the surface contours and features of a portion of the wearer's nose based on a 3D model of the wearer's nose (e.g., at least about 85%, at least about 95%, or at least about 99% of the total dermal contact surface of the nosepiece conforms to the 3D configuration of the corresponding surface of the wearer's nose). In some cases, the nosepiece may exhibit bilateral asymmetry to complement a bilateral asymmetry of a wearer's face and to position the eyewear in an optimal or desired orientation on the wearer's face.

Additional aspects of the present disclosure relate to generating computer models of eyewear. Such models are referred to herein as "eyewear models." Individual styles of eyewear referred to as "models" in other contexts will be referred to herein as "eyewear styles" or "eyewear designs" for clarity. In some embodiments, eyewear may be modeled using a computer aided design ("CAD") system to generate a 3D model that includes measurements, relationships, and other parameters defining the eyewear or components thereof. The model may include, or be modified to include, information regarding the customizations that may be made to the eyewear while still maintaining the features, style, and other design elements of the eyewear. Once the eyewear model has been customized as desired, it (or some portion of it) is reproduced as a three dimensional physical article, in this example an eyewear, customized to conform to the target wearer.

For example, the eyewear model may include ranges within which specific components may be created or modified (e.g., minimum/maximum sizes). As another example, the eyewear model may indicate which specific components or other portions of the eyewear may be customized and which may not. In some embodiments, the model may include, or be modified to include, information to facilitate use of the model with 3D models of wearers' heads. For example, an eyewear model may include a coordinate system and/or reference points that correspond to the coordinate system and/or reference points of 3D models of wearer's heads.

Further aspects of the present disclosure relate to generating 3D models of wearers' faces or heads. Such models are referred to herein as "wearer models." A wearer may be photographed, scanned or otherwise imaged a first time while wearing or positioned in proximity to a reference device and a second time without the reference device. The image data may be combined or analyzed to determine points of contact between the wearer and the reference device. For example, a wearer may wear a reference device, which may be a sample of the eyewear that the wearer would like to customize, or which may be some other device, such as a device designed to accentuate specific points of contact with or dimensions of the wearer's head, a device that includes sensors (e.g., pressure sensors) to provide data to improve the scan or model, etc. The reference device may be painted or otherwise colored to facilitate digital removal of the reference device from scan data, similar to a "green screen" method as used in cinema and television. Temporary removal of the reference eyewear device from the scan may facilitate easier and/or more accurate alignment/overlay of the wearer scans capture with and without the reference device. As another example, areas of clearance (e.g., points or areas of a wearer's head where no contact is desired) may be determined. Such clearance can be important for proper fit and comfort given the different cranial geometries of individual wearers. In some embodiments, image data of a wearer's head or face may not be captured while the wearer is wearing or positioned in proximity to a reference device. Rather, the wearer may be imaged without any reference device, and a resulting 3D model of the wearer's face or head may be used to estimate or otherwise determine points of contact, areas of clearance, etc.

In some embodiments, image data of wearers' heads (or some portion thereof, such as the face, or the face and ear regions) may be captured using a plurality of different image capture devices such as cameras, with each camera positioned at a different location with respect to the wearers' head. The captured image data can thereafter be processed to produce a merged data set representative of a three dimensional configuration of the selected portion of the wearer's anatomy. In other embodiments, a single camera may be used to capture image data of wearers' heads from a plurality of different viewing angles with respect to the wearers' heads. In addition to scan data, a wearer model may include or be associated with information about specific preferences of the wearer, such as preferred contact points with points of eyewear, amounts of pressure from securement structures (e.g., earstems), points or areas of clearance, orientation with respect to the wearer's eyes or face, and the like.

Still further aspects of the present disclosure relate to customizing eyewear models with respect to wearer models to generate data describing eyewear customizations for a specific wearer. In some embodiments, an eyewear model to be customized may be positioned and oriented with respect to a wearer model according to some predefined or otherwise desired positional and/or orientation data, wearer preferences, and the like. Components or portions of the eyewear model may then be manipulated to maintain the desired position, orientation, etc. of the eyewear model with respect to the wearer model. For example, a nosepiece may be sized and/or shaped to maintain the frame of eyewear at a desired location and orientation with respect to a wearer's eyes and line of sight, to compensate for asymmetries in the wearer's nasal structure and/or eye positions, etc. As another example, one or both earstems may be sized and/or shaped to compensate for asymmetries in a wearer's ear positions. As a further example, orbitals may be sized and/or shaped to achieve a predefined or desired orientation with respect to surfaces and/or structures of a wears face, such as eyebrows, cheeks, etc. As a still further example, the orientation of the orbitals or lenses can be adjusted according to wearer preferences or to compliment the wear's face, such as by rotating the orbitals to a certain clockwise or counterclockwise angle (e.g., for a "droop" or "cat eye" look) or adjusting the degree to which the lenses wrap around the wearer's face. As yet another example, the distance between the lenses can be selected based on a wearer's nose size or head width. As a further example, the pantoscopic tilt can be selected to achieve a desired clearance from surfaces and/or structures of a wears face, such as eyebrows, cheeks, etc. As a still further example, a faceplate of a goggle may be sized and/or shaped to conform to the contours of a wearer's face, thereby reducing the thickness of a foam gasket and/or the compressibility of the gasket required to maintain a secure fit and proper seal (e.g., from elemental intrusion such as snow or cold air). In addition, the customized faceplate can maintain proper pressure distribution and avoid excessive pressure "hot spots" (e.g., around the nasal area that can interfere with comfortable breathing).

Various aspects of the disclosure will now be described with regard to certain examples and embodiments, which are intended to illustrate but not limit the disclosure. Although aspects of the embodiments described in the disclosure will focus, for the purpose of illustration, on customizing particular components of particular eyewear (e.g., nosepieces of eyeglasses, faceplates of goggles, etc.), one of skill in the art will appreciate that the features described herein may be applied to other components and/or other types of eyewear, or to entire pieces of eyewear. For example, the features disclosed herein may be applied to creating eyeglasses, goggles, or other eyewear in which multiple individual components or substantially all components are customized according to parameters and preferences of a specific wearer.

Illustrative Process for Creating Customized Eyewear

FIG. 1 is a flow diagram of an illustrative process 100 for generating customized eyewear or components thereof according to some embodiments. Advantageously, the process 100 may be used to generate eyewear (or eyewear components) customized for individual wearers without requiring manual adjustments or trial-and-error. In some cases, the customized eyewear or components may be non-adjustable such that they are permanently (or substantially permanently) configured to be worn by specific wearer.

Figure 2:
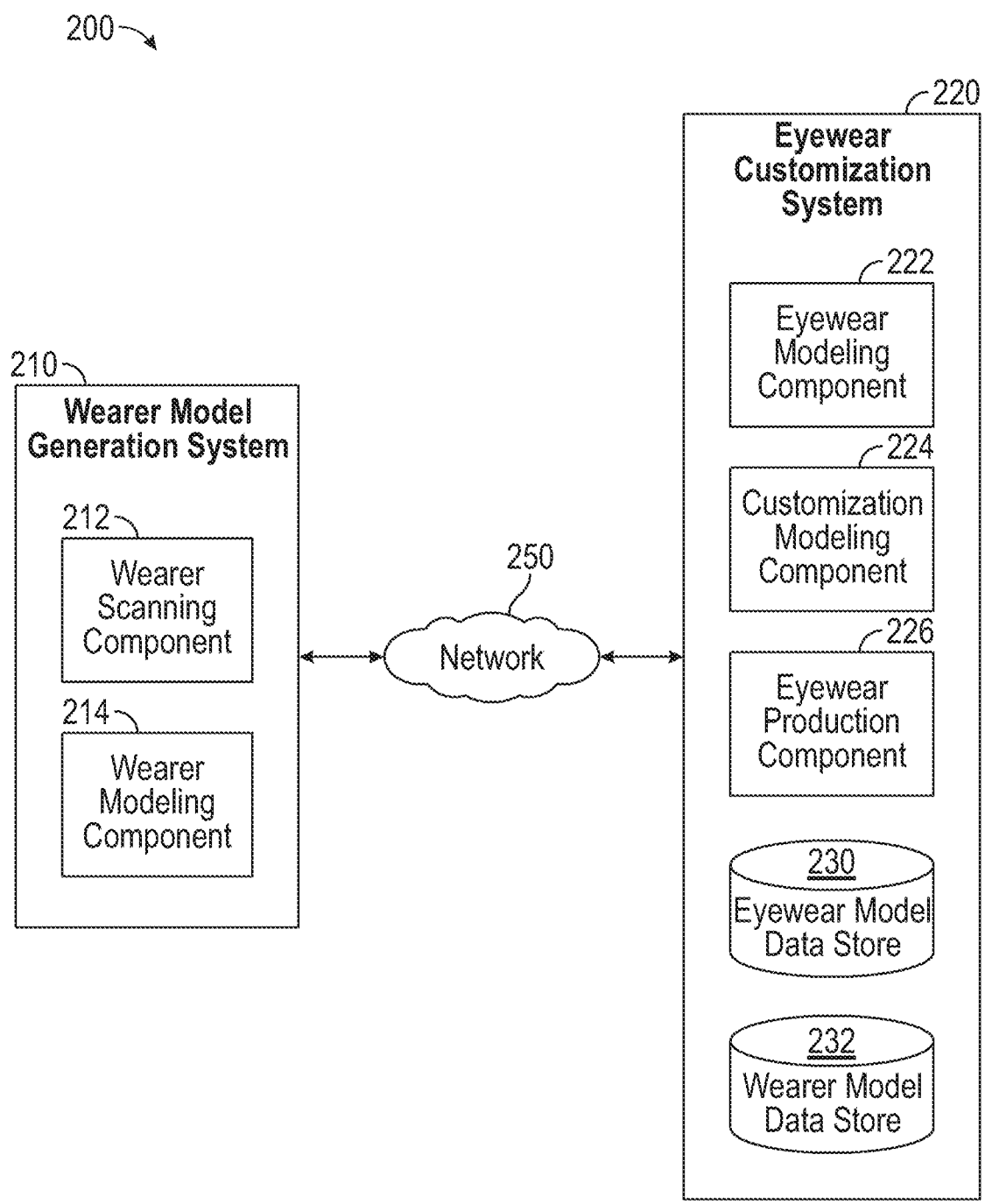
FIG. 2 shows an eyewear customization system according to some embodiments.

The process 100 or portions thereof may be performed by one or more computing systems, such as the computing systems shown in the illustrative environment 200 of FIG. 2. The environment 200 may include various devices, systems, services, and the like in communication via one or more networks 250. The network 250 may be a publicly accessible network of linked networks, possibly operated by various distinct parties, such as the Internet. In other embodiments, the network 250 may include a private network, personal area network, local area network, wide area network, cable network, cellular telephone network, etc. or some combination thereof, any or all of which may or may not have access to and/or from the Internet. In some embodiments, the process 100 or portions thereof may be performed by, or using input from, technicians using software executing on one or more computing devices.

As shown, the environment 200 may include a wearer model generation system 210 to obtain scan data and preferences for individual wearers and to generate wearer models. Illustratively, the wearer model generation system 210 (or individual components thereof) may be located at point-of-sale locations, such as optometrist offices, stores operated by non-prescription eyewear vendors, and the like. The environment 200 may also include an eyewear customization system 220 to manage the modeling of eyewear, determine how to customize eyewear for individual wearers, and to generate the customized eyewear or components thereof. Illustratively, the eyewear customization system 220 may be located remotely from point-of-sale locations, such as at eyewear manufacturer facilities. In some embodiments, a single system may perform most or all features of both the wearer model generation system 210 and eyewear customization system 220. For example, a single system or a collection of systems in a single physical location may scan wearers, generate wearer models, determine customizations to eyewear models, and generate the customized eyewear or components. In some embodiments, a personal computing device (e.g., mobile phone, tablet computer, laptop computer, desktop computer, peripheral device, etc.) may be used to obtain scan data and/or preference data from individual wearers. For example, a wearer's mobile phone may be used to capture images of the wearer's head.

The wearer model generation system 210 may include various components to provide the wearer modeling features described herein. For example, the wearer model generation system 210 may include a wearer scanning component 212 to photograph or otherwise scan a wearer, and a wearer modeling component 214 to generate a 3D computer model of a wearer based on scan data received from the wearer scanning component 212, preferences provided by the wearer, input provided by an operator (e.g., technician or sales representative), etc. Individual components of the wearer model generation system 210 may be available via a network and/or physically located remotely from the wearer scanning component 212. For example, the wearer scanning component 212 may capture images of a wearer and transmit the images, or data derived therefrom, to a remote wearer modeling component 214 that processes data from this particular wearer scanning component 212 and, optionally, from one or more additional wearer scanning components 212. In some embodiments, the wearer model generation system 210 may include fewer, additional, and/or alternative components than those illustrated in FIG. 2.

The eyewear customization system 220 may include various components and data stores to provide the eyewear modeling and customization features described herein. For example, the eyewear customization system 220 may include: an eyewear modeling component 222 to generate 3D computer models of individual eyeglasses, goggles, and other eyewear; a customization modeling component 224 to determine customizations for eyewear based on wearer models and preferences; an eyewear production component 226 to produce the physical customized eyewear or components; an eyewear model data store 230 to store eyewear models and to store information regarding how the eyewear may be customized; and a wearer model data store 232 to store wearer models, such as wearer models received from the wearer model generation system 210. In some embodiments, the eyewear customization system 220 may include fewer, additional, and/or alternative components and data stores than those illustrated in FIG. 2.

The components of the wearer model generation system 210 and/or the components of the eyewear model customization system 220 may each be implemented as hardware or as a combination of hardware and software. In some embodiments, the wearer model generation system 210 and/or the eyewear model customization system 220 may each be a single computing device, or one or both may include multiple distinct computing devices, such as computer workstations and/or servers, logically or physically grouped together to collectively operate as a computing system. For example: individual components of the wearer model generation system 210 may be implemented on separate physical computing devices; a subset or substantially all of the components of the wearer model generation system 210 may be implemented on a single computing device or group of computing devices configured to operate as a single computing system; individual components of the eyewear model customization system 220 may be implemented on separate physical computing devices; a subset or substantially all of the components of the eyewear model customization system 220 may be implemented on a single computing device or group of computing devices configured to operate as a single computing system; subsets of components from both the wearer model generation system 210 and eyewear model customization system, or substantially all components from both systems, may be implemented on a single computing device or group of computing devices configured to operation as a single computing system; etc.

Returning to FIG. 1, the process 100 may be embodied in a set of executable program instructions stored on one or more non-transitory computer-readable media, such as one or more disk drives or solid-state memory devices of the computing systems shown in FIG. 2. When the process 100 or some portion thereof is initiated at block 102, the executable program instructions can be loaded into memory, such as RAM, and executed by one or more processors of a computing system. In some embodiments, a computing system may include multiple computing devices, such as servers, and the process 100 or portions thereof may be executed by multiple servers serially or in parallel.

Figure 3:
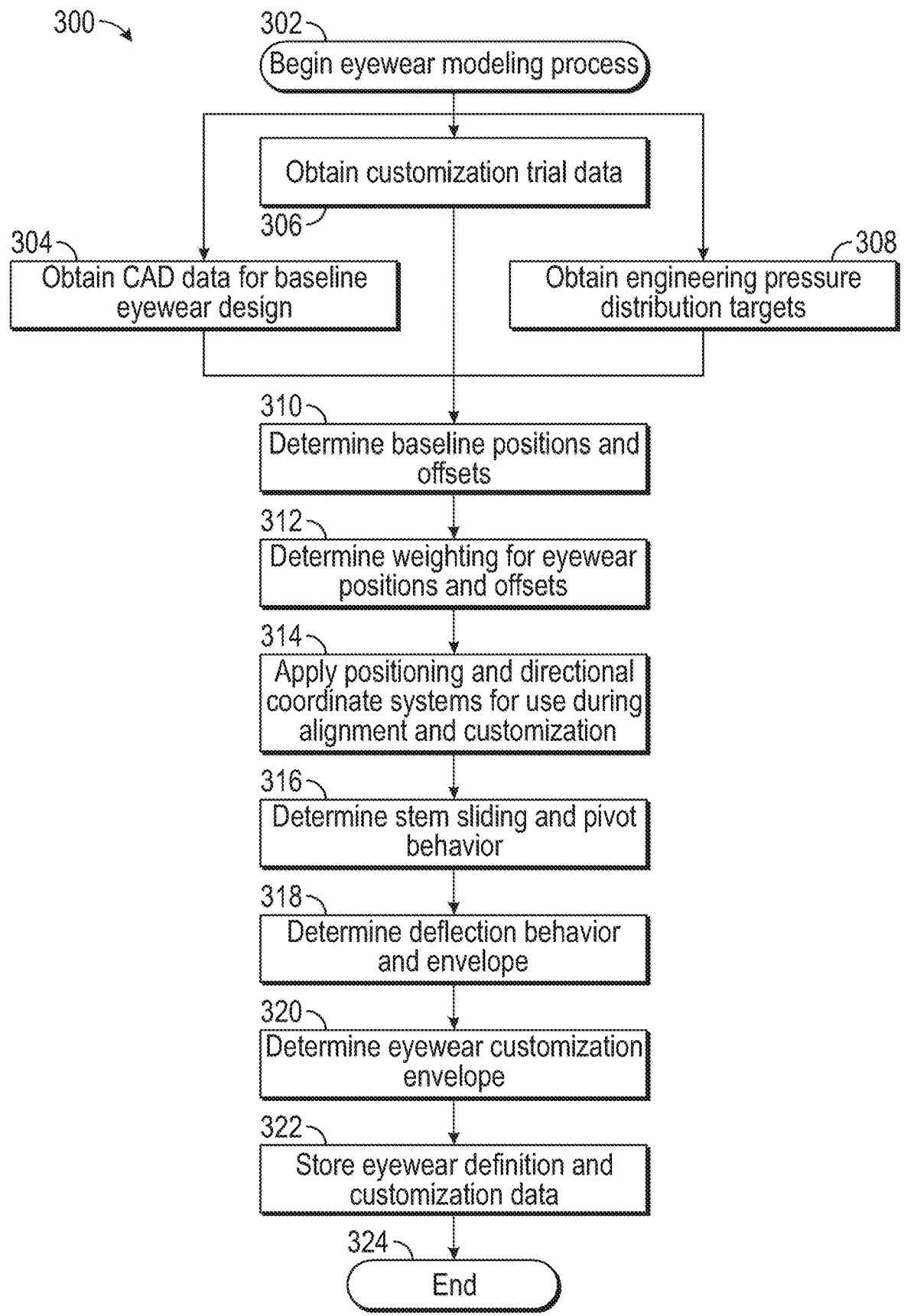
FIG. 3 is a flow diagram of an illustrative process for generating a three-dimensional model of customizable eyewear according to some embodiments.

At block 104, the eyewear modeling component 222 (or some other component of the eyewear customization system 220 or some other system) can generate a 3D eyewear model defining a particular style of eyewear, such as a specific eyeglass frame, goggles, or the like. In addition, the eyewear model defining a particular style of eyewear may include or otherwise be associated with data indicating which portions of the eyewear may be customized, the manner or degree to which the eyewear may be customized, etc. For example, an eyewear designer or manufacturer may offer several different styles of sunglasses (e.g., dozens or hundreds of different styles). A separate eyewear model may be generated or obtained for each of the styles or for some subset thereof. The eyewear model for a particular style may include measurements, relationships, and other parameters defining the style (or individual components thereof). In addition, the eyewear model may include, or be modified to include, information regarding the customizations that may be made to the eyewear while still maintaining the features and design elements of the particular style. In some embodiments, the eyewear model may include ranges within which specific components may be created or modified, or minimum/maximum sizes or other measurements for various components. For example, the eyewear model may specify a value between 0.5 mm and 1.50 mm as the maximum adjustment to the distance between the lenses or to the distance of each lens from the center point between the lenses; in some cases, this maximum may be specified as 1 mm. As another example, the eyewear model may specify a value between 1 mm and 4 mm as the maximum increase in the size of particular portions of the nosepiece; in some cases, this maximum may be specified as 2.5 mm. In some embodiments, the eyewear model may indicate which specific components or other portions of the eyewear may be customized and which may not. One process for generating eyewear models is shown in FIG. 3 and described in greater detail below. The process may be repeated for each eyewear style that the eyewear designer or manufacturer wishes to make available for customization. The 3D model data for eyewear may be stored in the eyewear model data store 232 or some other data store.

Figure 6:
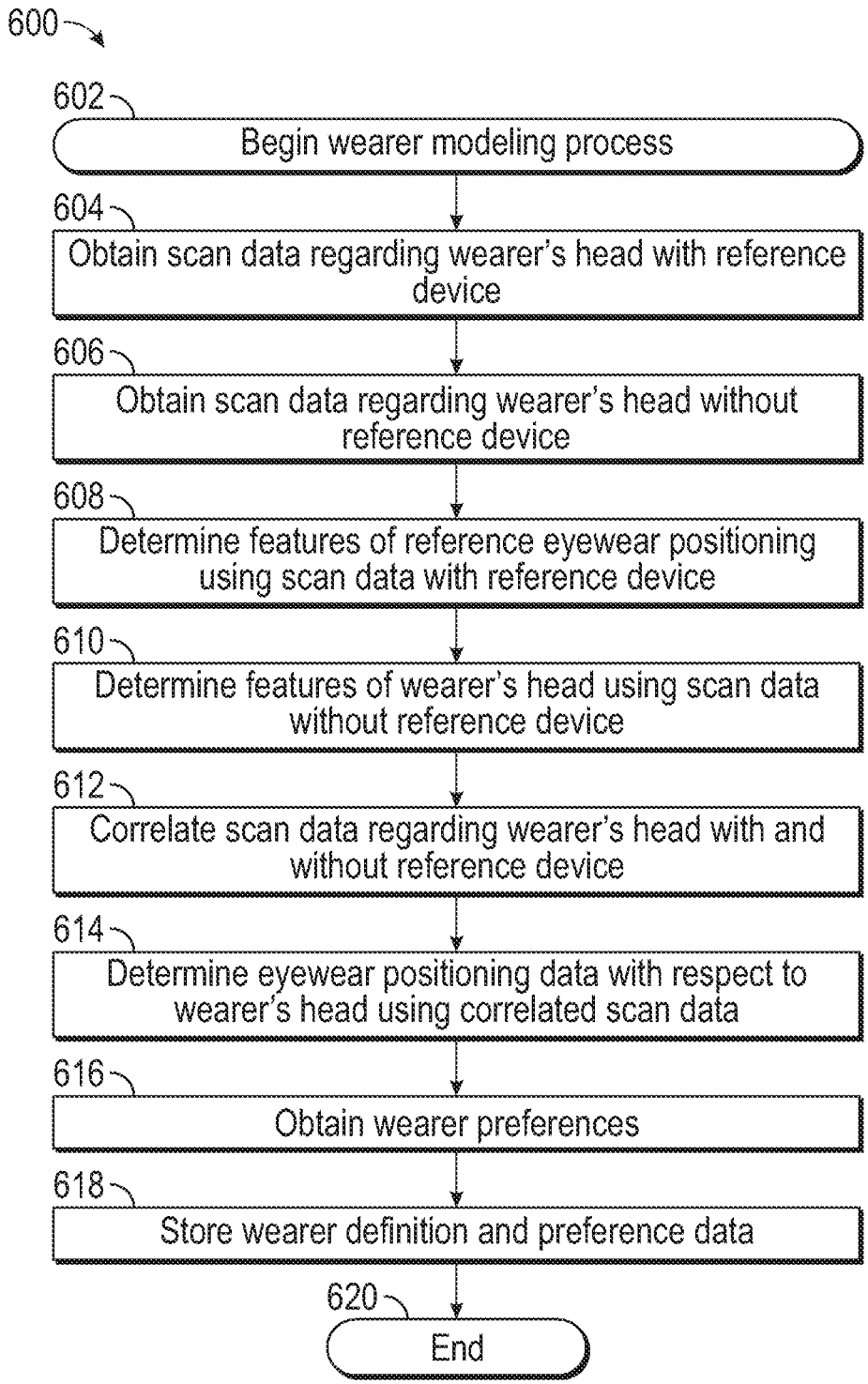
FIG. 6 is a flow diagram of an illustrative process for generating a three-dimensional model of a wearer's head according to some embodiments.

At block 106, the wearer modeling component (or some other component of the wearer model generation system 210 or some other system) can generate a 3D model of a particular wearer. A particular wearer may be photographed or otherwise scanned by a wearer scanning component 212 to generate 3D images of the wearer's head or some portion thereof, such as the wearer's face, ears, and/or other areas. In some embodiments, the wearer may be scanned one or more times, and each scan may be performed without the wearer wearing or being positioned in proximity to any reference device. In other embodiments, the wearer may be scanned multiple times: one or more times while wearing a reference device (e.g., reference eyewear), and one or more times without wearing any reference device. A 3D wearer model may be generated, and may include data identifying specific points to be used in the eyewear customization process, such as points of contact with the reference device, likely points of contact with particular eyewear styles, etc. One process for generating wearer models is shown in FIG. 6 and described in greater detail below. The wearer model may be transmitted to the eyewear customization system 220 and stored in the wearer model data store 232 for use by subsequent processes, as described herein.

At block 108, information may be obtained regarding the desired customizations of the wearer scanned above at block 106. An eyewear customization system may use such information to reconfigure or modify eyewear, or to select a modular component for the eyewear, as described in greater detail below. In some embodiments, an interface or control may be provided by which information regarding wearer preferences and customizations may be input or captured. For example, the wearer (or some other party, such as a technician or sales associate) may input information indicative of a preference for sunglasses to sit at a particular location on the wearer's nose. The information many include an offset measurement of a particular eyewear component from a particular facial feature, such as an offset of the nosepiece from the wearer's nasion or the tip of the wearer's nose, or an offset of the orbitals from the wearers cheeks or brows. The wearer may also or alternatively be scanned while wearing a reference device positioned at the preferred location on the wearer's nose, or a model of eyewear may be placed at the preferred location on a model of the wearer's face (e.g., in a virtual try-on process). The scan data or other model data may be translated or used to derive an offset of a particular eyewear component from a particular facial feature that has the effect of placing the eyewear at the preferred location on the wearer's nose. As another example, the wearer may input information indicative of a preference for sunglasses to be positioned at a particular location, offset, and/or orientation with respect to the wearer's eyes, brows, forehead, and/or cheeks. As a further example, the wearer may input information indicative of a preference that the earstems of the sunglasses exert a particular pressure or range of pressures on the wearer's head. The information may be provided in the form of specific pressure measurements or as ranges of pressure measurements, or the wearer may select from a range of reference eyewear with a desired pressure. As a still further example, the wearer may input formation indicative of a preference for shorter or longer earstems for comfort. The information may be provided in the form of specific earstem measurements, relative increases or decreases to default measurements, scan data with a reference device positioned at a preferred location from which an earstem length measurement can be derived, etc. As another example, the wearer may input information indicative of a preference for the eyewear frame to be wider or narrower, or otherwise be scaled up or down in overall size. As yet another example, the wearer may input information specifying a preferred location of eyewear orbitals with respect to the wearer's eyes. As a further example, the wearer may input information indicative of a preference for a particular degree of pantoscopic tilt or wrap to the lenses of the eyewear. As a still further example, the wearer may input information indicative of a preference for a particular grip location, icon adjustment, material, and/or other personalization to the look and feel of the eyewear (e.g., the addition or relocation of text, images, precious metals, or jewels on eyewear frames; the use of metal, nylon, plastic, or rubber for various eyewear components, etc.).

Data regarding the wearer preferences and desired customizations described above and any other wearer preferences and desired customizations may be provided to the eyewear customization system 220 in connection with the 3D model data for the wearer (e.g., wearer preference data may be embedded in the wearer model) or it may be provided separately. In some embodiments, a sample of eyewear or some other reference device may be physically re-positioned on the wearer's head, and data regarding the wearer's preferred location may be captured automatically (e.g., via sensors in the reference device, or via a scan of the wearer with the reference device in the desired location) or manually (e.g., measurements and locations may be taken by a technician or sales representative and entered into the wearer model generation system 210). In other embodiments, a model of eyewear may be virtually re-positioned on a model or image of the wearer's head until a position and/or orientation preferred by the wearer is achieved. Measurements and locations may then be automatically determined from the model.

At block 110, the customization modeling component 224 (or some other component of the eyewear customization system 220 or some other system) can use the eyewear model for a particular eyewear style and the wearer model for a particular wearer to determine how to customize eyewear for the particular wearer. In some embodiments, the eyewear model may be positioned on the wearer model, and the location and/or orientation of the eyewear model may be adjusted with respect to the wearer model according the specific design parameters of the eyewear and the wearer-specific preferences. The eyewear model (or specific components thereof) may then be modified to maintain the determined location and/or orientation with respect to particular portions of the wearer model. For example, a nosepiece may be enlarged, shrunk, and/or re-shaped to conform to the specific contours of the portion of the wearer's nose that will contact the nosepiece in order to maintain the lenses of the eyewear at a particular location and orientation with respect to the wearer's line of sight.

Figure 11:
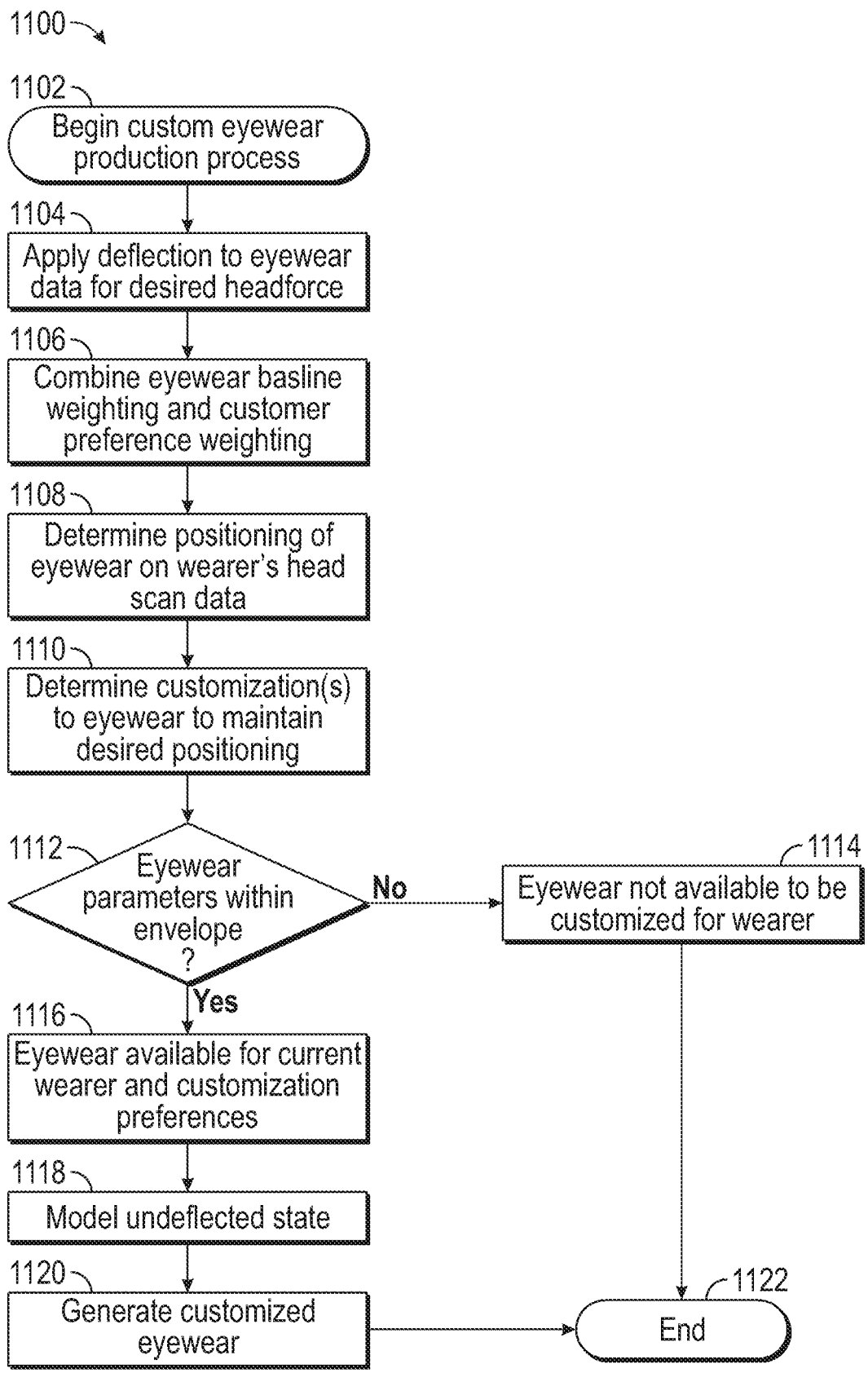
FIG. 11 is a flow diagram of an illustrative process for generating customized eyewear or components thereof according to some embodiments.

At block 112, the eyewear production component 226 (or some other component of the eyewear customization system 220 or some other system) can generate customized eyewear or eyewear components. In the example, above, the eyewear production component 226 can generate a customized nosepiece that, when installed on eyewear of the chosen style, will maintain the eyewear at the desired location and/or orientation with respect to the wearer's head. The eyewear production component may be an additive production component, such as a 3D printer, that produces customized eyewear or eyewear components based on the customized model generated at block 110. In some embodiments, the eyewear production component may be a subtractive production component that starts with an eyewear or eyewear component "blank" and, through controlled material removal, produces the customized eyewear or eyewear components based on the customized model generated at block 110. In some embodiments, an injection mold or injection mold insert may be generated (e.g., a limited-use or disposable mold may be 3D printed) or otherwise customized (e.g., a generic or "blank" mold may be customized using additive or subtractive processes). The mold may then be used to generate a customized component. For example, the mold may be placed in a thermoplastic injection molding machine, and a custom eyewear component may be created via injection molding. As another example, a portion of the eyewear may be created (e.g., 3D printed), placed into a receptacle in an injection mold, and overmolded with injection-molded plastic to form a hybrid eyewear component (e.g., partially 3D printed, partially injection molded). In some embodiments, the eyewear production component 226 may identify or select a particular pre-fabricated component from a set of available components based on the degree to which the component conforms to the determined customizations. For example, the eyewear production component 226 can identify a particular modular component, such as a nosepiece, orbital, earstem, bridge, etc., from a selection of available modular components that can be used with the eyewear style being customized. The selection of available module components may be of limited size, such as a selection of up to about 5 different versions of a component, up to about 10 different versions, up to about 20 different versions, up to about 50 different versions, etc. One example process for determining the customizations to the eyewear and for generating customized eyewear based on the determined customizations is shown in FIG. 11 and described in greater detail below.

Illustrative Process for Creating an Eyewear Model

FIG. 3 is a flow diagram of an illustrative process 300 for generating 3D eyewear models that may be used to generate customized eyewear as described herein. Advantageously, the process 300 may be used to generate models configured to be placed onto 3D wearer models and manipulated to implement eyewear customizations. The eyewear models generated using the process 300 illustrated in FIG. 3 define the baseline design parameters and customization envelopes for a particular eyewear design, and may be used in other processes, such as the process 1100 shown in FIG. 11, to generate eyewear customized for a particular wearer.

The process 300 may be embodied in a set of executable program instructions stored on one or more non-transitory computer-readable media, such as one or more disk drives or solid-state memory devices of the eyewear customization system 220 shown in FIG. 2. When the process 300 or some portion thereof is initiated at block 302, the executable program instructions can be loaded into memory, such as RAM, and executed by one or more processors of a computing system. In some embodiments, a computing system may include multiple computing devices, such as servers, and the process 300 or portions thereof may be executed by multiple servers serially or in parallel.

At block 304, the eyewear modeling component 222 (or some other component of the eyewear customization system 220 or some other system) can obtain and/or generate 3D data for the baseline design of a particular eyewear style. The 3D data for the baseline design may be obtained from an original design of the eyewear style generated using a CAD system. In some embodiments, such as when 3D data for the original design of the eyewear is not available, the 3D data may be generated via a scanning process in which a sample of the eyewear style is scanned to produce a 3D model.

At block 306, the eyewear modeling component 222 (or some other component of the eyewear customization system 220 or some other system) can obtain and/or generate metadata regarding the eyewear design. The metadata may include customization trial data, such as feedback regarding trial fittings with samples of the eyewear style. The customization trial data may indicate the comfort and effectiveness of various adjustments to baseline parameters of the eyewear design. For example, the customization trial data may indicate, for specific wearers, groups of wearers, or an average wearer overall, how changes to various eyewear parameters affect the eyewear center plane, eye or brow location, brow or cheek offset, etc.

At block 308, the eyewear modeling component 222 (or some other component of the eyewear customization system 220 or some other system) can obtain and/or generate additional metadata regarding the eyewear design, including pressure distribution targets. The pressure distribution targets may include pressure targets for particular eyewear components (e.g., earstems, headbands, nosepieces, faceplates, etc.) to secure the eyewear at a desired position and/or orientation with respect to a wearer's head and line of sight. The pressure distribution targets may include different target ranges or absolute targets for each of a variety of expected uses, such as general wear, jogging, extremely active use, etc.

At block 310, the eyewear modeling component 222 (or some other component of the eyewear customization system 220 or some other system) can obtain and/or generate metadata regarding the eyewear design, such as baseline positions and/or offsets for features of wearers. In some embodiments, baseline positions may correspond to the expected eye position, brow position, cheek position, etc. of the wearers. Baseline offsets may correspond to the distance of particular points of the eyewear from wearers' brows, cheeks, etc. The baseline positions and offsets may include a single set of positions and offsets for all wearers (e.g., average or median positions), or they may include sets of positions and offsets for each of multiple groups of wearers based on the particular wearer parameters associated with the group (e.g., common nose width, eye and/or ear location, cheek size, brow size, etc. for particular ethic groups, sexes, ages, and the like). In some embodiments, the baseline positions and offsets may be numerical values that represent measurements for the distance of offsets or that represent coordinates or sizes of eyewear components.

At block 312, the eyewear modeling component 222 (or some other component of the eyewear customization system 220 or some other system) can obtain and/or generate additional metadata regarding the eyewear design, including weighting factors for the eyewear positions and offsets. Weighting factors can be used to determine the relative importance of the various positions and offsets with respect to one another. The weighting factors can be used in cases where it is difficult or impossible to achieve or maintain each and every desired position and/or offset for a particular wearer, based on the parameters of the wearer (head scan, personal preferences, etc.). For example, a given style of sunglasses may have a location defined for optimal or desired eye location with respect to particular points of the sunglasses. The sunglasses may also have offsets defined for the optimal or desired distance from particular points of the sunglasses to the wearer's cheeks and brows (e.g., an offset in millimeters for cheeks and a separate offset in millimeters for brows). Based on the parameters of a specific wearer, it may be difficult or impossible to maintain all optimal or desired positions and offsets while staying with the design parameters of the sunglass style. In such cases, weighting factors may be used to achieve or come closer to achieving certain optimal or desired positions or offset (e.g., those with higher weights) at the expense of achieving other optimal or desired positions or offsets (e.g., those with lower weights). For example, a horizontal plane for use in later aligning an eyewear model with a wearer's face, as described in greater detail below, may be determined first by the placement of the reference eyewear on the wearer's face. However, if basing this horizontal plane on the reference eyewear is not desirable or possible for a particular wearer, the horizontal plane may be determined based on the location of the wearer's eyes or ears. As another example, if the wearer's nose is off-center with respect to the center pointer between the wearer's eyes, the eyewear may be oriented with respect to the center point between the wearer's eyes instead of the position of the wearer's nose, the distance between the lenses may be increased, the eyewear may be oriented off-center to a certain degree, etc. In some embodiments, as described in detail below, wearers may define their own weighting factors, which may override or be used in conjunction with the weights determined at block 312.

At block 314, the eyewear modeling component 222 (or some other component of the eyewear customization system 220 or some other system) can apply position and directional coordinate systems to the 3D model data for the eyewear. The coordinate systems may be applied so that the eyewear model may be aligned properly with a wearer model (such as a wearer model generated using process 600 described in greater detail below) in order to determine wearer-specific customizations. Thus, the coordinate systems applied to the eyewear model may be the same coordinates systems as the coordinate systems used in the wearer model, or coordinate systems that are compatible therewith.

At block 316, the eyewear modeling component 222 (or some other component of the eyewear customization system 220 or some other system) can determine the sliding and pivot behavior of the earstems for the eyewear style. During normal use, the earstems of eyewear can slide front-to-back and back-to-front on the portions of wearer's ears that connect the ears to the wearer's head. When the earstems are not properly fit to the wearer's head, the sliding behavior can become excessive and allow the eyewear to move too close to, or too far from, the wearer's eyes. In addition, the eyewear itself can pivot in the vertical direction on a wearer's head (e.g., the nosepiece and orbitals move upward away from the wearer's nose and eyes, respectively), while the earstems remain in contact with the wearer's ears. The sliding and pivot behavior of eyewear earstems can vary from style-to-style, and differences in the sliding and pivot behavior of a particular style's earstems can affect the manner and degree to which various aspects of the eyewear can be customized (e.g., pressure distribution targets for the earstems). In some embodiments, other sliding and movement behavior may be determined, such as the sliding and movement behavior of headbands used to secure goggles to the heads of wearers.

At block 318, the eyewear modeling component 222 (or some other component of the eyewear customization system 220 or some other system) can determine the deflection behavior and envelope for the eyewear style. The deflection behavior includes the manner and degree to which components of the eyewear deflect during normal use (in the "as-worn" state). In general, some amount of deflection is necessary for a particular eyewear frame to be properly mounted on a wearer's head. In an undeflected state (also referred to herein as the "default state" or "default unstressed configuration"), the distance between the earstems generally smaller than in the deflected state (also referred to herein as the "as-worn state" or "as-worn stressed configuration"). The outward deflection of the earstems in the as-worn state ensures that the eyewear exerts a slight squeeze, "headforce" or "retention force" to facilitate retaining the eyewear on the wearer's head. Too much headforce results in discomfort, and too little headforce results in eyewear that slips from a desired location on the wearer's head or for falls from the wearer's head altogether. In some embodiments, a data set that characterizes the deflection behavior of eyewear and/or eyewear components may be generated. For example, finite element analysis ("FEA") may be used to generate a stiffness matrix. The stiffness matrix may be a data set that describes eyewear as a series of nodes, each with a locating force proportional to its displacement from its rest position with respect to each of its neighboring nodes. Deflection of the eyewear may be modeled by computing the node deflection that results from application of a load to the nodes. Thus, headforce and deflection in the as-worn state can be predicted or simulated from the stiffness matrix. In addition, the forces can be applied in reverse to predict or simulate an undeflected state that will result in a desired degree of deflection in the as-worn state when worn by a particular wearer (e.g., a wearer with a particular head size that spreads the earstems apart by a particular amount). The deflection envelope defines the outer limits within the individual components may deflect. For example, earstems of a particular style may deflect up to 2 inches, while the frame in the nose region may deflect up to 0.25 inches.

At block 320, the eyewear modeling component 222 (or some other component of the eyewear customization system 220 or some other system) can determine the eyewear customization envelope for the eyewear style. The eyewear customization envelope can identify the components and features of the eyewear style that are allowed to be changed for wearer-specific customizations, and the envelope within which the components and features may be changed. The eyewear customization envelope can also identify the components and features that are not permitted to be changed. In some embodiments, only a single component or surface of the eyewear style may be changed, such as the nosepiece. The eyewear customization envelope for the eyewear style may therefore indicate that only the nosepiece may be changed, and may indicate maximum and/or minimum measurements for certain dimensions of the nosepiece or portions thereof, the maximum rate at which surface contours can change over a particular area, etc. In other embodiments, additional or alternative components and/or surfaces may be changed, and the eyewear customization envelope can identify them accordingly. For example, earstem thickness and/or bending characteristics, frame thickness and/or bending characteristics, etc. may be specified in the eyewear customization envelope. Other examples of customizations that may be specified in the eyewear customization envelope include the pressure or range of pressures that the earstems exert on the wearer's head, the maximum and/or minimum lengths for the earstems, the maximum and/or minimum width or overall size of eyewear, the maximum and/or minimum distance between the lenses, the degree or maximum angle by which orbitals may be rotated, and the maximum and/or minimum degree of pantoscopic tilt or wrap to the lenses of the eyewear.

Figure 4A:
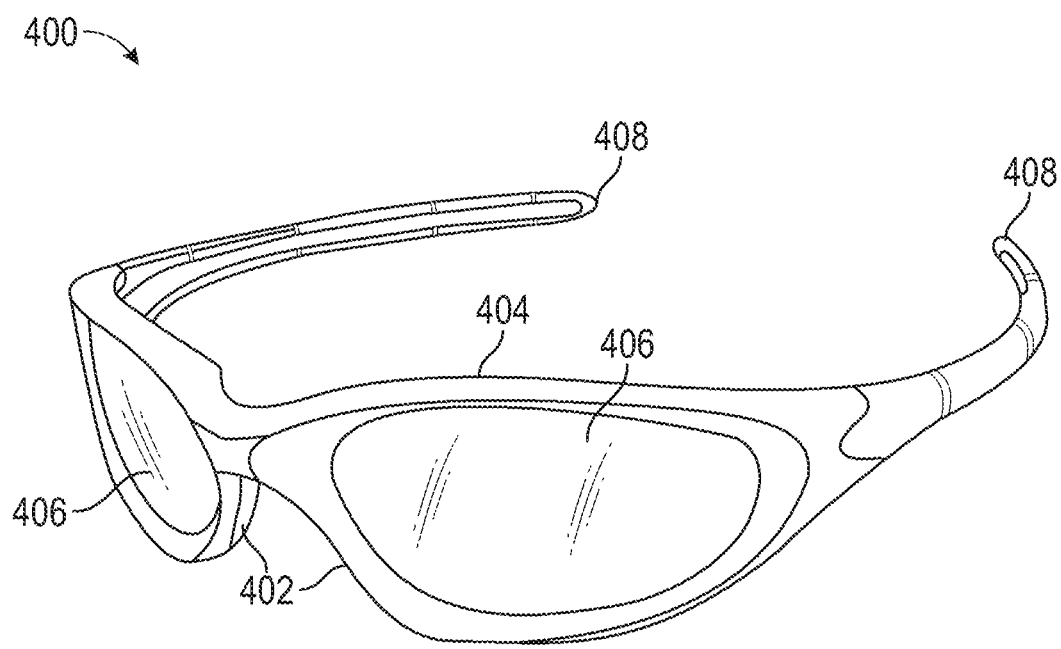
FIGS. 4A and 4B show illustrative three-dimensional models of customizable eyeglasses according to some embodiments.

FIG. 4A shows an illustrative eyewear model 400 of sunglasses, such as an eyewear model obtained at block 304 above. As shown, eyewear model 400 includes nosepieces 402, a frame 404, lenses 406, and earstems 408. Although the eyewear model 400 includes all of these components, in some cases only a subset may be permitted to be changed. In some embodiments, the lenses 406 may be permitted to be changed. For example, the location, orientation, wrap, rake, gradient location, bifocal/trifocal/progressive locations, base curve adjustment, asymmetrical bias (shooting, batting, etc.), lens shape and size, and other parameters of the lenses 406 may be adjusted to achieve an optimal or desired line of sight or other optical characteristics, as described in greater detail below with respect to FIGS. 16A-20B. In other embodiments, the eyewear frame 404 or individual components such as the nosepieces 402 and earstems 408 may be customized instead of, or in addition to, the lenses 406.

Figure 4B:
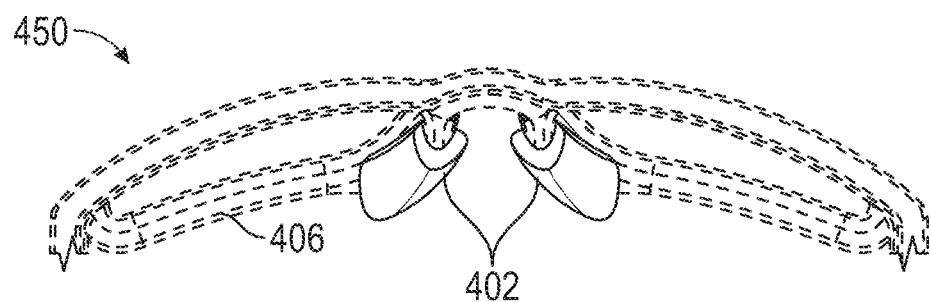

FIG. 4B shows a version of the eyewear model 450 with eyewear customization envelope data applied. In eyewear model 450, the components permitted to be changed—nosepieces 402—are indicated as such, while frame 406 and the remainder of the components (not shown) are indicated as not permitted to be changed. The nosepieces 402 are shown at their maximum permitted size in eyewear model 450. In addition, eyewear model 450 may include eyewear customization envelope data indicating the minimum permitted size, or the maximum amount of material that may be removed from the nosepieces 402 (not shown).

Figure 5A:
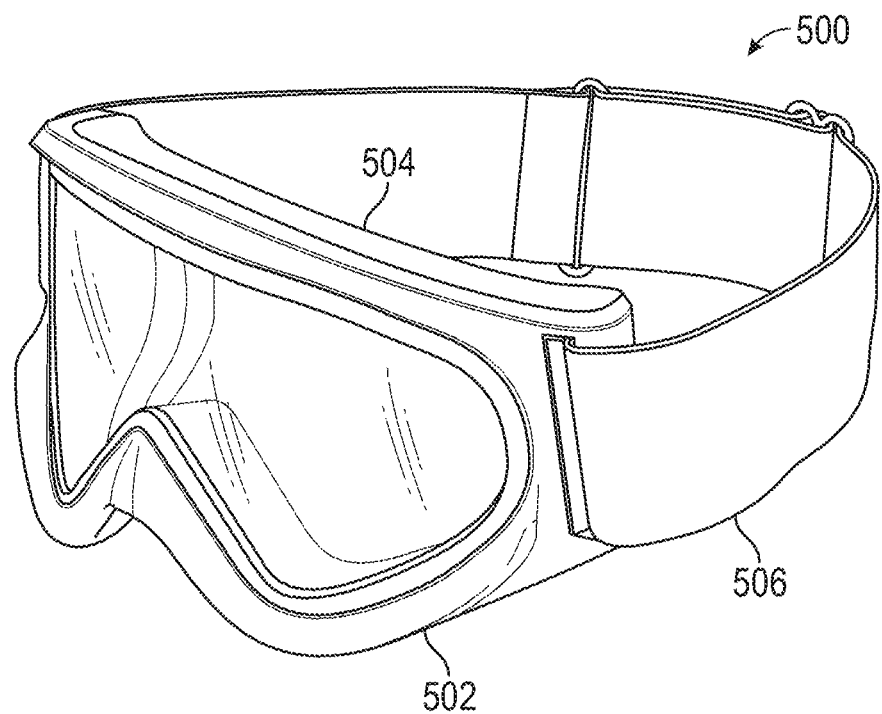
FIGS. 5A and 5B show illustrative three-dimensional models of customizable goggles according to some embodiments.

FIG. 5A shows an illustrative eyewear model 500 of goggles, such as an eyewear model obtained at block 304 above. As shown, eyewear model 500 includes a frame 502, gasket 504, and headband 506. Although eyewear model 500 includes all of these components, in some embodiments only a subset may be permitted to be changed. For example, only the frame 502 may be customized, or only the gasket 504 may be customized, or only the headband 506 may be customized. As another example, two or all three components may be customized, or additional or alternative components may be customized, etc.

Figure 5B:
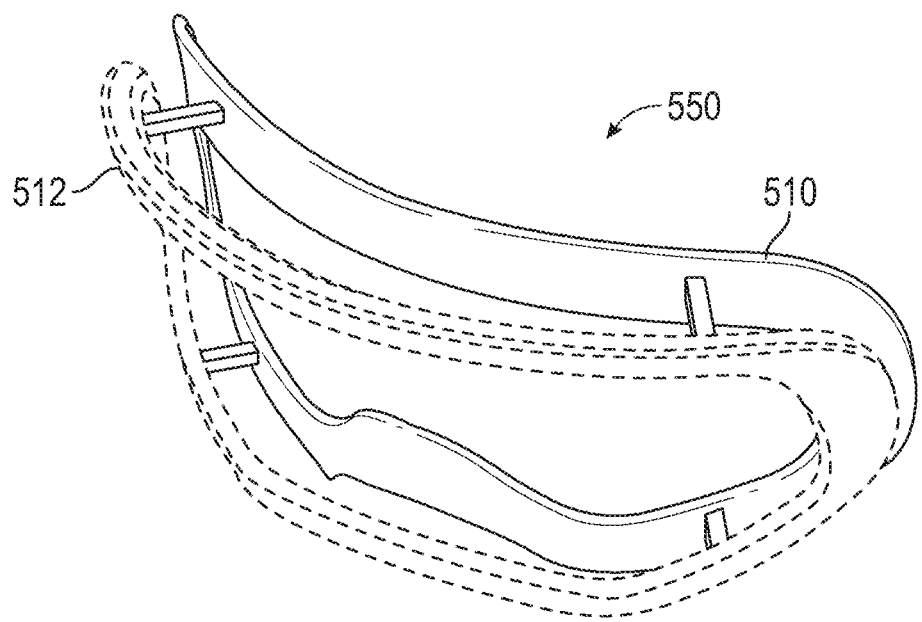

FIG. 5B shows a version 550 of the eyewear model of the frame 502 with eyewear customization envelope data applied. In eyewear model 550 of the frame, the component permitted to be changed—posterior frame 510, also referred to as a faceplate—is indicated as such, while another component of the frame—anterior frame 512, which houses the lens of the goggle—is indicated as not permitted to be changed. The faceplate 510 may be customized to conform to the contours of a wearer's face. The use of a faceplate 510 customized to the face contours of a specific wearer can allow use of a thinner gasket 504 (not shown in FIG. 5B) or a gasket 504 made of different material (e.g., less compressible, less resilient, etc.) than conventional gaskets. Conventional gaskets are typically designed to fill all of the gaps between the uniform curvature of conventional faceplates and all varying face shapes of a wide range of potential wearers, and are therefore typically both thick and highly compressible.

Returning to FIG. 3, at block 322 the eyewear modeling component 222 (or some other component of the eyewear customization system 220 or some other system) can store the eyewear model (with the eyewear customization envelope integrated within the eyewear model or stored separately from the eyewear model) for the eyewear style. Illustratively, the eyewear model may be stored in the eyewear model data store 230.

Illustrative Process for Creating a Wearer Model

FIG. 6 is a flow diagram of an illustrative process 600 for generating 3D models of wearer's faces that may be used to generate customized eyewear as described herein. Advantageously, the process 600 may be used to generate wearer models configured to allow models of customizable eyewear, such as eyewear models generated according to the process 300 described above, to be placed onto the models of the wearer's faces and determine wearer-specific eyewear customizations.

The process 600 may be embodied in a set of executable program instructions stored on one or more non-transitory computer-readable media, such as one or more disk drives or solid-state memory devices of the wearer model generation system 210 shown in FIG. 2. When the process 600 or some portion thereof is initiated at block 602, the executable program instructions can be loaded into memory, such as RAM, and executed by one or more processors of a computing system. In some embodiments, a computing system may include multiple computing devices, such as servers, and the process 600 or portions thereof may be executed by multiple servers serially or in parallel. In some embodiments, the process 600 or portions thereof may be performed by, or using input from, technicians using software executing on one or more computing devices.

Figure 8A:
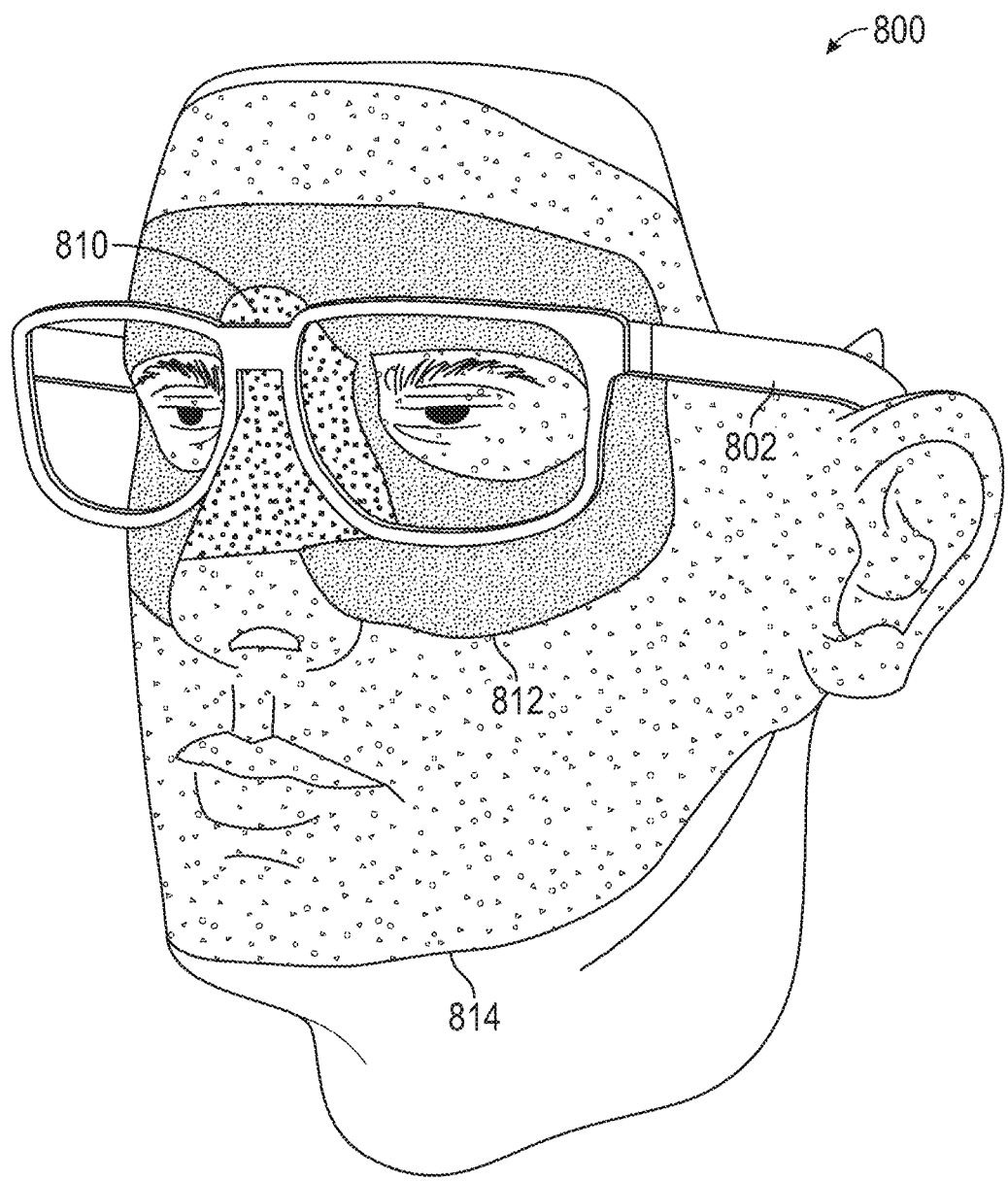
FIGS. 8A and 8B show illustrative three-dimensional scans of a wearer's head with and without a reference device according to some embodiments.

At block 604, the wearer modeling component 214 (or some other component of the wearer model generation system 210 or some other system) can obtain scan data regarding the head of an individual wearer. The wearer may be wearing a reference device, such as a sample of the eyewear design that the wearer would like to have customized. In some embodiments, the reference device may be a standard reference eyewear, such as eyewear with standardized positional indicators. In other embodiments, the reference device may be a partial eyeglass frame, such as the earstems, nosepiece(s), and upper frame of an eyeglass. In additional embodiments, the reference device may not be "eyewear," but may instead be some other device worn on or otherwise positioned in close proximity to a wearer's head. Illustratively, the reference device may include sensors (e.g., pressure sensors) to provide additional data to the wearer model generation system 210. One example of a reference device is shown in FIG. 8A. Although the example reference device described in detail below and shown in FIG. 8A is reference eyewear, one of skill in the relevant art will appreciate that other appropriate non-eyewear reference devices may be used. In some embodiments, no scan data may be obtained regarding the wearer while he/she is wearing a reference device. Instead, the process of determining reference points on the wearer's head, such as eyewear contact points, may be performed using scan data of the wearer's head alone without any reference device.

The scan data may be generated by a wearer scanning component 212 or some other surface topography capture device. The image data may be photographic data, such as from one or a series of images that can be combined to form a 3D model or from which a 3D model may otherwise be derived. The images may be black and white, grayscale, color, etc. In some embodiments, non-visible scan data may additionally or alternatively be captured to generate or enhance a wearer model. For example, energy outside of the visible wavelengths may be captured, such as infrared scans, sonograms derived from reflected sound signals such as ultrasound, x-rays, and any other modality from which a reflected, transmitted or absorbed signal can be utilized to obtain or approximate data corresponding to a three dimensional surface of at least a portion of a wearer's head. Such data may be used to create or modify a wearer model and produce customized eyewear.

Figure 7:
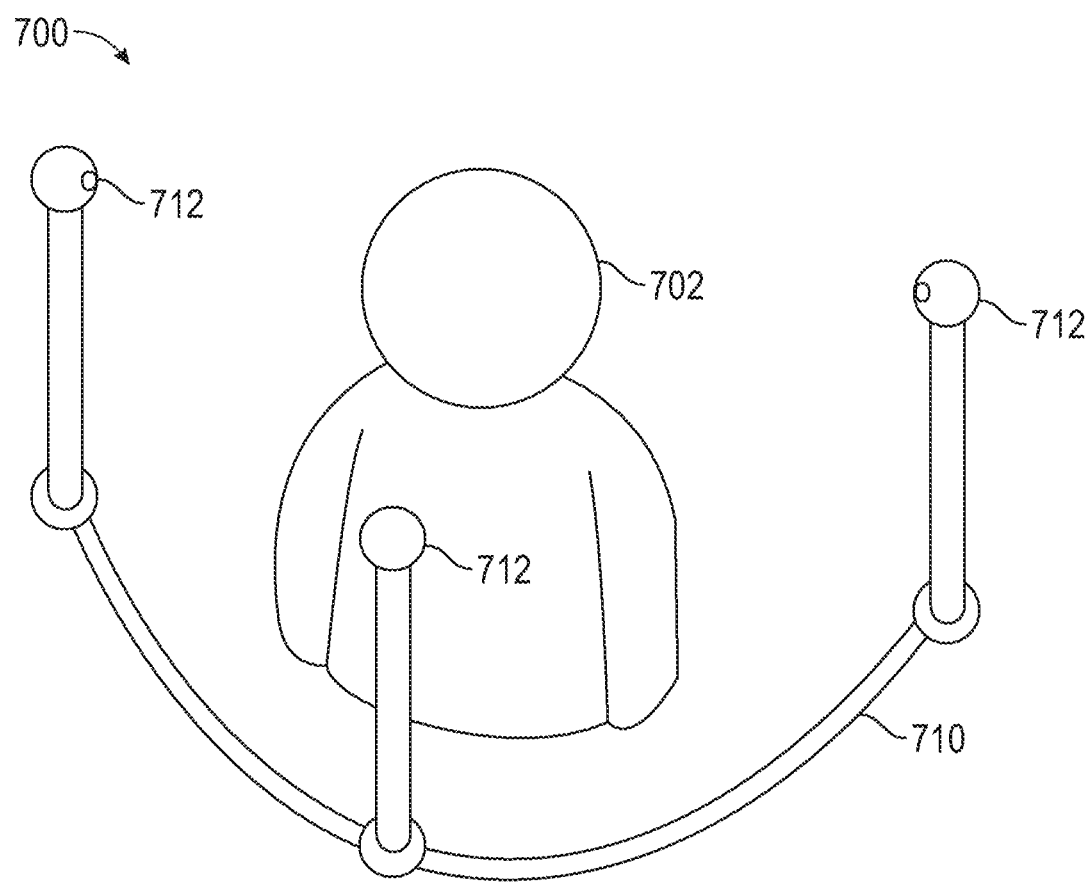
FIG. 7 shows an illustrative scanning apparatus according to some embodiments.

FIG. 7 shows one example wearer scanning component 700. As shown, the wearing scanning component 700 may include an array of cameras 712 positioned at different locations with respect to a wearer's head 702. The cameras 712 may be coupled to placement structure 710, such as an arcuate, circular, or triangular member. The placement structure 710 may position the cameras 712 at desired locations, such as in front of the wearer's head 702 and at the left and right sides. The cameras 712 may be coupled to the placement structure 710 at fixed locations, or the locations of the cameras 712 on the placement structure 710 may be adjustable. In some embodiments, the height of some cameras 712 with respect to the wearer's head 702 may be different than the height of other cameras 712. For example, the cameras to the left and/or right side of the wearer's head, positioned to capture photos or other scans of the wearer's profile (and, more specifically, a portion above or near the wearer's ears) may be positioned higher than the camera directly in front of the wearer. This difference may be desirable in order to scan, from a downward-looking angle, the portion of the wearer's head 702 that contacts (or will come in contact) with the earstems of eyewear.

FIG. 8A shows an example 3D model 800 of a particular wearer, generated from one or more scans of the wearer while the wearer is wearing reference eyewear 802. In some embodiments, the entire model 800 does not necessarily need to be created to the highest level of accuracy possible under the constraints of the wearer scanning component 212. Rather, the portions of the wearer's head that have a direct or significant impact of the fit of eyewear may be modeled to a high degree of accuracy, while other portions of the wearer's head may be modeled to a lower degree of accuracy, or not modeled at all. As shown, the model 800 includes a 3D representation of the wearer's face and ears, but the rest of the wearer's head is not represented. A first region 810 of the wearer's face, corresponding to portions of the wearer's nose and eyes, may be modeled to a high degree of accuracy, such as accuracy to about 0.1 mm, about 0.15 mm, or about 0.2 mm. A second region 812, corresponding to portions of the wearer's cheeks, eyes, and brow, may be modeled to a moderate degree of accuracy, such as to about 0.25 mm, about 0.35 mm, or about 0.45 mm. A third region 814, corresponding to portions of the wearer's forehead, ears, cheeks, nose, and other areas of the wearer's head, may be modeled to a lower degree of accuracy, such as to about 0.5 mm, about 0.67 mm, or about 0.75 mm. In some embodiments, the specific degrees of accuracy and corresponding areas may be different, depending upon the eyewear type and/or style. For example, customizing eyeglasses and, in particular, the nosepieces of eyeglasses may require a high degree of accuracy for only a small portion of the wearer's nose (e.g., portions on the side of the wearer's nose and/or the nasion), while customizing goggles and, in particular, the faceplates of goggles may require a high degree of accuracy for a larger portion of the wearer's nose and the wearer's face around the eyes.

Figure 8B:
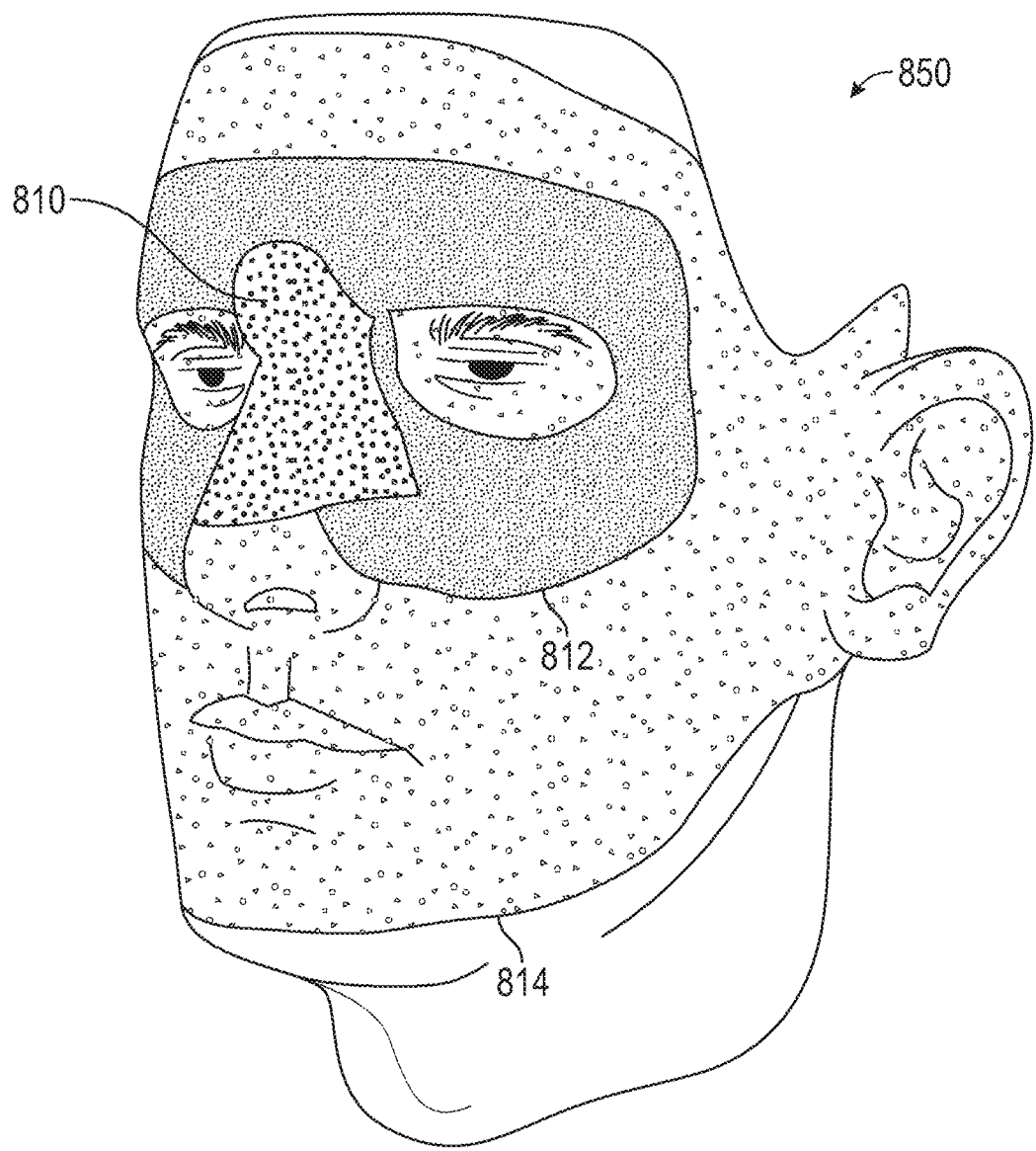

Returning to FIG. 6, at block 606 the wearer modeling component 214 (or some other component of the wearer model generation system 210 or some other system) can obtain scan data regarding the head of an individual wearer without wearing reference eyewear. FIG. 8B shows an example 3D model 850 of a particular wearer, generated from one or more scans of the wearer without reference eyewear 802. As shown, different portions of the wearer's face may be scanned to different degrees of accuracy, as described above.

Figure 9A:
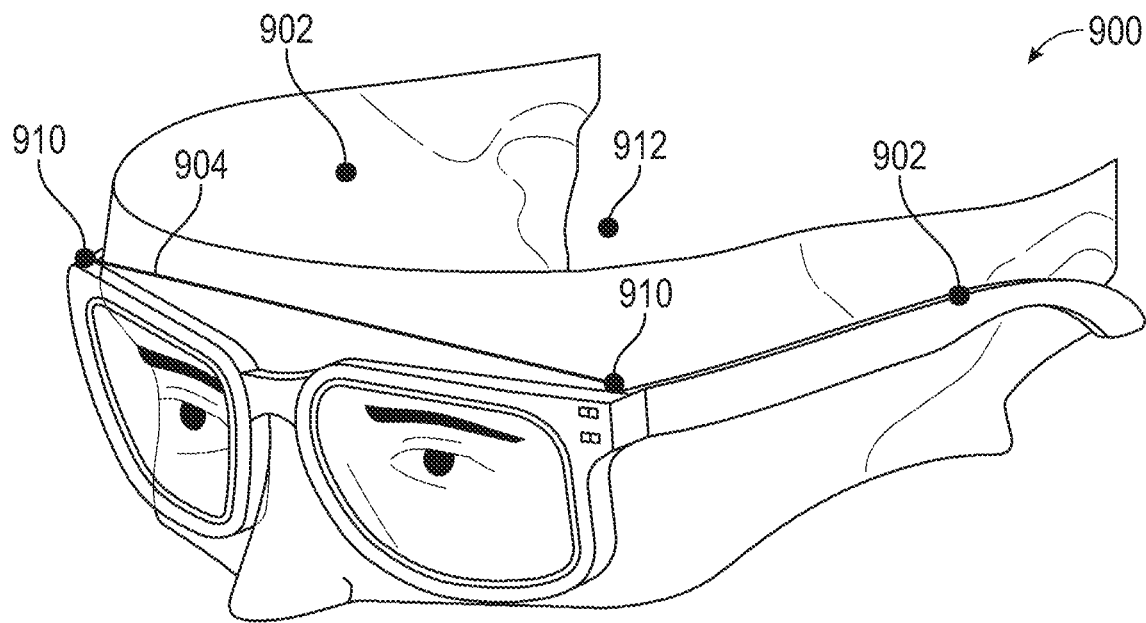
FIGS. 9A and 9B show illustrative three-dimensional scans of a wearer's head according to some embodiments.

At block 608, the wearer modeling component 214 (or some other component of the wearer model generation system 210 or some other system) can determine features of reference eyewear positioning using the scan data of the wearer's head with the reference eyewear. For example, the wearer modeling component 214 can determine the points at which the reference eyewear contacts the left and right ears of the wearer. The wearer modeling component 214 can also determine the horizontal reference line or plane that defines the upper location of the eyewear with respect to the wearer's head. FIG. 9A shows an example 3D model 900 of a particular wearer wearing reference eyewear. As shown, an ear contact point 902 can be determined for each ear, and horizontal reference line 904 can be determined for the reference eyewear.

In some embodiments, the wearer modeling component can determine points at the outer corners of the eyewear frame (e.g., the upper outer corner of the front of the eyewear frame, often near the hinges between the orbitals and the earstems). These locations, which may be referred to as eyewear fiducial points 910, can be used to define a horizontal reference line or plane for the eyewear. It may be desirable to use the eyewear itself to define the horizontal reference line instead of using features of the wearer's face, because the wearer's facial features (e.g., eyes, nose, ears, brows, etc.) are often asymmetrical or otherwise non-horizontal. Thus, by scanning a wearer with reference eyewear placed at a desired horizontal orientation, the eyewear fiducial points 910 can be determined and used to orient the 3D eyewear model at the desired horizontal orientation during the process of determining eyewear customizations.

In some embodiments, the wearer modeling component 214 can determine a point midway between the ear contact points 902. This location, which may be referred to as the head origin point 912, can serve as a reference point when aligning 3D eyewear models with the 3D model of the wearer's head. For example, a corresponding point may be determined midway between the points on eyewear earstems that are to contact the user's ears at ear contact points 902. Then the eyewear model may be aligned with the wearer model by aligning the head origin point 912 with the corresponding point on the eyewear model.

Figure 9B:
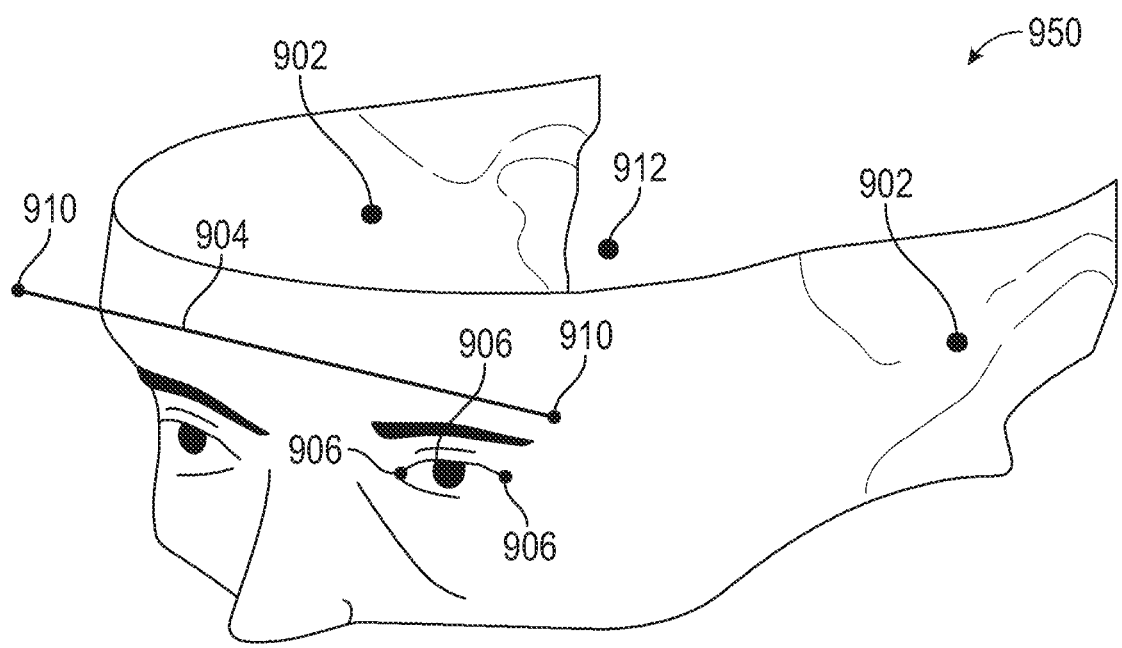

At block 610, the wearer modeling component 214 (or some other component of the wearer model generation system 210 or some other system) can determine features of the wearer's head using the scan data of the wearer's head without the reference eyewear. For example, the wearer modeling component 214 can determine the location of the pupils and corners of the wearer's eyes, including the location of the outer corners of the wearer's eyes (the lateral corners with respect to the wearer's nose) and the wearer's tear ducts on the inner corners of the wearer's eyes (the medial corners with respect to the wearer's nose). FIG. 9B shows an example 3D model 950 of a particular wearer without reference eyewear. As shown, eye features 906 can be determined for the locations of the pupils, tear ducts, and outer corners of the wearer's eyes.

At block 612, the wearer modeling component 214 (or some other component of the wearer model generation system 210 or some other system) can correlate data from the scan of the wearer with reference eyewear to scan data from the scan of the wearer without reference eyewear. The reference device may be painted or otherwise colored to facilitate digital removal of the reference device from scan data, similar to a "green screen" method as used in cinema and television. Temporary removal of the reference eyewear device from the scan may facilitate easier and/or more accurate alignment/overlay of the wearer scans capture with and without the reference device. In some embodiments, the wearer scan data from the different scans may be correlated using an iterative closest point (ICP) algorithm in which the various points of a first scan (e.g., the scan of the wearer with reference eyewear) are iteratively correlated with the various points of a second scan (e.g., the scan of the wearer without reference eyewear) until a closest corresponding point in the second scan is determined for each of the points in the first scan (or for some subset thereof). By correlating data from the different scans, the wearer modeling component 214 can identify, on the 3D model of the wearer's head without reference eyewear, the points at which the reference eyewear contacts the left and right ears of the wearer. The wearer modeling component 214 can also identify, on the 3D model of the wearer's head without reference eyewear, the horizontal reference line or plane that defines the upper location of the eyewear with respect to the wearer's head. FIG. 9B shows the addition of these features (ear contact point 902 and horizontal reference line 904) to 3D model 950 of the wearer's head.

In some embodiments, the wearer modeling component 214 does not use or obtain a scan of a wearer wearing a reference device. Instead, the process of determining reference points on the wearer's head, such as eyewear contact points, may be performed using scan data of the wearer's head alone without any reference device. For example, feature recognition software may be used to automatically determine or suggest particular reference points (e.g., brow locations, locations on the ear at which earstems are to contact the wearer, etc.). As another example, an eyewear model may be fitted to a 3D scan of a wearer's head using a virtual try-on ("VTO") process, and reference points can be determined based on how the eyewear model and wearer model interact. Preference data regarding the wearer's preferences may be obtained using a questionnaire, VTO processes, and the like. For example, an eyewear model may be customized or moved with respect to a wearer model until the wearer, viewing the interactions of the models in a VTO process, indicates a preference for a particular customization or orientation. As another example, the reference points may be determined through manual feature recognition and tagging by a technician.

In some embodiments, the wearer modeling component 214 does not use or obtain a scan of a wearer without a reference device. Rather, the wearer modeling component 214 (or some other component of the wearer model generation system 210 or some other system) uses only a scan of the wearer wearing a reference device. The wearer modeling component uses the scan to identify the points at which the reference device contacts the left and right ears of the wearer, the horizontal reference line or plane that defines the upper location of eyewear with respect to the wearer's head, etc. Illustratively, a portable device, such as a mobile phone or hand-held camera, may be used to capture one or a series of 2D images of a wearer wearing a device with known dimensions and relationships. Such images can be used to identify some or all points of contact that may be necessary or desired for customizing eyewear. By analyzing the images or other scan data of the wearer wearing a known reference device (e.g., reference eyewear for which a 3D model is available), the wearer's facial dimensions and contours can be approximated, the contact points with the reference eyewear can be approximated, etc. In this way, a wearer may obtain some or all of the benefits of customized eyewear described herein, without being required to first sit for or provide a scan of the wearer both with and without a reference device. Instead, the wearer may sit for a single scan wearing a reference device, or simply submit a photograph or series of photographs of the wearer wearing a reference device having known dimensions.

At block 614, the wearer modeling component 214 (or some other component of the wearer model generation system 210 or some other system) can determine eyewear position data with respect to the wearer's head using the correlated scan data (or scan data approximated from a single scan of the wearer without wearing a reference device). Eyewear position data may include various planes of the 3D model of the wearer's head, and those planes can be used to align 3D models of eyewear to the 3D models of the wearer's head. The planes may include (or be determined with respect to) one or more recognized anatomical reference planes, such as the sagittal plan, coronal plane, and/or transverse plane. Generally described, the sagittal plane is an anterior-posterior plane that bisects the body into equal left and right halves. The coronal plane is orthogonal to, and extends laterally in both directions from, the sagittal plane, thereby dividing the body into asymmetrical front and rear halves. The transverse plane is orthogonal to both the coronal and sagittal planes, and is generally considered to reside at the half height level, thereby dividing the body into asymmetrical upper and lower halves.

Figure 10A:
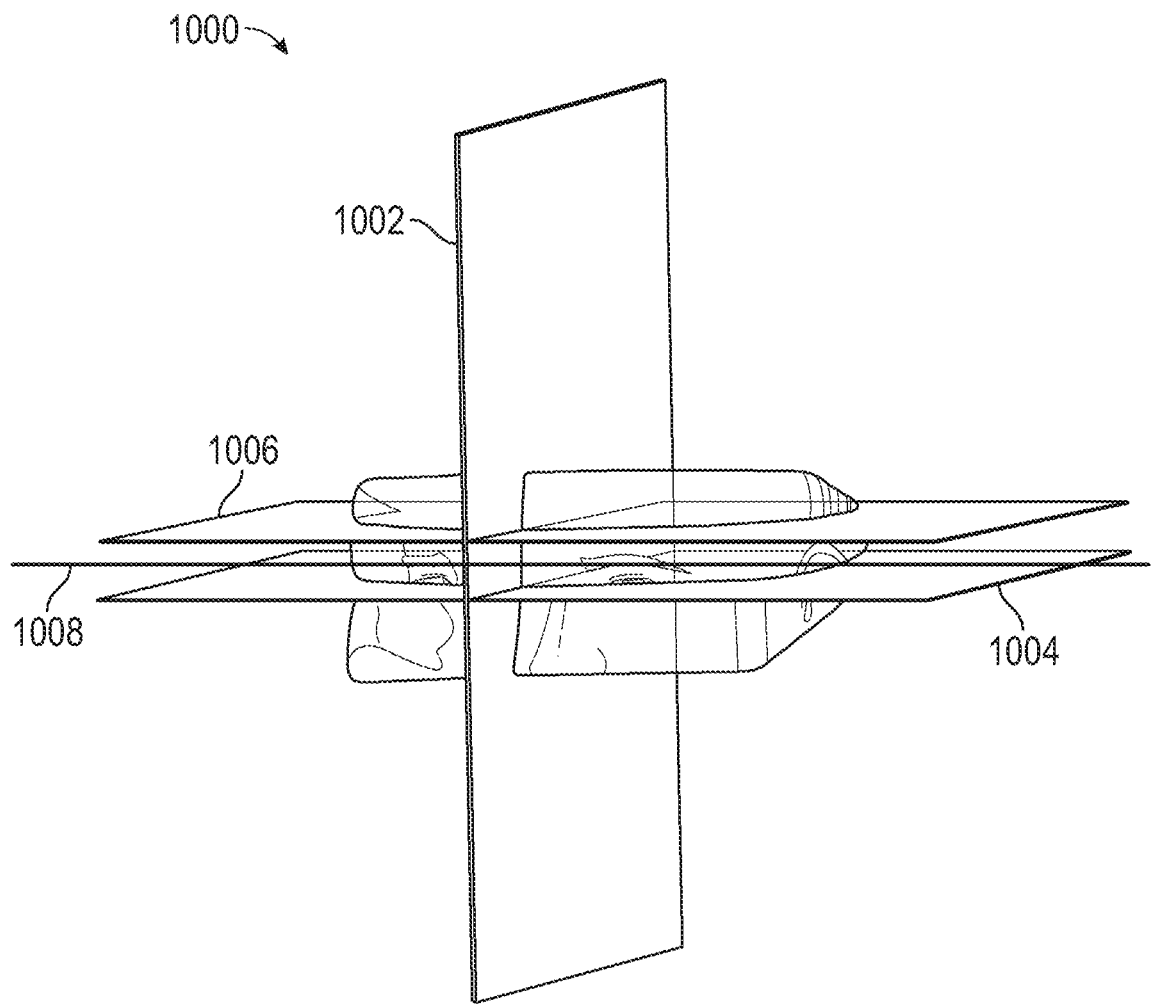
FIGS. 10A and 10B show illustrative three-dimensional scans of a wearer's head including eyewear position data according to some embodiments.

FIG. 10A shows an example 3D model 1000 with eyewear position data, including various planes described with respect to each other and various recognized anatomical planes. The model 1000 includes a scan vertical center plane 1002, an eye location plane 1004, a brow location plane 1006, and an ear pivot axis 1008. The scan vertical center plane 1002 of the wearer's head may be a plane that is orthogonal to a substantially horizontal plane through the left and right ear contact points, and parallel to the sagittal plane of the wearer. In some embodiments, the scan vertical center plane 1002 may be determined with respect to a face axis that extends from the head origin point 912, shown in FIGS. 9A and 9B, through the midpoint between the wearer's eyes (e.g., the average of the locations of the eye features 906). The scan vertical center plane 1002 may be determined as the substantially vertical plane through the face axis. The eye location plane 1004 may be a plane that is orthogonal to the scan vertical center plane 1002, parallel to the transverse plane of the wearer, and/or parallel to the horizontal reference line or plane that extends between the eyewear fiducial points 912 shown in FIGS. 9A and 9B. The eye location plane 1004 also passes through the wearer's pupils, the centers of the wearer's eyes, or the average vertical location of the centers of the wearer's eyes. The brow location plane 1006 may be a plane that is parallel to the eye location plane 1004. The brow location plane 1006 also passes through the wearer's brows (e.g., the plane 1006 passes through the point or points of the wearer's brows, above the wearer's nose, that extend the farthest in an anterior direction from the wearer's head along a plane that is parallel to the eye location plane 1004 or the transverse plane of the wearer). The ear pivot axis 1008 may be an axis through the left and right ear contact points and orthogonal to the scan vertical center plane 1002.

Figure 10B:
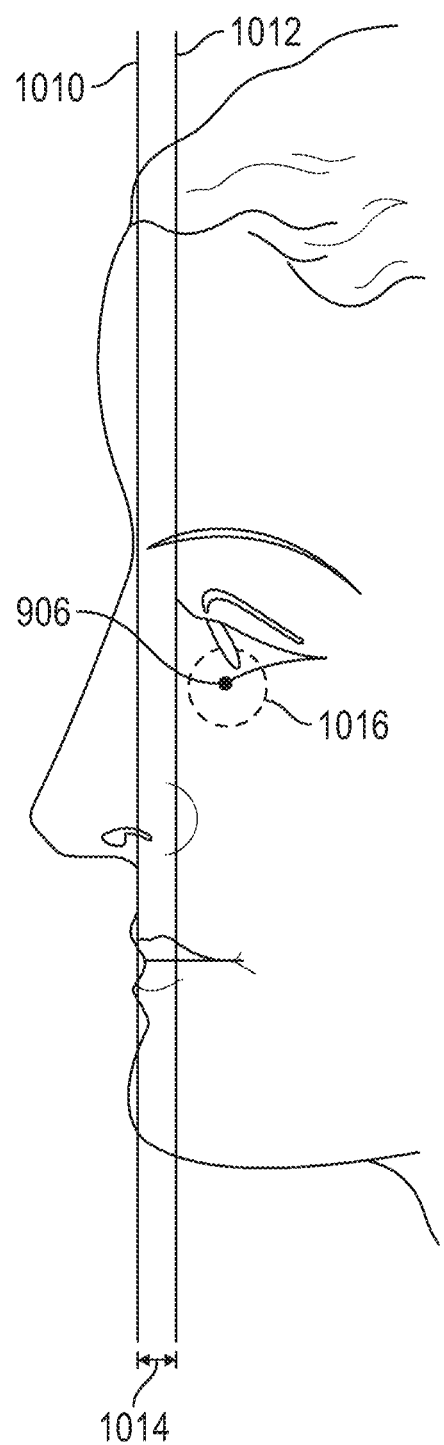

FIG. 10B is an elevational view of the 3D wearer model 1000, showing the left side of the wearer's face. FIG. 10B includes eyewear position data, including various planes and reference points described with respect to each other and various recognized anatomical planes. The model 1000 includes a nasion plane 1010, a rearward nasion plane 1012, and a tear duct sphere 1016. The nasion is the intersection of the frontal bone and two nasal bones of the human skull. As used herein, the term nasion generally refers to the visible manifestation of the nasion on the surface of a wearer's face in a depressed area directly between the wearer's eyes, just superior to the bridge of the wearer's nose. The nasion plane 1010 may be a plane that passes through or substantially near the nasion, and is orthogonal to the eye location plane 1004 and/or parallel to the coronal plane of the wearer. The rearward nasion plane 1012 may be a plane that is parallel to the nasion plane 1010, and is offset from the nasion plane 1010 in the posterior direction by an offset distance 1014 (e.g., the rearward nasion plane 1012 is located at a particular position between about 4 mm and about 10 mm posterior of the nasion plane 1010; in some embodiments the rearward nasion plane 1012 is about 7 mm posterior of the nasion plane 1010). In some embodiments, a target area on the surface of the wearer's nose may be identified between the nasion plane 1010 and rearward nasion plane 1012. The target area may be the area where the nosepiece of the eyewear is to contact the wearer's face. For example, the nosepiece may not be permitted to contact the wearer's nose on any surface anterior of the nasion plane 1010 or posterior of the rearward nasion plane 1012.

The tear duct sphere 1016 may be a sphere having a particular radius and the tear duct 906 of the wearer as the origin of the sphere (e.g., the radius of the sphere may be a particular measurement between about 7.2 mm and about 9.2 mm, or between about 8 mm and about 8.4 mm; in some embodiments, the sphere may have a radius of about 8.2 mm) A separate tear duct sphere 1016 may be determined for each eye of the wearer. In some embodiments, no portion of the eyewear may be permitted to be within the tear duct spheres 1016 of the wearer. For example, the nosepiece may not be permitted to come within a distance of the tear duct 906 that is less than or equal to the radius of the tear duct sphere 1016.

Returning to FIG. 6, at block 616 data regarding the preferences of the wearer can be obtained, as described in greater detail above with respect to FIG. 1. For example, the wearer may prefer sunglasses to sit at a particular location on the wearer's nose. As another example, the wearer may prefer sunglasses to be positioned at a particular location and/or orientation with respect to the wearer's eyes. As a further example, the wearer may prefer that the earstems of the sunglasses exert a particular pressure or range of pressures on the wearer's head. As another example, eyewear orbitals may be sized and/or shaped to achieve a predefined or desired orientation with respect to surfaces and/or structures of a wears face, such as eyebrows, cheeks, etc. As a further example, the distance between the lenses can be selected based on a wearer's nose size or head width. Information indicative of these and other wearer preferences may be input as describe d in greater detail above, such as via entry of particular values, scans of the wearer with reference eyewear in a preferred location, virtual placement of an eyewear model on a wearer model, etc. As a still further example, the orientation of the orbitals or lenses can be adjusted according to wearer preferences or to compliment the wear's face, such as by rotating the orbitals to a certain clockwise or counter-clockwise angle (e.g., for a "droop" or "cat eye" look). Illustratively, an orbital may have a major axis that is substantially horizontal and a minor axis that is orthogonal to the major axis and is substantially vertical when the orbital is in a default configuration. To achieve a "droop" look, the orbital may be rotated such that the major axis is inclined medially with respect to the nosepiece. To achieve a "cat eye" look, the orbital may be rotated such that the major axis is inclined laterally from the nosepiece. The particular degree to which orbitals are rotated may be specified by a wearer. In some cases, the degree to which orbitals are rotated may be limited to a maximum degree of rotation generally or for particular eyewear styles. The example wearer preferences and desired customizations described herein are illustrative only, and are not intended to be limiting. In some embodiments, additional and/or alternative wearer preferences and customizations may be used. For example, wearers may select or provide information for customizations regarding rake, wrap, vertex distance, bi-focal or progressive transition, eyewear weight, eyewear material, eyewear color or finish, etc.

At block 618, the wearer modeling component 214 (or some other component of the wearer model generation system 210 or some other system) can store the 3D model and preference data as a wearer model for the specific wearer. Illustratively, the wearer model may be stored in the wearer model data store 232.

In some embodiments, additional scans and/or data may be obtained for a given wearer. For example, a pressure map of the wearer's face may be generated by correlating a scan of a wearer with reference goggles to a scan of the wearer without reference goggles to determine the pressure exerted by a goggle faceplate against various points and/or regions of the wearer's face. The pressure map may identify soft and firm areas of the wearer's face to allow targeted customization of faceplate pressure to the most comfortable or otherwise desirable areas of the wearer's face. As another example, head diameter and/or shape of the posterior portion of the wearer's head may be determined for use in generating customized helmets, head bands, wrap-around earstems, or other headgear. As a further example, the wearer's range of eye motion and/or relationship between eye motion and head motion may be determined. Such data may be useful in generating customized lenses.

Illustrative Process for Producing Customized Eyewear

FIG. 11 is a flow diagram of an illustrative process 1100 for producing customized eyewear for individual wearers. Advantageously, the process 1100 may use an eyewear model of an individual eyewear style and a wearer model of an individual wearer to determine how the eyewear is to be customized for the wearer, without requiring manual adjustments, trial-and-error, etc.

The process 1100 may be embodied in a set of executable program instructions stored on one or more non-transitory computer-readable media, such as one or more disk drives or solid-state memory devices of the eyewear customization system 220 shown in FIG. 2. When the process 1100 or some portion thereof is initiated at block 1102, the executable program instructions can be loaded into memory, such as RAM, and executed by one or more processors of a computing system. In some embodiments, a computing system may include multiple computing devices, such as servers, and the process 1100 or portions thereof may be executed by multiple servers serially or in parallel. In some embodiments, the process 1100 or portions thereof may be performed by, or using input from, technicians using software executing on one or more computing devices.

At block 1104, the customization modeling component 224 (or some other component of the eyewear customization system 220 or some other system) can apply deflection to components of the eyewear model to achieve the desired head force with respect to the individual wearer's head. The deflection may include deflection of the earstems, frame, and/or other components of the eyewear such that the eyewear model will accurately reflect the state of the eyewear during normal use by the wearer.

At block 1106, the customization modeling component 224 (or some other component of the eyewear customization system 220 or some other system) can combine eyewear baseline weighting and wearer preference weighting to determine the final weights to be used when applying customizations to the current eyewear. In some embodiments, combining the baseline and wearer preference weighting may include averaging the baseline and wearer preference weighting for each weight (e.g., eye location, brow location, brow offset, cheek offset, etc.). For example, the baseline weighting may tend to bias any customizations toward the baseline values for various parameters, rather than permitting application of wearer-preferred customizations in full. In some embodiments, rather than combining the weighting or otherwise biasing the customizations toward the baseline values, a limit to wearer preferences may be applied. For example, a wearer preference regarding a particular offset of an eyewear component with respect to a particular facial feature may be applied, up to a limit, without any baseline weighting and without any bias toward baseline values for the offset.

At block 1108, the customization modeling component 224 (or some other component of the eyewear customization system 220 or some other system) can determine the positioning of the eyewear model on the wearer model. The customization modeling component 224 can use the planes, references points, and other position data described above to align the eyewear model properly with the wearer model.

Figure 12A:
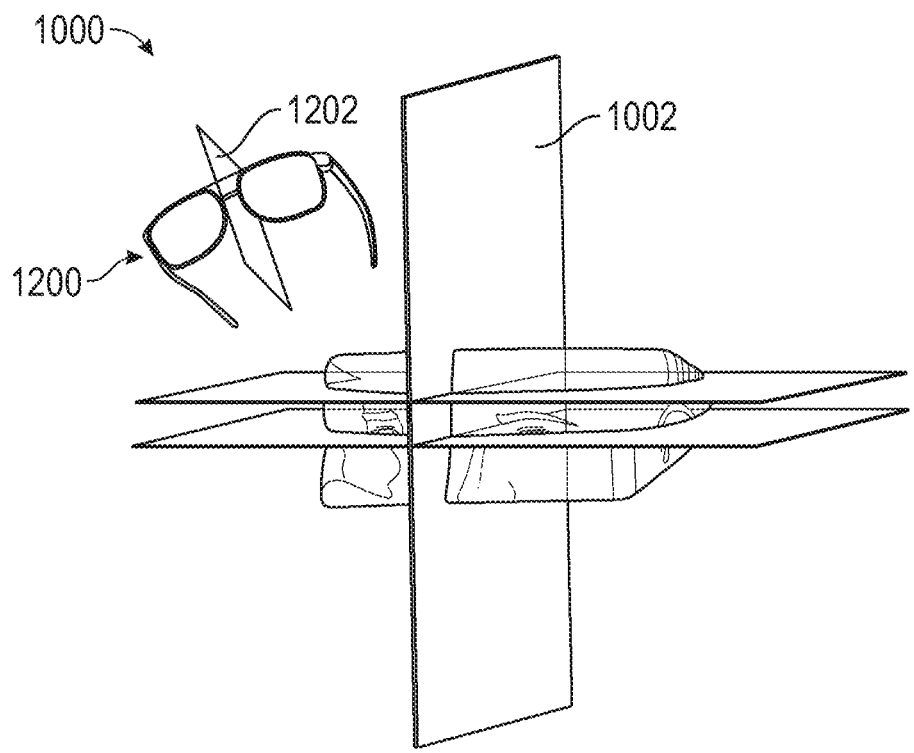
FIGS. 12A and 12B show alignment of a three-dimensional model of customizable eyewear to a three-dimensional model of a wearer's head according to some embodiments.
Figure 12B:
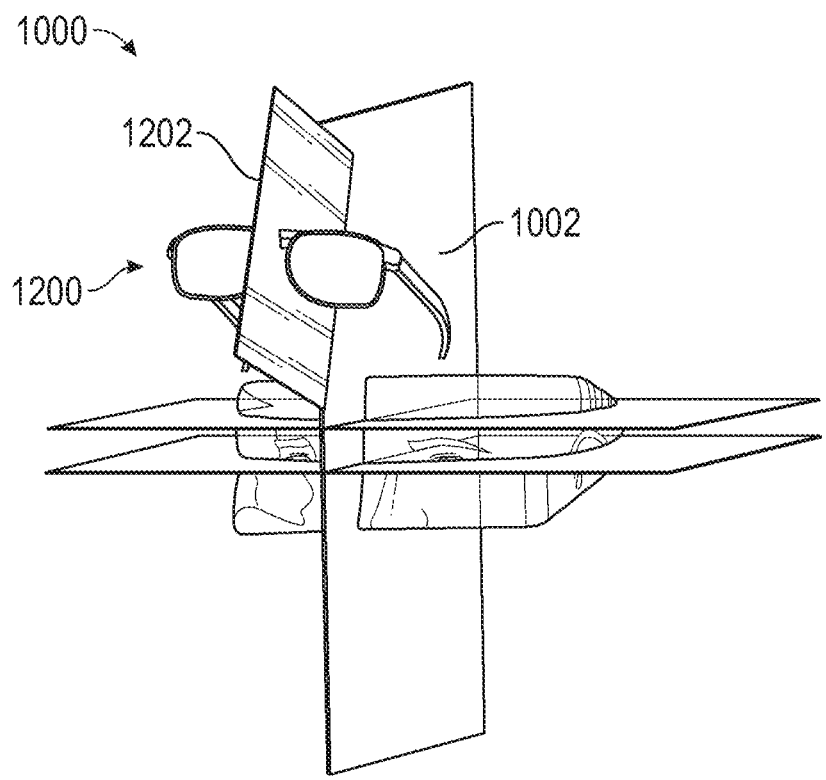

FIGS. 12A and 12B illustrate an example of aligning an eyewear model 1200 to a wearer model 1000. The customization modeling component 224 may identify the eyewear center plane 1202 of the eyewear model 1200, and align it to the scan vertical center plane 1002 of the wearer model 1000. As shown in FIG. 12B, the eyewear model 1200 may then be aligned with the wearer model 1000 via alignment of the eyewear center plane 1202 with the scan vertical center plane 1002 (e.g., the position of the eyewear model 1200 may be adjusted such that the eyewear center plane 1202 is coplanar with the scan vertical center plane 1002). The eyewear model 1200 may then be pivoted about the ear pivot axis of the wearer model 1000 until a desired alignment is achieved between points of the eyewear model 1200 and eyewear positing planes of the wearer model, such as the eye plane and brow plane.

In some embodiments, an eyewear model 1200 may be aligned to a wearer model 1000 automatically or substantially automatically based on a common coordinate system and reference point(s). In this manner, the eyewear model 1200 may be aligned to the wearer model 1000 without performing some or all of the processes described above with respect to FIGS. 12A and 12B. For example, the origin point 912 of a wearer's head, shown in FIGS. 9A and 9B, may be determined. The eyewear model 1200 may be positioned with respect to the wearer model 1000 such that a point midway between the earstems of the eyewear model 1200 (e.g., on the eyewear center plane 1202) may be automatically aligned with the origin point 912. In addition, the eyewear model 1200 may be pivoted around an axis through the origin point 912 and orthogonal to the eyewear center plane 1202 until the eyewear model 1200 is located at a desired distance from particular points on the wearer model 1000 (e.g., eye corners, fiducials for horizontal alignment, etc.). The offsets between particular points on the wearer model 1000 and particular points on the eyewear model 1200 may be identified by metadata associated with the eyewear model 1200, and may have been determined based on trials and observations of physical eyewear samples on test wearers. In some embodiments, the offsets may be determined based on wearer-specific preferences, or on some combination of eyewear model metadata and wearer-specific preferences.

Figure 13:
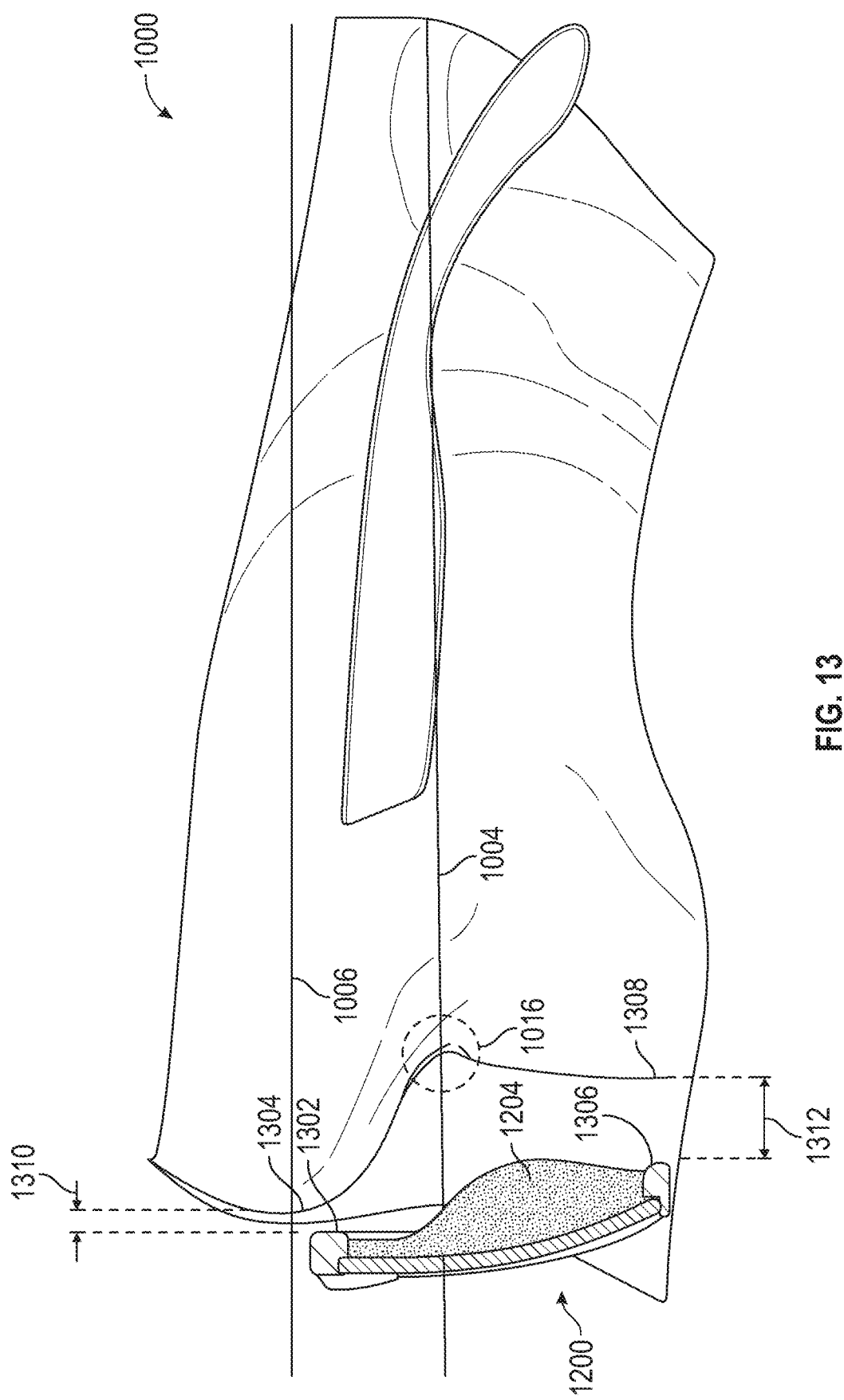
FIG. 13 shows positioning of a three-dimensional model of customizable eyewear to a three-dimensional model of a wearer's head according to some embodiments.

FIG. 13 illustrates an example of various offsets between the eyewear model 1200 and the wearer model 1000. As shown, the eyewear model 1200 has been aligned with the wearer model 1000 (e.g., using one of the methods described above). The eyewear model 1200 may then be positioned such that the brow offset 1310 (e.g., the distance between a particular reference point 1302 of the eyewear model 1200 and a reference point 1304 on the brow of the wearer model 1000) is achieved. The eyewear model 1200 may also be positioned such that the cheek offset 1312 (e.g., the distance between a particular reference point 1306 of the eyewear model 1200 and a reference point 1308 on the cheek of the wearer model 1000) is achieved. The brow offset 1310 and/or cheek offset 1312 (or any other offset) may be the baseline offsets determined for the eyewear during the eyewear modeling process. In some embodiments, the brow offset 1310 and/or cheek offset 1312 may be based on the baseline offsets and adjusted based on preferences of the specific wearer. For example, a wearer may prefer a cheek offset 1312 that is slightly larger than the baseline cheek offset. In some cases, a customization targeted at one fit parameter may interfere with another fit parameter. For example, a wearer may prefer a cheek offset 1312 that would result in a brow offset 1310 that is too small (e.g., a wearer prefers glasses to be very close to the cheeks, but for a particular eyewear style this placement would result in the glasses touching the user's brows). In such cases, weights may be applied to the conflicting parameters, as described in greater detail above with respect to FIG. 3, to determine a customization that keeps all parameters within preferred limits but still implements the wearer's preferences to some degree.

In some embodiments, a single minimum offset may be used instead of, or in addition to, the offsets described above or any other offset. For example, a minimum offset may be predetermined or dynamically determined, and no portion of the eyewear with the exception of the nosepiece (e.g., the orbitals, lenses, and earstem hinges) may come within the minimum offset distance of the wearer's eyes, nose, cheeks, brows, and/or other facial structures and surfaces. In some embodiments, the minimum offset may be between about 1 mm and about 3 mm, or between about 1.75 mm and about 2.25 mm. In some embodiments the minimum offset may be about 2.0 mm. Depending upon the facial structure of the particular wearer, the minimum offset may affect the location at which different portions of the eyewear may be positioned. For example, in wearers with prominent cheeks and/or flatter noses, the minimum offset may define the final location of the orbitals and/or lenses with respect to the wearer's cheeks, while no other portion of the eyewear encroaches within the minimum offset of any other portion of the wearer's face. As another example, in wearers with a prominent brow line, the minimum offset may define the final location of the orbitals and/or lenses with respect to the wearer's brows, while no other portion of the eyewear encroaches within the minimum offset of any other portion of the wearer's face.

After alignment and positioning of the eyewear model 1200, the nosepiece 1204 may contact or intersect the wearer's nose, or the nosepiece 1204 may be spaced from the wearer's nose. The nosepiece 1204 may then be modified, as described in greater detail below, to maintain the desired alignment and positioning. In some embodiments, rather than modifying the nosepiece, a modular nosepiece may be selected from a set of available modular nosepieces that each have different sizes and shapes (e.g., different thicknesses and/or different surface contours). For example, each modular nosepiece may be designed or otherwise associated with a different set or "bucket" of fit parameters. The modular nosepiece that provides a fit closest to the desired fit modeled above may be selected and installed onto the eyewear. In some embodiments, the modular nosepiece may be a nosepiece only, or may include some or the entire portion between the eyewear orbitals (the "bridge").

At block 1110, the customization modeling component 224 (or some other component of the eyewear customization system 220 or some other system) can determine various customizations to the eyewear in order to maintain the desired positioning, alignment, and orientation of the eyewear model with respect to the wearer model. For example, the eyewear model may intersect or cross one or more boundaries of the wearer model (e.g., the geometric space occupied by the nosepiece of the eyewear model may overlap with the geometric space occupied by the wearer's nose of the wearer model). In such cases, the overlapping or intersecting portion of the eyewear model may be altered or removed (e.g., by performing a "Boolean subtraction" in which the overlapping portion of the geometric space occupied by the nosepiece of the eyewear model and the nose of the wearer model is removed from the eyewear model). After the removal process, the remainder of the eyewear model conforms to the contours of the wearer model without intersecting the boundaries of the wearer model. As another example, there may be an undesirable offset or "gap" between a portion of the eyewear and the wearer model (e.g., the nosepiece may not touch the wearer's nose). In such cases, a portion of the eyewear model may be expanded until a threshold or desired about of surface contact is achieved with a portion of the wearer model. The expanded portion of the eyewear model may not be expanded uniformly, but may instead be expanded such that the surface contours of the expanded portion complement the surface contours of the wearer model. In some embodiments, a portion of the eyewear model may be expanded uniformly until a threshold or desired amount of surface contact can be achieved via Boolean subtraction, as described above.

Figure 14C:
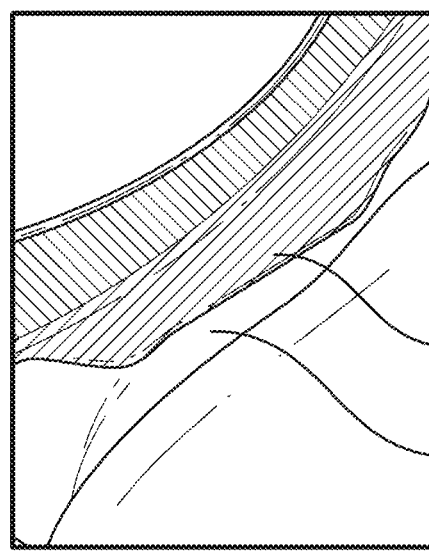
FIGS. 14A, 14B, and 14C show customization of a three-dimensional model of customizable eyeglasses according to some embodiments.
Figure 14B:
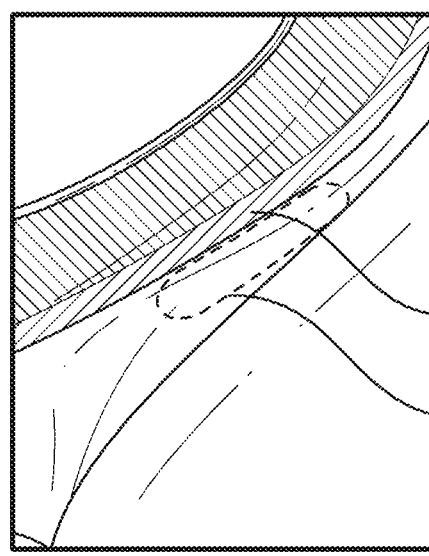
Figure 14A:
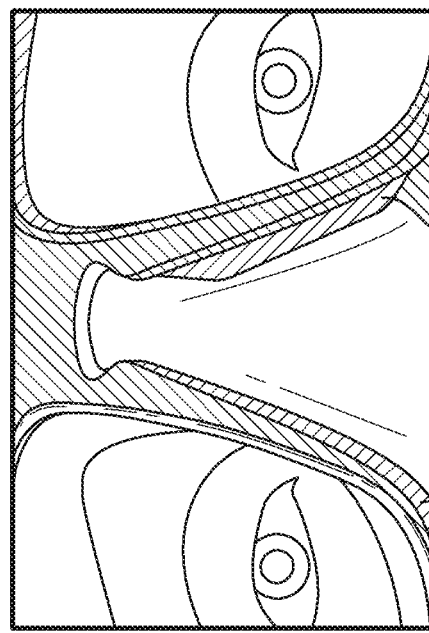

FIGS. 14A 14B, and 14C illustrate an example customization to a nosepiece 1402 of an eyewear model 1400. A target surface area 1410 may be identified on the wearer model 1000. The target surface area may correspond to an area, between the nasion plan 1010 and rearward nasion plane 1012, at which the nosepiece will be modified or selected to contact the user. The target surface area may be a predetermined or dynamically determined size. For example, the target surface area may be a particular size between about 40 mm$^2$ and about 120 mm$^2$, or between about 70 mm$^2$ and about 90 mm$^2$. In some embodiments, the target surface area may be about 80 mm$^2$. If a wearer's tear duct sphere 1016 extends in an anterior direction past the rearward nasion plane 1012 and toward the nasion plane 1010, the target area 1410 may be determined such that it excludes or otherwise does not encroach upon any portion of the tear duct sphere 1016. Thus, depending upon the facial structure of the wearer, the target area 1410 may extend from the nasion plane 1010 all the way to the rearward nasion plane 1012 alone, from the nasion plane 1010 to the tear duct sphere 1016 alone, from the nasion plane 1010 to both the rearward nasion plane 1012 and tear duct sphere 1016, or to some point anterior of both the rearward nasion plane 1012 and tear duct sphere 1016 (e.g., there may be enough area posterior of the nasion plane 1010 for a target area of maximum desirable size without extending all the way to the rearward nasion plane 1012 and tear duct sphere 1016).

As shown in FIG. 14B, there may be a gap between the target surface area 1410 of the wearer model and the nosepiece 1402. The nosepiece 1402 may therefore be expanded, as shown in FIG. 14C, such that the nosepiece 1402 contacts the target surface area 1410 and conforms to the surface contours of the target surface area 1410. In some embodiments, the customization process may begin with an eyewear model that has the minimum amount of allowable material in the nosepiece region. The model of the nosepiece may be expanded away from the eyewear frame and toward the target surface area 1410 until contact with substantially all or a threshold amount of the target surface area 1410 is achieved, as shown in FIG. 14C. In other embodiments, the customization process may begin with a default nosepiece, such as a nosepiece designed for a wearer with an average or typical facial structure. The nosepiece model may then be morphed from its default state until contact with substantially all or a threshold amount of the target surface area 1410 is achieved. For example, the nosepiece or portions thereof may be stretched, splayed, tilted, rotated, expanded, contracted, or otherwise morphed to achieve the desired contact with the target surface area 1410. Each of the morphing operations, or some subset thereof, may be associated with minimum and/or maximum deviations from the default nosepiece geometry. A single nosepiece may be customized using a single morphing operation or a combination of multiple morphing operations to achieve the desired contact with the target surface area 1410. In some embodiments, an automated rule-based process may be performed in which individual morphing operations are performed to various degrees before applying other morphing operations in a predetermined or dynamically determined order until the desired contact with the target surface area is achieved.

Figure 15A:
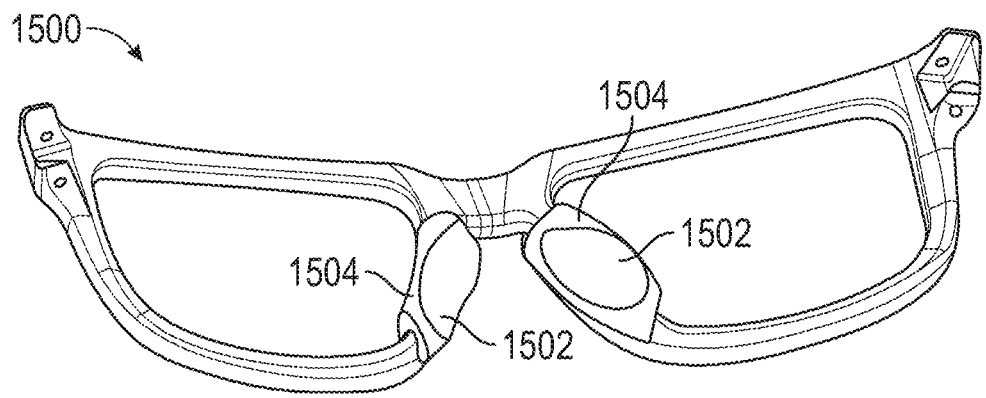
FIGS. 15A, 15B, 15C, and 15D show customization of a three-dimensional model of customizable eyeglasses according to some embodiments.
Figure 15B:
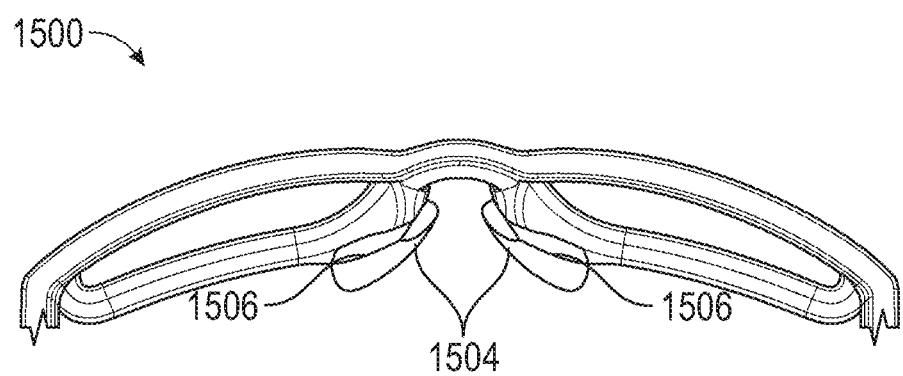

FIGS. 15A and 15B illustrate another example customization to a nosepiece of an eyewear model 1500. The customization is the result of a Boolean subtraction to the nosepiece of eyewear model. Regions 1502 have been reduced in size to conform to the surface contours of a wearer. As shown in FIG. 15A, regions 1504 remain unmodified by the Boolean subtraction. FIG. 15B illustrates an additional modification to the nosepieces of the eyewear model 1500, but in this case the modification may be stylistic rather than functional. As shown, regions 1506 may be removed from the sides of the nosepieces that do not touch the wearer's nose. This modification may be done for aesthetic reasons, to reduce the amount of material that was originally available for customization (e.g., the nosepieces may have been originally defined to be large enough to accommodate wearers with wider noses, and the extra material is no longer needed after a customization is made for a wearer with a nose that is less than the maximum width accommodated by the nosepieces).

In some embodiments, a nosepiece may not be designed to contact wearers' noses at multiple places spaced from each other (e.g., on the left and right side of the nose), but may instead be designed to contact wearers' noses at only one place (e.g., the nasion), or on both sides of the wearer's nose and across the wearer's nasion. In such cases, a dermal contact area of the nosepiece or some portion thereof (e.g., a support device such as a ligature) may be customized to complement the contours of a particular wearer's nasion.

Figure 15C:
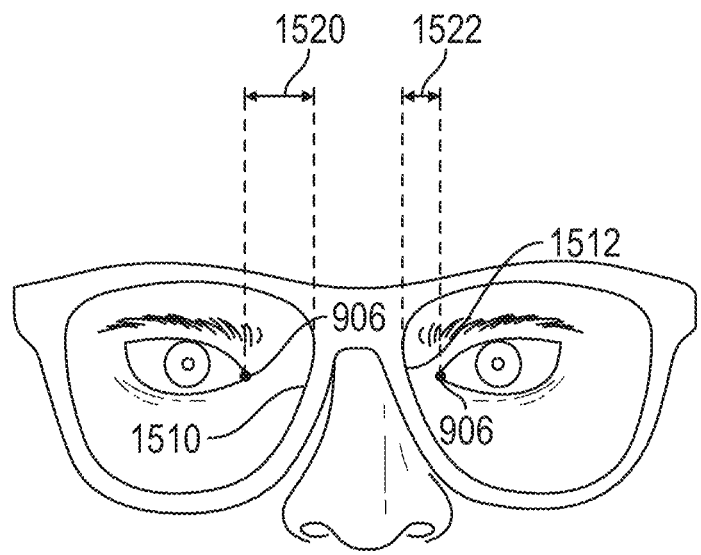
Figure 15D:
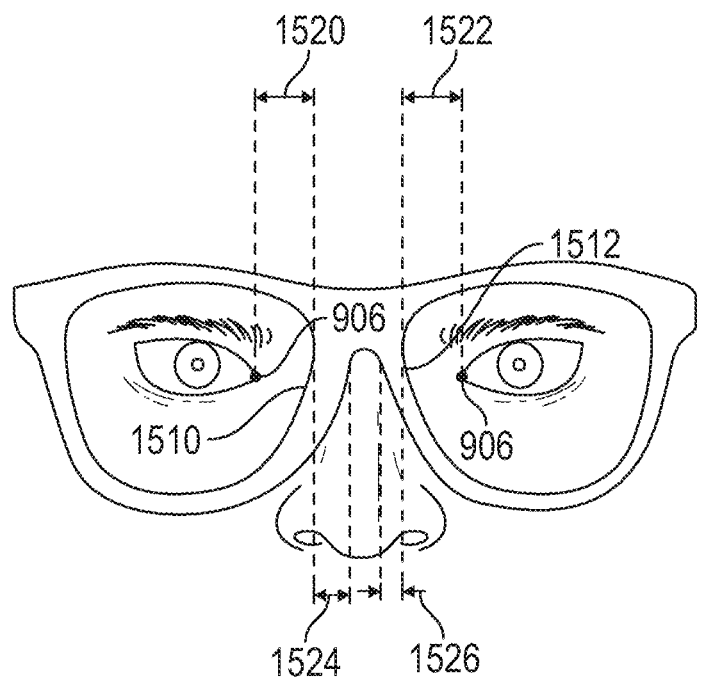

FIGS. 15C and 15D illustrate another example customization to a nosepiece of an eyewear model 1500. The customization may be applied when, e.g., a wearer's nose and/or eyes are not symmetrical with respect to the wearer's sagittal plane or the scan vertical center plane 1002. As shown in FIG. 15C, the wearer's nose is not centered between the wearer's eyes. Thus, when the eyewear model 1500 is aligned with the wearer model such that the nosepiece of the eyewear model is contacting the target surface area of the wearer's nose, a distance 1520 between a first tear duct 906 and a first nosepiece side 1510 is greater than a distance 1522 between the wearer's other tear duct 906 and a second nosepiece side 1512. When a wearer's face has this type of asymmetrical structure, the nosepiece may be customized to accommodate the asymmetry and ensure that the wearer's straight ahead line of sight from each eye intersects each respective lens at a desired location, or within a threshold distance of the desired location. As shown in FIG. 15D, the size 1524 of the first nosepiece side 1514 has been enlarged with respect to the size 1526 of the second nosepiece side 1516. This enlargement of the size of one nosepiece side with respect to the other reduces the difference between distance 1520 and distance 1522, and brings the eyes closer to a desired location with respect to the lenses of the eyewear. In some embodiments, in order to prevent undesirable extreme asymmetries in the eyeglass, the size of one nosepiece side may only be enlarged up to a maximum size. The maximum may be a particular size between about 1 mm and about 2 mm; in some cases, the maximum size may be about 1.5 mm.

At decision block 1112, the customization modeling component 224 (or some other component of the eyewear customization system 220 or some other system) can determine whether the eyewear parameters are within the eyewear customization envelope. If not, then process 1100 proceeds to block 1114, and the particular style of eyewear is not available to be customized for the wearer. In some embodiments, the determination at decision block 1112 may be overridden. For example, the customizations may be modified to bring them within the customization envelope, even though the customizations may not be entirely optimal or desirable for the wearer. If the customizations are within the envelope of eyewear customization, then the process 1100 may proceed to block 1116, and the particular style of eyewear is available for the current wearer and customization preferences.

At block 1118, the customization modeling component 224 (or some other component of the eyewear customization system 220 or some other system) can model the undeflected state of the eyewear. The undeflected state generally corresponds to the state of the eyewear when not worn by a wearer, and therefore there is little or no pressure or deflection of the earstems, frame, and/or other eyewear components. As described above, the stiffness matrix or some other data set can be used to apply the expected headforce in reverse to the customized eyewear model. The forces can applied in reverse to predict or simulate an undeflected state that will result in a desired degree of deflection in the as-worn state when worn by a particular wearer (e.g., a wearer with a particular head size that spreads the earstems apart by a particular amount).

At block 1120, the eyewear production component 226 (or some other component of the eyewear customization system 220 or some other system) can generate the customized eyewear (or specific components of the customized eyewear). Eyewear or a component thereof may be generated (e.g., manufactured) using an additive process, such as 3D printing. For example, a nosepiece may be created from scratch, or the nosepiece may be created through addition of material to a "blank" or base component, a structure that facilitates attachment with an eyewear frame, etc. In some embodiments, a component of eyewear may be manufactured using a subtractive process. For example, a blank or base component that corresponds to the maximum dimensions of a nosepiece may be used as a starting point from which material is removed to achieve the desired customizations. In other embodiments, a modular nosepiece may be selected from a set of available modular nosepieces. The modular nosepiece that provides a fit closest to the desired fit modeled above may be selected and installed onto the eyewear. The modular nosepiece may be a nosepiece only, or may include some or the entire portion between the eyewear orbitals (the "bridge"). Regardless of whether the nosepiece is selected or created using one of the aforementioned processes or using some other process, the end product nosepiece may be sized and/or contoured such that the dermal contact area of the nosepiece (e.g., the portion that comes in contact with the skin on wearer's nose during regular use) conforms closely to the surface contours and features of a portion of the wearer's nose. In some cases, the nosepiece may exhibit bilateral asymmetry to complement a bilateral asymmetry of a wearer's face and position the eyewear in an optimal or desired orientation on the wearer's face.

Additional Embodiments

In accordance with a further aspect of the present inventions, eyewear may be customized to fit the wearer's face and also optimize optics taking into account the final frame orientation on the wearer's face. The wearer can be considered to have a right and left straight ahead normal line of sight, extending outward from the wearer's left and right eyes in an anterior direction through the right and left pupillary center, respectively. The right straight ahead normal line of sight, for example, crosses the center of the right pupil and lies along the intersection of a vertical plane parallel to the wearer's central sagittal plane, and a horizontal plane which is parallel to the wearer's central transverse plane. The left and right eye lines of sight may reside on different transverse planes and/or at different distances from the central sagittal plane, as a result of wearer to wearer asymmetries as has been discussed. These asymmetries and the resulting correction of frame position may need to be compensated for through the lens geometry and/or orientation in order to reduce optical distortion as described below. Preferably the lens geometry and orientation will be selected to compensate for eyewear position in the as-worn orientation such that the optical centerline (in either Rx or plano eyewear) is maintained substantially parallel to the wearer's straight ahead normal line of sight as determined on the 3D model and described above.

In some embodiments, an eyewear frame may be configured such that when the eyewear frame is in a default non-stressed configuration (e.g., not on a wearer's head), the optical centerlines of the lenses may not be able to be aligned with or substantially parallel to the wearer's respective straight ahead normal lines of sight if the wearer were able to look through the lenses without changing the default non-stressed configuration of the eyewear frame. However, when the eyewear frame is placed in an as-worn stressed configuration (e.g., on a wearer's head), the eyewear frames or portions thereof may become deflected from their positions in the default non-stressed configuration. This deflection can cause the optical centerlines of the lenses to become aligned with or substantially parallel to the wearer's straight ahead normal line of sight. Due to wearer-to-wearer differences in face and head geometry, the as-worn stressed configuration for one wearer may be different than that of another wearer. Therefore, differences in the default non-stressed configurations of eyewear frames may be required in order to produce the proper as-worn stressed configurations for different wearers. In some embodiments, lens geometry and orientation may be selected to configure a lens with different portions corresponding to different powers (e.g., bifocal lenses, trifocal lenses, progressive multifocal lenses, etc.) such that different lines of sight are aligned with portions corresponding to different powers. For example, a progressive lens may have a first portion corresponding to a distance-vision power, a second portion corresponding to a near-vision power, and a progressive lens power transition corridor extending between the first and second portions. The progressive lens may be configured or oriented within an eyewear frame (or the eyewear frame may be configured) such that individual progressive lens powers are aligned with the corresponding individual lines of sight of a wearer in the as-worn configuration.

Figure 16A:
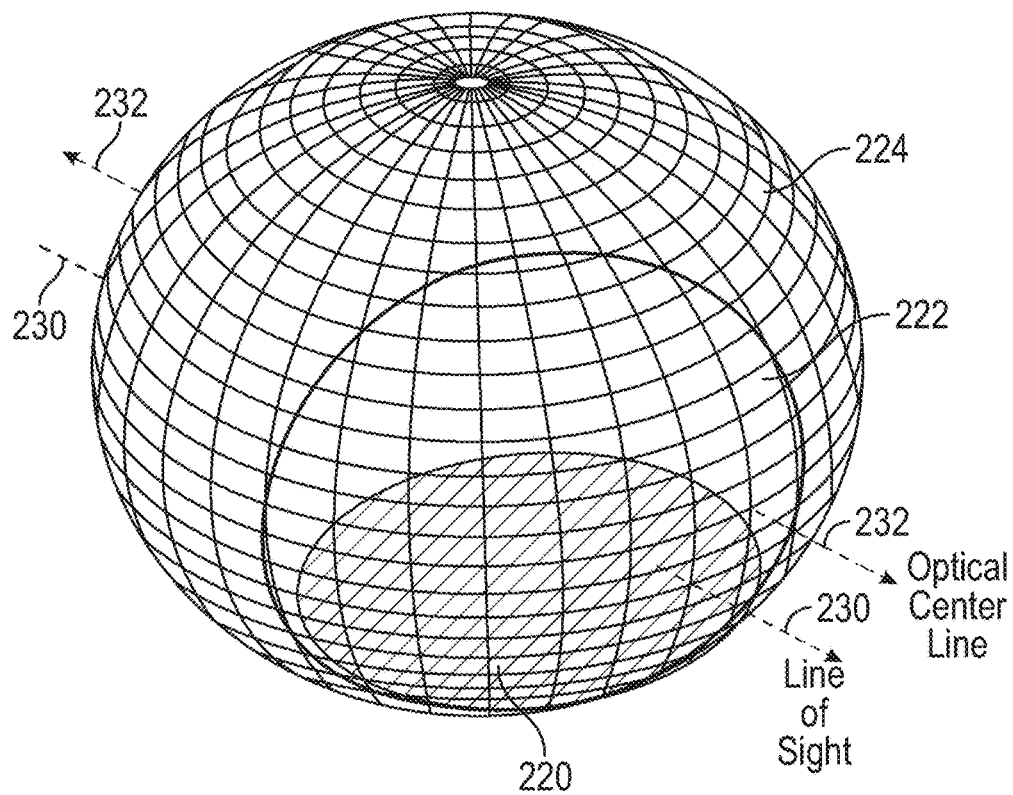
FIG. 16A is a perspective view of a lens blank conforming to a portion of the surface of a sphere, showing a lens profile to be cut from the blank in accordance with some embodiments.

FIG. 16A is a perspective view of a lens blank 222, a convex outside surface 236 of which generally conforms to a portion of the surface of a three-dimensional geometric shape 224. It will be understood by those of skill in this art that lenses in accordance with the present inventions may conform to any of a variety of geometric shapes.

Preferably, the outside surface of the lens will conform to a shape having a smooth, continuous surface having a constant horizontal radius (sphere or cylinder) or progressive curve (ellipse, toroid or ovoid) or other aspheric shape in either the horizontal or vertical planes. The geometric shape 224 of some embodiments herein described, however, generally approximates a sphere.

Figure 16B:
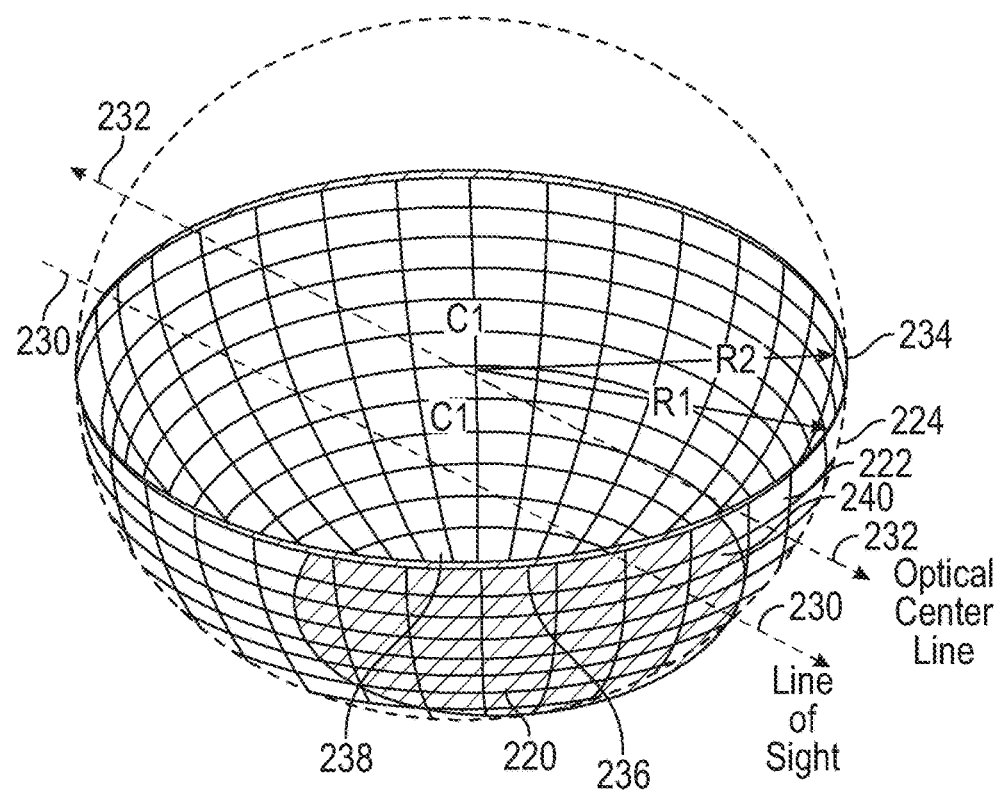
FIG. 16B is a perspective cutaway view of the hollow, tapered wall spherical shape, lens blank, and lens of FIG. 16A.

The sphere 224 illustrated in FIGS. 16A and 16B is an imaginary three-dimensional solid walled structure, a portion of the wall of which is suitable from which to cut a lens 220. As is known in the art, precision lens cutting is often accomplished by producing a lens blank 222 from which a lens 220 is ultimately cut. However, it should be clear to those of skill in the art from the illustrations of FIGS. 16A and 16B, that the use of a separate lens blank is optional, and the lens 220 may be molded directly into its final shape and configuration if desired.

It can also be seen from FIGS. 16A and 16B that the lens 220 and/or the lens blank 222 can be positioned at any of a variety of locations along the sphere 224. For the purpose of the present disclosure, the optical centerline 232 operates as a reference line for orientation of the lens 220 with respect to the sphere 224. In the illustrated embodiment, wherein both the outside surface and the inside surface conform to a portion of a sphere, the optical centerline is defined as the line 232 which joins the two centers C1 and C2. The analogous reference line for the purpose of non-spherical lens geometry may be formed in a manner different than connection of the two geometric centers of the spheres, as will be apparent to one of skill in the art.

The lens 220 is ultimately formed in such a manner that it retains the geometry of a portion of the wall of the sphere as illustrated in FIG. 16B. The location of the lens 220 on the sphere 224 is selected such that when the lens 220 is oriented in the eyeglass frame, the calculated normal line of sight 230 of the wearer through the lens as determined by the wearer model will be maintained generally in parallel to the optical centerline 232 of the geometric configuration from which the lens 220 was obtained. In the illustration of FIGS. 16A and 16B, the lens 220 is a right lens which has a significant degree of wrap, as well as some degree of downward rake (indicated by the as-worn normal line of sight crossing the sphere 224 below the optical centerline 230). A lens having a different shape, or a lesser degree of wrap may overlap the optical centerline 232 of the imaginary sphere 224 from which the lens was formed. However, whether the optical centerline of the imaginary sphere 224 crosses through the lens 220 or not is unimportant, so long as the line of sight 230 in the lens 220 is maintained generally in parallel in the as-worn orientation with the optical centerline 232.

Similarly, if the lens is to have no rake or upward rake in the as-worn orientation, the normal line of sight (and the entire lens) would cross the sphere 224 at or above the central horizontal meridian which contains the optical centerline. The spatial distance and position of the ultimate normal line of sight 230 relative to the optical centerline 232 therefore indicates the degree of wrap (by horizontal distance) and rake (by vertical distance). However, regardless of the distances involved, the lens will exhibit minimal optical distortion as long as the normal line of sight 230 is offset from but maintained substantially parallel to the optical centerline 232 preferably in both the horizontal and vertical planes.

For purposes of the present disclosure, "substantially parallel" shall mean that the calculated line of sight 230 when the lens 220 is oriented in the as-worn position generally does not deviate within the horizontal or vertical plane by more than about ±5° from parallel to the optical centerline 232. Preferably, the normal line of sight 230 should not deviate by more than about ±4° from the optical centerline 232, more preferably the normal line of sight 230 deviates by no more than about ±2° and most preferably no more than about ±1° from parallel to the optical centerline 232. Optimally, the line of sight 230 is parallel to the optical centerline in the as-worn orientation, in the theoretical mathematical model although some variation may exist in the actual physical product worn by a wearer.

Variations from parallel in the horizontal plane generally have a greater negative impact on the optics than variations from parallel in the vertical plane. Accordingly, the solid angle between the line of sight 230 and optical centerline 232 in the vertical plane may exceed the ranges set forth above, for some eyewear, as long as the horizontal component of the angle of deviation is within the above-mentioned ranges of deviation from the parallel orientation. Preferably, the line of sight 230 deviates in the vertical plane no more than about ±3° and, more preferably, no more than about ±1° from the optical centerline in the as-worn orientation.

FIG. 16B is a cutaway view of the lens 220, lens blank 222, and geometric shape 224 of FIG. 16A. This view shows that the preferred geometric shape 224 is hollow with walls of varying thickness, as revealed by a horizontal cross-section 234 at the optical centerline of the geometric shape 224.

The tapered walls of the preferred geometric shape 224 result from two horizontally offset spheres, represented by their center points C1 and C2 and radii R1 and R2. An outer surface 236 of the preferred lens blank 222 conforms to one sphere (of radius R1) while an inner surface 238 of the lens blank 222 conforms to the other sphere (of radius R2). By adjusting the parameters which describe the two spheres, the nature of the taper of the lens blank 222 may also be adjusted.

In particular, the parameters for the two spheres to which the lens blank outer surface 236 and inner surface 238 conform is preferably chosen to produce minimal or zero refractive power, or nonprescription lenses. Where CT represents a chosen center thickness (maximum thickness of the wall of the hollow geometric shape 224), n is an index of refraction of the lens blank material, R1 is set by design choice for the curvature of the outer surface 236, R2 may be determined according to the following equation:

$$R_2 = R_1 - CT + \frac{CT}{n} \qquad (1)$$

CT/n represents the separation of the spherical centers C1 and C2. For example, where a base 6 lens is desired as a matter of design choice, the center thickness is chosen to be 3 mm, and the index of refraction of the preferred material (polycarbonate) is 1.586, R2 may be determined as follows:

$$R_2 = \frac{530}{6} - 3 + \frac{3}{1.586} = 87.225 \text{ mm} \qquad (2)$$

For this example, the radius R1 of the outer surface 236 is equal to 88.333 mm, the radius R2 of the inner surface 238 is equal to 87.225 mm, and the spherical centers C1 and C2 are separated by 1.892 mm. These parameters describe the curvature of the lens blank 222 of a preferred decentered spherical embodiment.

In some embodiments, the optical centerline 232 is that line which passes through both center points C1 and C2 of the offset spheres. This happens to pass through the thickest portion of the preferred geometrical shape 224 walls at an optical center 240, though this may not be true for alternative non-spherical embodiments. The optical center line 232 happens to pass through surface 236 of the illustrated lens blank 222, although this is not necessary. The optical center 240 does not happen to lie on the lens 220, although it may for larger lenses or lenses intended to exhibit less wrap in the as-worn orientation.

Figure 17A:
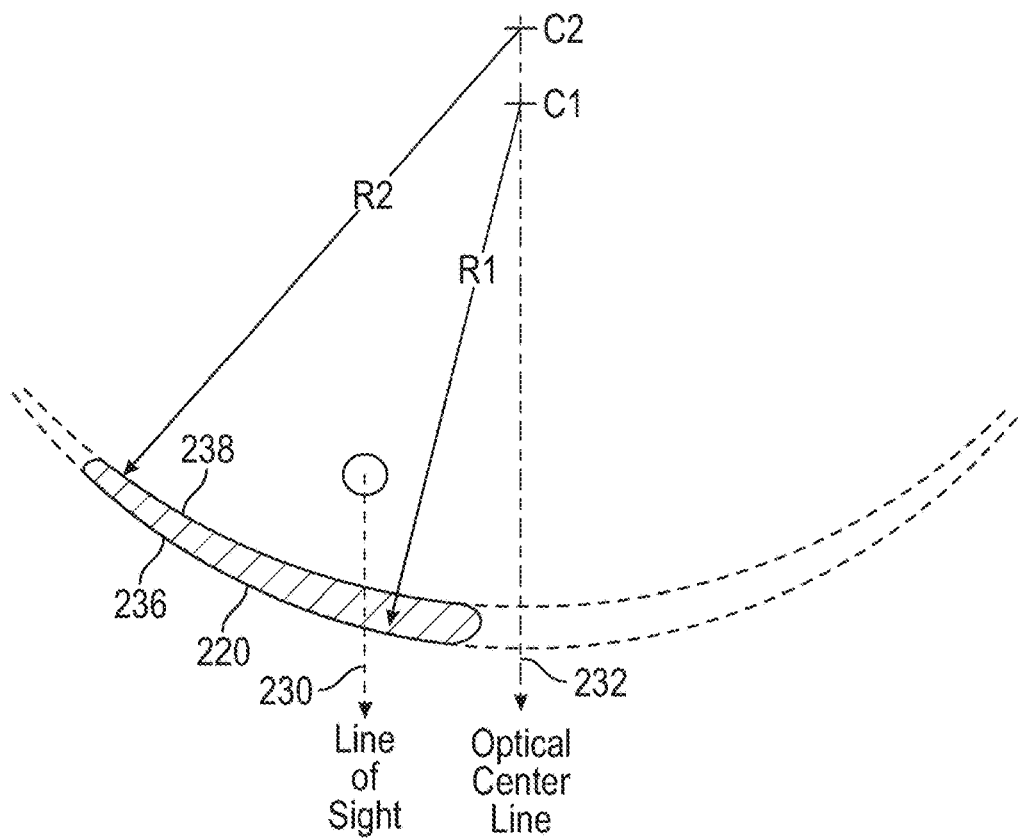
FIG. 17A is a horizontal cross-sectional view of a lens constructed in accordance with some embodiments.

FIG. 17A illustrates a horizontal cross-section of a lens 220, showing in phantom the geometric shape 224 to which the outer surface 236 and inner surface 238 conform. The lens blank 222 is omitted from this drawing. In accordance with some embodiments, the optical centerline 232 associated with the chosen orientation is aligned to be generally parallel to but offset from the straight ahead normal line of sight 230 of the wearer as the lens 220 is to be mounted in an eyeglass frame.

Figure 17B:
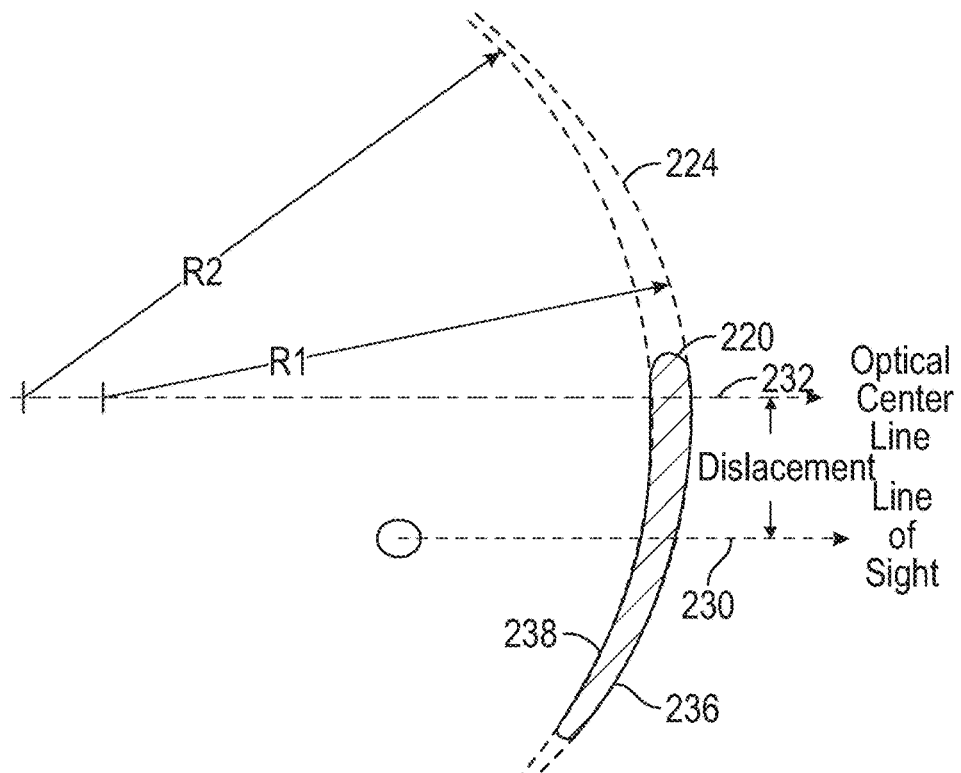
FIG. 17B is a vertical cross-sectional view of a lens constructed in accordance with some embodiments.
Figure 18:
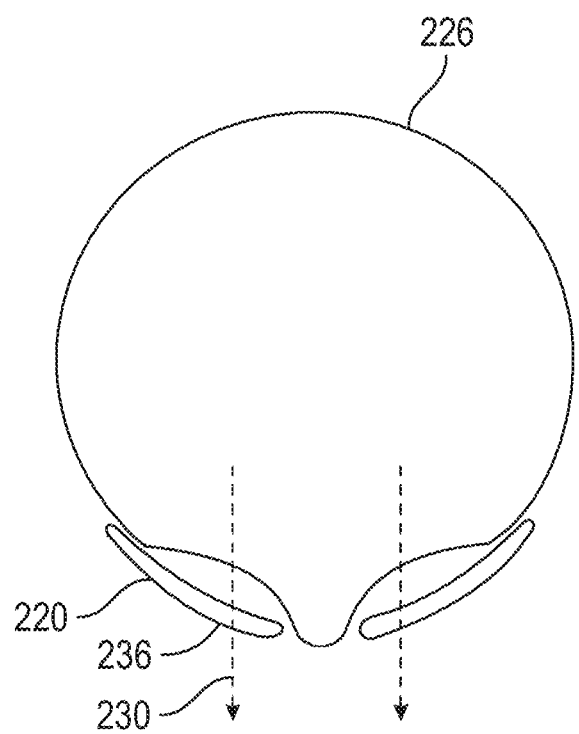
FIG. 18 is a top plan view of the lens of FIGS. 17A and 17B showing a high wrap in relation to a wearer.

FIG. 17B illustrates a vertical cross-section of the lens 220, also showing in phantom the geometric shape 224 to which the outer surface 236 and inner surface 238 conform.

Unlike the horizontal view of FIG. 17A, the projection of the optical centerline 232 onto a vertical plane (i.e., the vertical component of the optical centerline 232) appears to pass through the vertical profile of the preferred lens 220. In any case, the vertical component of the optical centerline 232 associated with the chosen taper is also aligned to be generally parallel with the normal line of sight 230 of the wearer in the as-worn orientation.

Thus, in addition to providing optically correct lenses for dual lens eyewear with a high degree of wrap, some embodiments may provide optically corrected lenses for eyewear characterized by a degree of rake. The terms "rake" and "optically correct" are further defined below.

In general, "rake" will be understood to describe the condition of a lens, in the as-worn orientation, for which the normal line of sight 230 (see FIG. 17B) strikes a vertical tangent to the lens 220 at a non-perpendicular angle. For optically corrected eyewear in accordance with some embodiments, however, the normal line of sight to a raked lens is generally parallel to and vertically offset from the optical centerline. Therefore, the degree of rake in a correctly oriented lens may be measured by the distance which the normal line of sight is vertically displaced from the optical centerline.

Figure 19C:
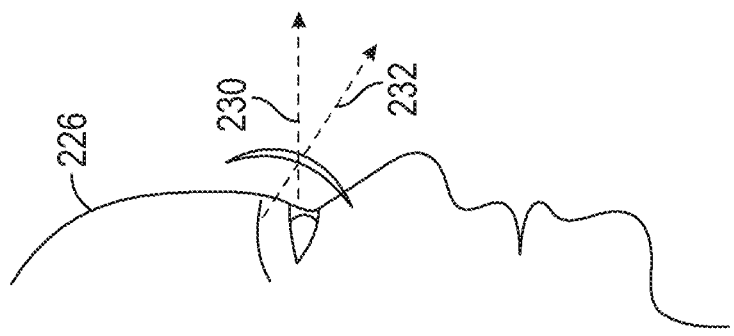
FIGS. 19A-19C are right side elevational views of lenses of various configurations and orientations relative to a wearer.
Figure 19B:
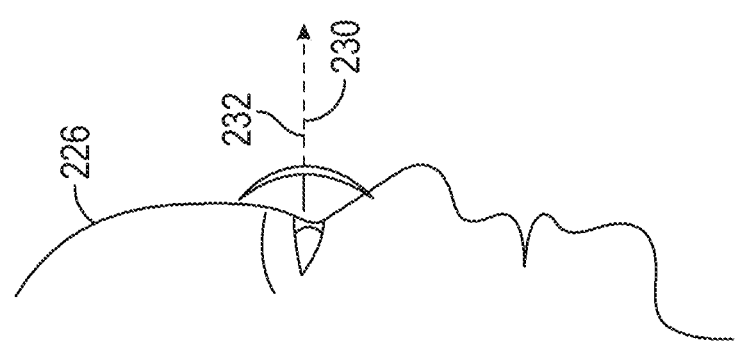

For a centrally oriented lens, as shown in FIG. 19B, the wearer's line of sight coincides with the optical centerline, thus displaying no vertical displacement. While such a lens may be optically corrected (as defined below) in the as-worn orientation, the lens does not have rake. FIG. 19C shows a lens orientation which is downwardly tilted or raked, but for which the optical centerline and the normal line of sight are highly divergent such that no "displacement" could meaningfully be measured. While such a lens may have downward rake in a conventional sense, advantageously providing downward protection for the eye and conforming to the wearer's face, it is not optically corrected.

In contrast, the normal line of sight through a raked lens, made in accordance with some embodiments, is characterized by a finite vertical displacement from the optical centerline, preferably a downward displacement for downward rake. Where the optical centerline diverges from the normal line of sight within the acceptable angular ranges set forth above, this displacement should be measured at or near the lens surface. The displacement may range from about any nonzero displacement to about 8.0 inches. Lenses of lower base curvature may require a greater displacement in order to achieve good rake. The vertical displacement for a lens of base 6 curvature, however, should be between about 0.1 inch and about 2.0 inches. More preferably, the vertical displacement is between about 0.1 inch and about 1.0 inch, particularly between about 0.25 inch and about 0.75 inch, and most preferably about 0.5 inch.

"Optically correct," as that term has been used in the present description, refers to a lens which demonstrates relatively low distortion as measured by one or more of the following values in the as-worn orientation: prismatic distortion, refractive power and astigmatism. Raked lenses in accordance with some embodiments demonstrate at least as low as ¼ diopters or 3/16 diopters and typically less than about ⅛ diopters prismatic distortion, preferably less than about 1/16 diopters, and more preferably less than about 1/32 diopters. Refractive power and astigmatism for lenses in accordance with some embodiments are also preferably low. Each of refractive power and astigmatism are also at least as low as ¼ diopters or 3/16 diopters and preferably less than about ⅛ diopters, more preferably less than about 1/16 diopters and most preferably less than about 1/32 diopters.

It will be understood by the skilled artisan that the advantages in minimizing optical distortion apply to both the horizontal and the vertical dimensions. Particular advantage is derived by applying the principles taught herein to both vertical and horizontal dimensions of the lens, enabling the combination of lateral and lower peripheral protection of the eyes (through wrap and rake) with excellent optical quality over the wearer's full angular range of vision.

Furthermore, although the principal embodiments described herein are of constant radius in both the horizontal and vertical cross-section, a variety of lens configurations in both planes are possible in conjunction with some embodiments. Thus, for example, either the outer or the inner or both surfaces of the lens of some embodiments may generally conform to a spherical shape as shown in FIGS. 16A and 16B. Alternatively either the outer or the inner or both surfaces of the lens may conform to a right circular cylinder, a frusto-conical, an elliptic cylinder, an ellipsoid, an ellipsoid of revolution, other sphere or any of a number of other three dimensional shapes. Regardless of the particular vertical or horizontal curvature of one surface, however, the other surface should be chosen such as to minimize one or more of power, prism and astigmatism of the lens in the mounted and as-worn orientation.

FIGS. 18-20B will aid in describing a method of choosing a location on the lens blank 222 from which to cut the right lens 220, in accordance with some embodiments. It will be understood that a similar method would be used to construct the left lens for the dual lens eyewear of some embodiments.

As a first step, a desired general curvature of the lens inner or outer surface 238, 236 may be chosen. For the preferred lens 220, this choice determines the base value of the lens blank 222. As noted elsewhere herein, a number of other curvatures may be utilized in conjunction with some embodiments. A choice of lens thickness may also be preselected. In particular, the minimum thickness may be selected such that the lens will withstand a preselected impact force.

A desired lens shape may also be chosen. For example, FIGS. 4A and 9A illustrate examples of front elevational shapes for the lens 220. The particular shape chosen is generally not relevant to the oriented decentered lens optics disclosed herein.

A desired as-worn orientation for the lens should also be chosen, relative to the normal line of sight 230 of the wearer 226. As mentioned above, preferred orientations may provide significant lateral wrap for lateral protection and interception of peripheral light, and for aesthetic reasons, and also some degree of downward rake. For example, the embodiment illustrated in FIGS. 15-20B uses a canted lens 220 to achieve wrap. Alternatively, wrap may be achieved through use of a higher base lens and a more conventional (noncanted) orientation. FIGS. 18 and 19A-19C illustrate more plainly how the orientations may be related to the line of sight 230 of the wearer.

Figure 19A:
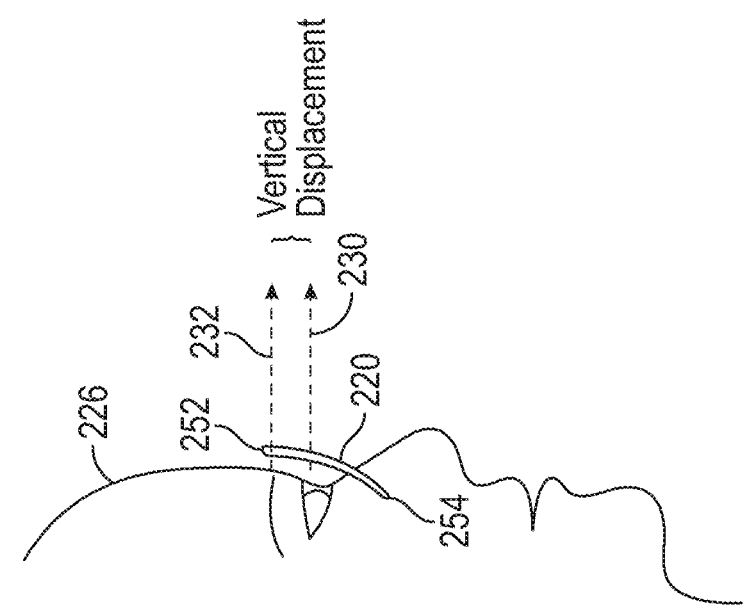

The eyewear designer may also choose a degree of rake, or vertical tilt, as will be understood from FIGS. 19A-19C, schematically illustrating various vertical as-worn orientations of a lens, relative to the head of the wearer 226. FIG. 19A illustrates the preferred orientation of the lens 220 relative to the head of the wearer 226, and relative in particular to the straight ahead normal line of sight 230. A downward rake, as illustrated in FIG. 19A, is desirable for a variety of reasons, including improved conformity to common head anatomy. As will be apparent to those of skill in the art in view of the disclosure herein, a lens 220 having a mechanical center point which falls below the horizontal plane intersecting the optical centerline 232 (see FIG. 16B) will permit the lens to be oriented with a downward rake as illustrated in FIGS. 19A-19C and yet preserve a generally parallel relationship between the optical centerline and the straight ahead line of sight. Since the orientation of the lens 220 to the optical centerline 232 in the imaginary sphere should be the same as the orientation between the lens 220 and a parallel to the normal line of sight 230 in the as-worn orientation, any lens cut from this sphere below the optical centerline 232 can be mounted with a corresponding degree of downward rake and achieve the optical correction of the present inventions.

Accordingly, the desired degree of rake may be chosen by specifying a vertical component of the displacement between the normal line of sight 230 and the optical centerline 232, as illustrated in FIG. 19A. Either way, the greater the displacement, the greater the downward rake. In general, the vertical displacement in accordance with some embodiments will be greater than zero. Generally it will be from about 0.1 inches to about 2 inches depending upon base curvature. Preferably, vertical displacement will be from about 0.1 inches to about one inch, or about 0.2 inches or greater. More preferably, it will be from about 0.25 inches to about 0.75 inches and in one embodiment it was about 0.5 inches.

Alternatively, a general profile may be chosen which fixes an orientation of the normal line of sight relative to the curvature of the lens (not accounting for the thickness of the lens). For instance, FIG. 19A provides reference points of a top edge 252 and a bottom edge 254 relative to the normal line of sight 230. This relationship may then be utilized to determine the position on a lens blank from which to cut the lens.

Figure 20A:
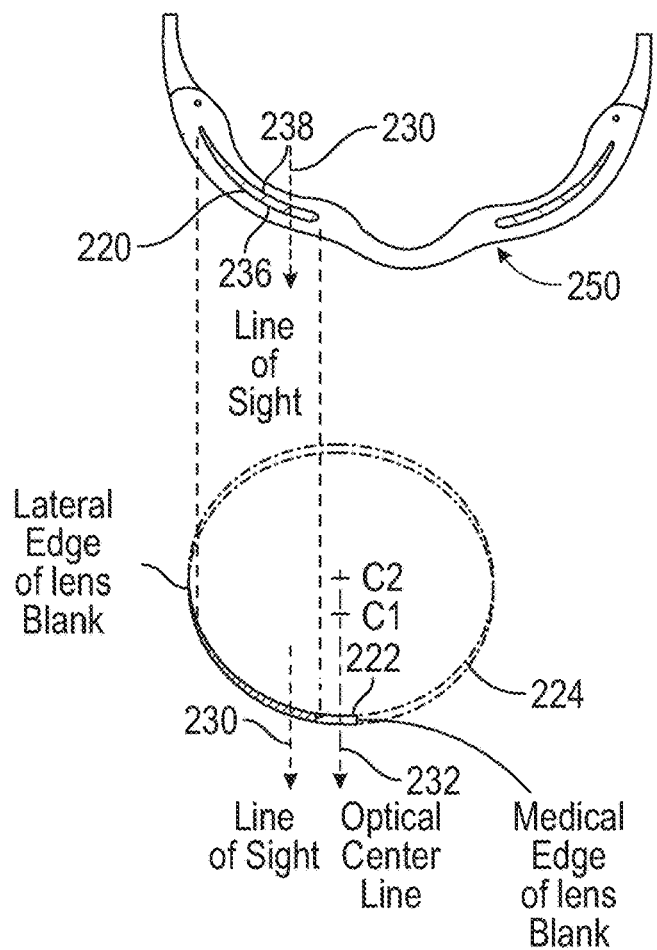
FIGS. 20A and 20B schematically illustrate the projection of the lens horizontal and vertical profiles from a desired orientation within an eyewear frame to the lens blank, in accordance with some embodiments.

Referring now to FIG. 20A, a mapping of the horizontal orientation of the lens 220 onto the lens blank 222 is illustrated. The normal line of sight 230, with respect to which the chosen orientation is measured, is maintained substantially parallel to and offset from the optical centerline 232. The horizontal component of the displacement will generally be within the range of from about 0.1 inches to about 8 inches for lower base curvatures. Additional details relating to lens orientation can be found in U.S. Pat. No. 6,010,218, filed Nov. 7, 1996 entitled Decentered Noncorrective Lens For Eyewear, the disclosure of which is incorporated in its entirety herein by reference.

Figure 20B:
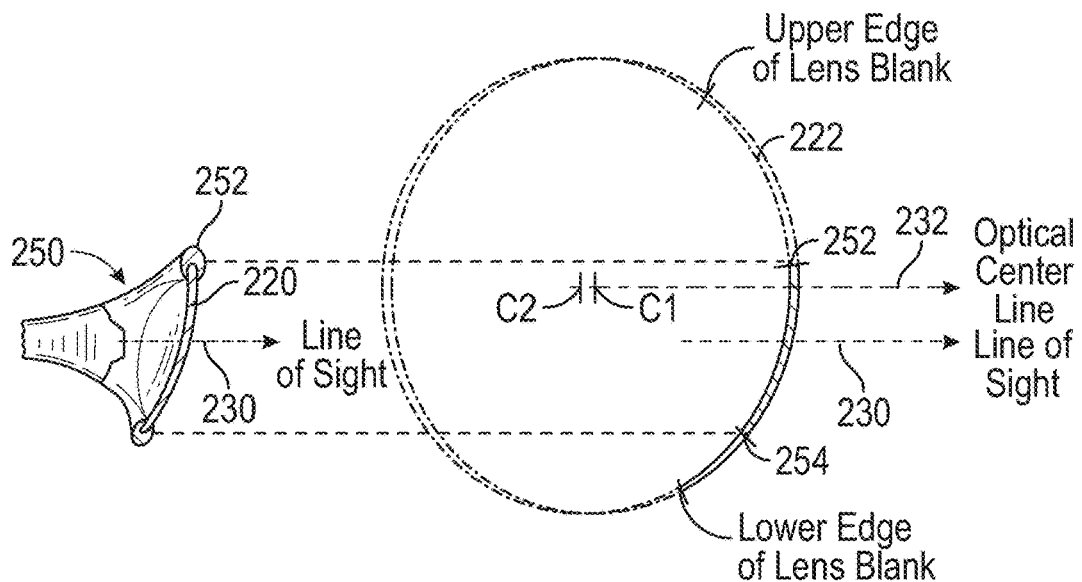

Referring now to FIG. 20B, a mapping of the vertical orientation of the lens 220 onto the lens blank 222 is illustrated. The normal line of sight 230, with respect to which the chosen orientation is measured, is maintained substantially parallel to and vertically offset from the optical centerline 232. As discussed, when arranged in such an orientation, the lens 220 will exhibit minimal optical distortion relative to the line of sight 230. Ideally, the frame 250 is shaped so that when correctly worn, the optical centerline 232 is maintained substantially parallel to the normal line of sight 230.

In the absence of correction as described herein, various factors may alter the orientation of the true optical centerline 232 (as distinguished from the 3D calculated optical centerline) relative to the wearer's line of sight 230 when the eyeglasses are actually worn. For instance, because eyeglasses rest on the wearer's nose, the particular nose shape affects the orientation of the lens relative to the line of sight 230. For noses of different shapes and sizes, the line of sight 230 may not always correctly align with the optical centerline 232 when the eyeglasses are worn. Additionally, different wearers may prefer to position the eyeglasses on various points of the nose, causing the lens to orient differently for each wearer. Hence, although the frame may be designed to minimize optical distortion when the eyeglasses are correctly worn by a person with a particular nose shape, differences in facial geometry, differences in the distance between the points at which the earstems contact the wearer's head, and preferences in the style of wearing the eyeglasses often result in vertical displacement of the lens, causing the optical centerline 232 to lose a parallel alignment with the line of sight 230 when the eyeglasses are actually worn. Left and right pupillary centers may also be asymmetrical. Correction in accordance with the present disclosure allows essentially perfect correction of the optics relative to the 3D computed headform geometry, which will normally translate into a high degree of optical correction in each customized product when placed on the head of the wearer from whom the 3D headform dataset was captured.

Figure 21A:
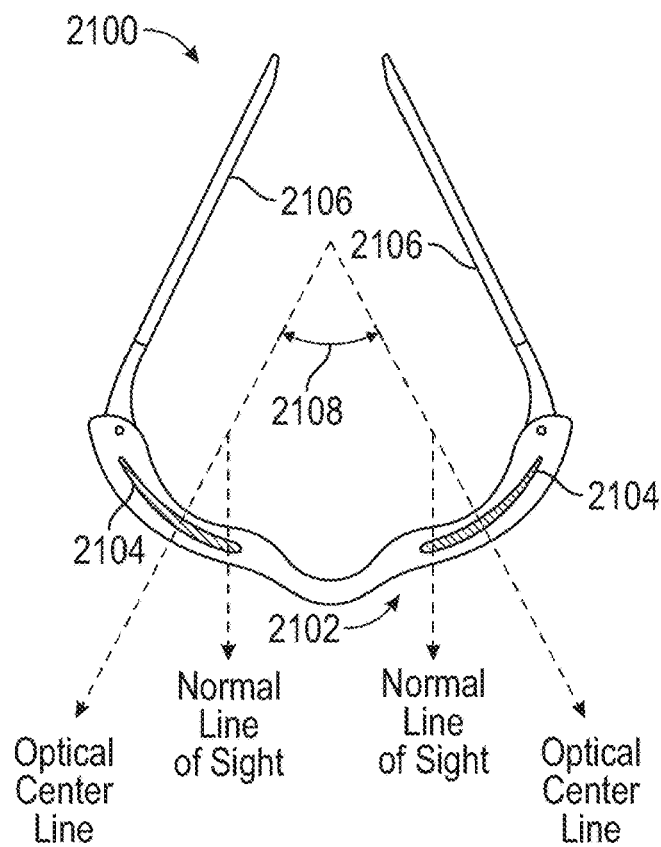
FIGS. 21A and 21B illustrate eyewear in a default non-stressed configuration and in an as-worn stressed configuration.
Figure 21B:
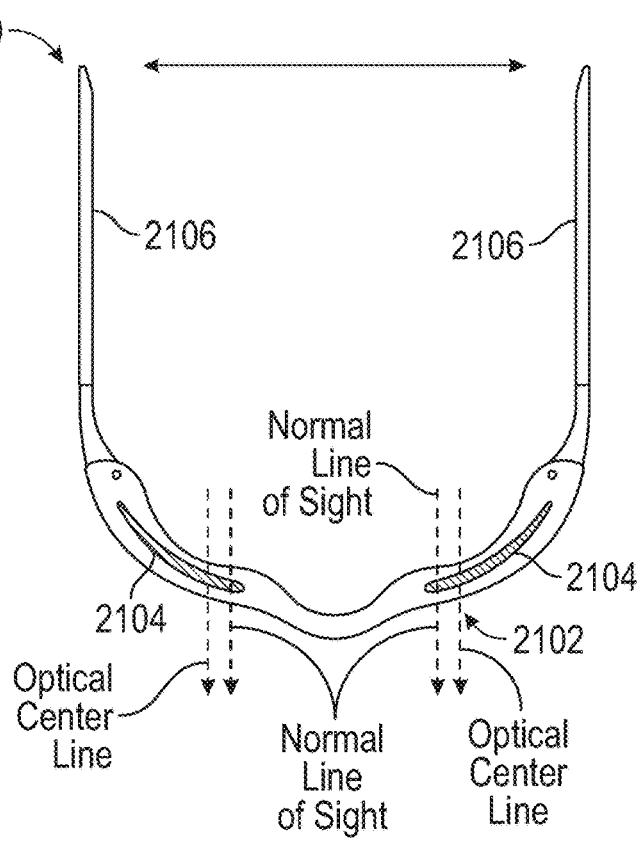

FIGS. 21A and 21B illustrate the customized correction of optical center line alignment based one the degree to which individual wearers are expected to deflect eyewear frames during normal use. The distance between the points at which earstems contact a particular wearer's head may cause excessive or insufficient deflection of the frame in the as-worn configuration. Such excessive or insufficient deflection may cause the optical center line of a lens in the frame to become or remain mis-aligned with, or non-parallel to, the wearer's straight ahead normal line of sight. A second wearer with a different distance between points at which the earstems contact the second wearer's head may cause sufficient deflection to the same frame, such that the optical center line of the lens is aligned with or parallel to the second wearer's straight ahead normal line of sight in the as-worn configuration. Thus, by determining a particular default configuration for an eyewear frame based on the degree to which a particular wearer's head is expected to deflect the eyewear frame in the as-worn configuration, the alignment of optical center lines to straight ahead normal lines of site can be customized and optimized for individual wearers.

FIG. 21A illustrates eyewear 2100 in a default or non-stressed configuration (e.g., as-manufactured and not currently on a wearer's head). The eyewear includes a frame 2102 and at least one lens 2104. A wearer's straight ahead normal line of sight is shown extending through the lens 2104 in an anterior direction away from the eyewear 2100. The straight ahead line of sight is shown as though a wearer is able to look though the eyewear 2100 without changing the default configuration (e.g., without adding stress to the frame 2102, which would normally occur when the earstems 2106 are forced to extend away from each other by the wearer's head in the as-worn configuration). In the default configuration, the optical center line of the lens 2014 is not aligned with or substantially parallel to the wearer's straight ahead normal line of sight. Rather, due to the orientation and geometry of the lens, the optical center line extends away from the lens 2104 at an acute angle with respect to the wearer's straight ahead normal line of sight, as described in greater detail above. For example, the optical center line can be angled away from the straight ahead normal line of sight by at least about 1 degree, at least about 2 degrees, at least about 3 degrees, at least about 4 degrees, at least about 5 degrees, or more, depending upon the degree of deflection expected when the eyewear 2100 is in the as-worn configuration.

In some embodiments, the eyewear 2100 may have two lenses 2104, as shown, or two separate portions of a single lens that wraps around the front of a wearer's face in front of both of the wearer's eyes. In the default configuration, the optical center line of each lens 2104 may extend away from the respective lens 2104 at an acute angle with respect to the wearer's straight ahead normal line of sight from a corresponding eye. The specific angles formed by the left and right optical center lines and corresponding left and right normal lines of sight, respectively, may be the same or may be different, depending upon the specific lens geometry of the respective lenses (e.g., different prescriptions for each eye), the specific alignment of each eye with the corresponding orbital of the eyewear frame 2100, etc.

The angle alpha 2108 between the left optical center line and the right optical centerline may be a least about 2° or at least about 4° or 6° or 10° or 12° or more in the default unstressed configuration in the horizontal plane. For certain frame configurations the angle alpha 2108 can be at least about 15° or 20° or more for certain wearers. The angle alpha 2108 in the default unstressed configuration may be built into the custom eyewear in a variety of ways. For example, the radius of curvature of the front frame may be customized to the head of the wearer. Alternatively, the left and right lenses may be mounted within the orbitals at an orientation that cooperates with the frame geometry to locate the optical centerlines to produce the desired angle. The reduction in, or elimination of, the angle alpha 2108 achieved by wearing the eyewear will be a function of various factors, including frame and ear stem design as well as material selection. The desired unstressed angle alpha 2108 for a given pair of glasses is selected to cooperate with the width of the head of the wearer for which the glasses have been customized, such that when placed on the head of the wearer the angle alpha 2108 is reduced or substantially eliminated as the anterior projections of the optical centerlines rotate medially (e.g., toward parallel with each other and/or with corresponding normal lines of sight). The angle alpha 2108 and/or the angle(s) formed by the optical center line(s) and respective line(s) of sight will generally be reduced by at least about 50%, preferably at least about 75% or 80% or 90% or more upon placement of the eyeglass on the head of the intended wearer.

FIG. 21B illustrates the eyewear 2100 of FIG. 21A in an as-worn stressed configuration (e.g., currently on a wearer's head). In the as-worn configuration, the wearer's head forces the earstems 2106 away from each other. The force applied to the earstems can deflect the frame 2102 from its default configuration. For example, the outward force applied to the earstems can increase the radius of the arc of the frame 2102 (e.g., the portion of the eyewear between the hinges or other points at which the earstems are attached to the frame 2102). The increase in the radius of the arc of the frame 2102 can reorient the lens 2104, thereby reorienting the optical center line of the lens 2104. If the appropriate arc radius is set for the frame 2102 in the default configuration (or the lenses are placed within the frame at the correct angle), as shown in FIG. 21A, then the optical center line may become aligned with or substantially parallel to the straight ahead normal line of sight when the frame 2102 is in the as-worn configuration.

An eyewear model may be placed on a wearer model, and a degree of deflection to the eyewear frame 2102 may be determined based on the distance between the points at which the earstems contact the wear's head in the wearer model. The degree of deflection may be different for different wearers and/or for different distances between points at which earstems contact the wearers' heads. Once the as-worn configuration is determined for a particular wearer (or for a particular distance between points of contact with the earstems), a radius of an arc of the frame 2102 may be determined. The radius may be determined such that the optical center line of the lens 2104 is aligned with, or substantially parallel to, the wearer's straight ahead normal line of sight as represented by the wearer model. In some embodiments, the orientation of the lens 2104 may be adjusted within the frame 2102 instead of or in addition to adjusting the radius of the arc of the frame 2102. Adjusting the orientation of the lens 2104 within the frame 2102 may also bring the optical center line of the lens 2104 in alignment with or substantially parallel to the wearer's straight ahead normal line of sight.

After determination of an as-worn configuration of a frame 2102 for a particular user that places the optical center line of the lens 2104 in alignment with or substantially parallel to the wearer's straight ahead normal line of sight, the default configuration of the frame 2102 may be determined. In some embodiments, the default configuration may be determined by virtually applying an opposite force to the earstems 2106 such that the frame 2102 returns to its default unstressed configuration, as shown in FIG. 21A. The determined default configuration may be the configuration in which the eyewear frame 2102 is produced or customized to achieve.

In some embodiments, the deflection described herein may cause changes to the effective power of prescription lenses. Tables 1 and 2, below, provide example values for the change in power ("refractive power delta") when eyewear undergoes deflection of a particular angle from the default undeflected state to the as-worn deflected state. Table 1 shows example refractive power deltas realized over a range of powers when eyewear with a particular set of specifications (e.g., base curve of 6, wrap angle of 5°, rake angle of 2.5°) undergoes a deflection of 1.25°. Table 2 shows example refractive power deltas realized over the same range of powers when the same or similar eyewear undergoes a deflection of 2.25°. The entries are illustratively only, and may be different for different deflection angles or eyewear with different specifications (e.g., base curve of 9, wrap angle of 10° to 20°, rake angle of 5° to 10°).

TABLE 1

| Power | −8 | −6 | −4 | −2 | 0 | 2 | 4 | 6 | 8 |
|---|---|---|---|---|---|---|---|---|---|
| Wrap Deflection Angle | 1.25° | 1.25° | 1.25° | 1.25° | 1.25° | 1.25° | 1.25° | 1.25° | 1.25° |
| Sphere Compensated Power Without Deflection | −7.96 | −5.97 | −3.98 | −1.99 | 0 | 2 | 3.99 | 5.99 | 7.99 |
| Sphere Compensated Power With Deflection | −7.94 | −5.95 | −3.97 | −1.98 | 0 | 2 | 3.99 | 5.99 | 7.98 |
| Refractive Power Delta | 0.02 | 0.02 | 0.01 | 0.01 | 0 | 0 | 0 | 0 | −0.01 |

TABLE 2

| Power | −8 | −6 | −4 | −2 | 0 | 2 | 4 | 6 | 8 |
|---|---|---|---|---|---|---|---|---|---|
| Wrap Deflection Angle | 2.25° | 2.25° | 2.25° | 2.25° | 2.25° | 2.25° | 2.25° | 2.25° | 2.25° |
| Sphere Compensated Power Without Deflection | −7.96 | −5.97 | −3.98 | −1.99 | 0 | 2 | 3.99 | 5.99 | 7.99 |
| Sphere Compensated Power With Deflection | −7.91 | −5.93 | −3.95 | −1.98 | 0 | 1.99 | 3.99 | 5.98 | 7.98 |
| Refractive Power Delta | 0.05 | 0.04 | 0.03 | 0.01 | 0 | −0.01 | 0 | −0.01 | −0.01 |

As shown, the refractive power delta experienced over a given deflection angle generally decreases as the power is changed from −8 to 0 to +8. The decrease in refractive power delta is generally linear, although the decrease may be smaller between positive powers than negative powers (e.g., in Table 2, the delta changes from 0 to −0.01 as the power changes from 0 to 8, whereas the delta changes from 0.05 to 0 as the power changes from −8 to 0).

In some embodiments, the refractive power delta experienced over a given deflection angle may be used to customize the prescription of lenses mounted in an eyewear frame. For example, the eyewear models and wearer models described above may be used to determine that a particular eyewear frame is expected to deflect 2.25° for a particular wearer. The wearer may have a prescription for −6 diopter powered lenses. Thus, to compensate for the increase of 0.04 diopters in the deflected state (−5.97 to −5.93 as the frame moves from undeflected to deflected), the power in the undeflected state can be reduced by 0.04. In this example, a power of about −6.01 in the undeflected state would produce the desired power of about −5.97 in the deflected state. However, if the wearer has a prescription for −2 diopter powered lenses, power in the undeflected state would only be reduced by 0.01, rather than 0.04, to compensate for the 0.01 power delta experienced by −2 diopter lenses.

Terminology

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or combinations of electronic hardware and computer software. To clearly illustrate this interchangeability of hardware and software, various illustrative components, blocks, modules, and steps have been described above generally in terms of their functionality. Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

While the above detailed description has shown, described, and pointed out novel features as applied to various embodiments, it can be understood that various omissions, substitutions, and changes in the form and details of the devices or algorithms illustrated can be made without departing from the spirit of the disclosure. Any structure, feature, step, or process disclosed herein in one embodiment can be used separately or combined with or used instead of any other structure, feature, step, or process disclosed in any other embodiment. Also, no structure, feature, step, or processes disclosed herein is essential or indispensable; any may be omitted in some embodiments. The scope of certain embodiments disclosed herein is indicated by the appended claims rather than by the foregoing description. All changes which come within the meaning and range of equivalency of the claims are to be embraced within their scope.

Some aspects of the inventions are set forth in the following clauses:

1. A system for customizing an eyewear component, comprising:
   an input for receiving data representative of a three dimensional configuration of a portion of a wearer's face;
   an input for receiving data representative of a desired position where the wearer would like an eyewear frame to reside on the wearer's face;
   a processor for determining a change in configuration of an eyewear component blank, which will allow the eyewear frame to reside in the desired position; and
   an eyewear component modifier for modifying the eyewear component blank so that the frame will reside in the desired position.

2. A system as in Clause 1, wherein the input for receiving data representative of a three dimensional configuration comprises an electrical connector.

3. A system as in Clause 1, wherein the input for receiving data representative of a three dimensional configuration comprises a wireless link.

4. A system as in Clause 1, wherein the input for receiving data representative of a three dimensional configuration comprises a camera array.

5. A system as in any of Clauses 1-4, wherein the eyewear component blank modifier is configured to remove material from the eyewear component blank.

6. A system as in any of Clauses 1-4, wherein the eyewear component blank modifier is configured to add material to the eyewear component blank.

7. A system as in any of Clauses 1-4, wherein the eyewear component blank comprises a nosepiece blank.

8. A system as in any of Clauses 1-4, wherein the eyewear component blank comprises an eyewear frame blank.

9. A method of making customized eyewear, comprising:
   obtaining a data set representative of a three dimensional configuration of a portion of a wearer's face;
   obtaining a data set representative of a desired position where the wearer would like eyewear to reside on the wearer's face;
   determining a change in the configuration of a nose region on the eyewear, to cause the eyewear to reside in the desired position; and
   modifying the nose region on the eyewear to cause the eyewear to reside in the desired position.

10. A method as in Clause 9, wherein the obtaining a data set representative of a three dimensional configuration of a portion of a wearer's face step comprises obtaining data captured as photographic images of the wearer.

11. A method as in Clauses 9 or 10, wherein the obtaining a data set representative of a desired position step comprises capturing data representative of the eyewear in the desired position relative to the data set representative of the three dimensional configuration of the portion of the wearer's face.

12. A method as in Clauses 9, 10, or 11, wherein the determining step comprises determining a positive or negative variance between the nose region and the three dimensional configuration of the portion of the wearer's face to position the eyewear in the desired position.

13. A method as in any of Clauses 9-12, wherein the modifying step comprises removing material from the nose region.

14. A method as in any of Clauses 9-12, wherein the modifying step comprises adding material to the nose region.

15. A method as in any of Clauses 9-12, wherein the modifying step comprises adding a nosepiece subassembly to the eyewear.

16. A method as in any of Clauses 9-15, wherein the eyewear comprises an eyeglass.

17. A method as in any of Clauses 9-15, wherein the eyewear comprises a goggle.

18. A three dimensional orientationally corrected eyeglass, comprising a frame, at least one lens, a left earstem, a right earstem and a nonadjustable nosepiece, wherein the nosepiece comprises bilateral asymmetry configured to complement a bilateral asymmetry of a wearer's face, to position the eyeglass in a preselected orientation on the wearer's face.

19. A three dimensional orientationally corrected eyeglass as in Clause 18, wherein the eyeglass has a central horizontal plane which lies substantially on a transverse plane extending through the wearer when the eyeglass is worn in the preselected corrected orientation.

20. A three dimensional orientationally corrected eyeglass as in Clauses 18 or 19, wherein the eyeglass conforms to the surface of a three dimensional model representative of a wearer's head.

21. A three dimensional orientationally corrected eyeglass as in Clauses 18, 19, or 20, further comprising at least one lens having an optical centerline.

22. A three dimensional orientationally corrected eyeglass as in Clause 21, wherein the three dimensional model defines a calculated straight ahead line of sight which crosses the center of a pupil and extends in an anterior posterior direction along the intersection of a vertical plane parallel to the model's central sagittal plane and a horizontal plane which is parallel to the model's central transverse plane, and wherein the optical centerline of the lens is substantially parallel to the calculated straight ahead line of sight when the three dimensional configuration of the eyeglass is positioned in the as-worn orientation on the three dimensional model representative of the wearer's head.

23. A nosepiece for eyeglasses, the nosepiece having left and right dermal contact surfaces having a total surface area, wherein at least 85% of the total dermal contact surface conforms to the three dimensional configuration of the corresponding surface of a wearer's nose.

24. A nosepiece as in Clause 23, wherein at least 95% of the total dermal contact surface conforms to the three dimensional configuration of the corresponding surface of a wearer's nose.

25. A method of making a customized wearable device, comprising the steps of:
  obtaining a data set representative of a three dimensional configuration of a portion of a wearer's body;
  obtaining a data set representative of a desired position where the wearer would like the wearable device to reside on the wearer's body;
  determining a change in the configuration of a surface on the wearable device that brings the surface of the wearable device into conformity with the data set representative of the three dimensional configuration of the portion of the wearer's body; and
  modifying the surface on the wearable device cause the device to conform to the data set representative of the three dimensional configuration of the portion of the wearer's body in the desired position.

26. A method of making a customized wearable device as in Clause 25, wherein the wearable device comprises a head worn device.

27. A method of making a customized wearable device as in Clause 26, wherein the wearable device comprises a helmet.

28. A method of making a customized wearable device as in Clause 26, wherein the wearable device comprises an eyeglass.

29. A method of making a customized wearable device as in Clause 26, wherein the wearable device comprises a goggle.

30. An eyeglass comprising a frame, at least one lens having an optical centerline, a left earstem, and a right earstem,
  wherein a wearer model corresponding to a three dimensional model of at least a portion of a wearer's head defines a calculated straight ahead line of sight which crosses a center of a pupil and extends in an anterior posterior direction along an intersection of a vertical plane parallel to the wearer model's central sagittal plane and a horizontal plane which is parallel to the wearer model's central transverse plane, and
  wherein the optical centerline of the at least one lens is substantially parallel to the calculated straight ahead line of sight when a three dimensional configuration of the eyeglass is positioned in an as-worn orientation on the wearer model.

31. An eyeglass comprising a frame, at least one lens having a progressive lens power transition corridor, a left earstem, and a right earstem,
  wherein a wearer model corresponding to a three dimensional model of at least a portion of a wearer's head defines a plurality of lines of sight, individual lines of sight corresponding to individual progressive lens powers, and
  wherein the progressive lens power transition corridor of the at least one lens is configured such that individual progressive lens powers are aligned with the corresponding individual lines of sight of the wearer when a three dimensional configuration of the eyeglass is positioned in an as-worn orientation on the wearer model.

What is claimed is:

1. A system for customizing eyewear, the system comprising:
  an input for receiving first data representative of a three dimensional configuration of a portion of a wearer's face;
  an input for receiving second data representative of a wearer preference regarding a desired position at which an eyewear frame is to reside with respect to the wearer's face, wherein the desired position is based at least in part on a reference device having a first standardized positional indicator located at an upper left outer corner of a front of the reference device and a second standardized positional indicator located at an upper right outer corner of the front of the reference device, and a horizontal reference position of the reference device with respect to the wearer's head while being worn, the horizontal reference position based at least in part on the first and second standardized positional indicators;
  a processor for determining a change to at least a portion of an eyewear frame based at least partly on the first data, the second data, and a comparison of the first and second data, the change allowing the eyewear frame to reside substantially in the desired position having a correct horizontal reference position with respect to the wearer's head; and
  an eyewear modifier for modifying at least the portion of the eyewear frame so that the eyewear frame will reside substantially in the desired position having the correct horizontal reference position with respect to the wearer's head.

2. The system of claim 1, wherein the first data representative of the three dimensional configuration of the portion of the wearer's face comprises data regarding at least one of a tear duct location, an eye corner location, a pupil location, a brow location, an ear location, a nasion location, a distance between eyes, a surface contour of a nose, a surface contour of a cheek, an eye plane, a vertical center plane, a nasion plane, and a rearward nasion plane.

3. The system of claim 1, wherein the second data representative of the wearer preference further comprises data regarding a location of a portion of the eyewear frame with respect to a facial structure of the wearer, wherein the facial structure is at least one of an eyelash and an ear slot defined by the space between the wearer's ear and the wearer's scalp.

4. The system of claim 1, wherein the second data representative of the wearer preference further comprises data regarding at least one of pressure exerted by an earstem of the reference device on the wearer's head and an amount of deflection of the reference device while being worn by the wearer.

5. The system of claim 1, wherein determining the change to at least the portion of the eyewear frame comprises selecting a modular component, for installation in a portion of the eyewear frame, from a plurality of modular components configured to be installed in at least the portion of the eyewear frame, and
wherein the modular component comprises at least one of a modular nosepad, a modular nosepiece, a modular earstem, a modular orbital, a modular bridge, and a modular component comprising a nosepiece and a bridge.

6. The system of claim 1, wherein modifying the portion of the eyewear frame comprises adding material to the portion of the eyewear frame so that the eyewear frame will reside substantially in the desired position having the correct horizontal reference position with respect to the wearer's head.

7. The system of claim 1, wherein determining the change to at least the portion of the eyewear frame further comprises:
determining, based at least partly on third data representative of a three dimensional configuration of the eyewear frame, a range of measurements within which at least the portion of the eyewear frame is permitted to be modified;
determining that modifying at least the portion of the eyewear frame to correspond to a measurement within the range of measurements will cause, at least in part, the eyewear frame to reside substantially in the desired position; and
determining a change to at least the portion of the eyewear frame that will cause the portion of the eyewear frame to correspond to the measurement.

8. The system of claim 1, further comprising determining that the change to at least the portion of the eyewear frame will not cause any portion of the eyewear frame to reside within a threshold distance of at least one of a tear duct, an eyelash, a brow, and a cheek.

9. The system of claim 1, wherein at least a portion of a three dimensional model of the eyewear frame is deflected with respect to an undeflected state when the three dimensional model of the eyewear frame is placed in an as-worn configuration on a three dimensional model of the wearer, and wherein deflection of at least the portion of the three dimensional model of the eyewear is reversed subsequent to determining the change to at least the portion of the eyewear frame to generate a customized eyewear model in an undeflected state.

10. The system of claim 9, wherein the customized eyewear model comprises a lens having an optical centerline, and wherein a deflection causes, at least in part, the optical centerline to move from a first orientation that is non-parallel with respect to a calculated straight-ahead line of sight of the wearer to a second orientation that is substantially parallel to the calculated straight ahead line of sight of the wearer.

11. A method of making customized eyewear, comprising:
obtaining a first data set representative of a three dimensional configuration of a portion of a wearer's face;
obtaining a second data set representative of a wearer preference regarding a desired position at which eyewear is to reside on the wearer's face, wherein the second data set is obtained while the wearer is wearing a reference device comprising a first standardized positional indicator located at an upper left outer corner of a front of the reference device and a second standardized positional indicator located at an upper right outer corner of the front of the reference device, and wherein the desired position is determined at least in part by a horizontal reference position of the reference device with respect to the wearer's head while being worn, the horizontal reference position based at least in part on the first and second standardized positional indicators;
determining, with a processor, a change in configuration of at least a portion of the eyewear based at least partly on the first data set and the second data set, the change allowing the eyewear to reside in the desired position having a correct horizontal reference position with respect to the wearer's head; and
modifying at least a portion of the eyewear so that the eyewear will reside in the desired position having a correct horizontal reference position with respect to the wearer's head,
wherein the first data set is obtained while the wearer is not wearing the reference device or an eyeglass frame.

12. The method of claim 11, wherein determining the change in configuration of at least the portion of the eyewear comprises determining a positive or negative variance between a nose region of the eyewear and the three dimensional configuration of the portion of the wearer's face to position the eyewear in the desired position.

13. The method of claim 12, wherein modifying the portion of the eyewear comprises adding material to the nose region so that the eyewear will reside substantially in the desired position having the correct horizontal reference position with respect to the wearer's head.

14. The method of claim 11, wherein modifying the portion of the eyewear comprises adding a nosepiece subassembly to the eyewear.

15. A non-transitory computer-readable storage comprising executable instructions that, when executed by a computing system, cause the computing system to perform a process comprising:
obtaining a first data set representative of a three dimensional configuration of a portion of a wearer's body;
obtaining a second data set representative of a wearer preference regarding a desired position at which a wearable device is to reside on the wearer's body, wherein the second data set is obtained while the wearer is wearing a reference device comprising a first standardized positional indicator located at an upper left outer corner of a front of the reference device and a second standardized positional indicator located at an upper right outer corner of the front of the reference device, and wherein the desired position is determined at least in part by a horizontal reference position of the reference device with respect to the wearer's head while being worn, the horizontal reference position based at least in part on the first and second standardized positional indicators;
determining a change in a configuration of a surface of the wearable device that brings the surface of the wearable device into conformity with the first data set representative of the three dimensional configuration of the portion of the wearer's body; and
modifying the surface on the wearable device to cause the wearable device to conform to the first data set representative of the three dimensional configuration of the portion of the wearer's body in the desired position.

16. The non-transitory computer-readable storage of claim 15, wherein the wearable device comprises a helmet.

17. The non-transitory computer-readable storage of claim claim 15, wherein the wearable device comprises eyewear.

18. The non-transitory computer-readable storage of claim 15, wherein modifying the surface of the wearable device comprises selecting a modular nosepiece from a plurality of modular nosepieces, and installing the modular nosepiece so that the wearable device will reside substantially in the desired position having a correct horizontal reference position with respect to the wearer's head.

19. The system of claim 1, wherein determining the change to at least the portion of the eyewear frame comprises selecting a modular component, for installation in a portion of the eyewear frame, from a plurality of modular components configured to be installed in at least the portion of the eyewear frame.

20. The system of claim 1, wherein the reference device comprises at least one of a pressure sensor, at least one manually adjustable lens panel to measure at least one eyelash, and at least one manually adjustable earstem to correct or measure at least a vertical displacement of one ear with respect to a second ear.

21. The system of claim 1, wherein the reference device is colored to facilitate digital removal of the reference device from scan data.

22. The system of claim 1, wherein the processor is configured to correlate at least a portion of the first data with at least a portion of the second data based at least partly on data representing a feature of the wearer's face being present in both the first data and the second data.

23. The system of claim 1, wherein the second data further comprises a preference weighting for a parameter of the eyewear frame, and wherein the processor is configured to determine the change to at least the eyewear frame based at least partly on the preference weighting and a baseline weighting for the parameter.

24. The method of claim 11, further comprising generating an image of the wearer wearing the reference device, wherein the reference device comprises at least one of a pressure sensor, at least one manually adjustable lens panel to measure at least one eyelash, and at least one manually adjustable earstem to correct or measure at least a vertical displacement of one ear with respect to a second ear.

25. The method of claim 11, further comprising correlating at least a portion of the first data set with at least a portion of the second data set based at least partly on data representing a feature of the wearer's face being present in both the first data set and the second data set, wherein the feature of the wearer's face corresponds to a point at which a three dimensional model of the eyewear contacts a three dimensional model of an ear of the wearer.

26. The non-transitory computer-readable storage of claim 15, wherein the reference device comprises at least one of a pressure sensor, at least one manually adjustable lens panel to measure at least one eyelash, and at least one manually adjustable earstem to correct or measure at least a vertical displacement of one ear with respect to a second ear.

27. The non-transitory computer-readable storage of claim 15, wherein determining the change in the configuration of the surface of the wearable device is based at least partly on a preference weighting for a parameter of the wearable device and a baseline weighting for the parameter.

28. A system for customizing eyewear, the system comprising:
an input for receiving first data representative of a three dimensional configuration of a portion of a wearer's face;
an input for receiving second data representative of a wearer preference regarding a desired position at which an eyewear frame is to reside with respect to the wearer's face, based at least in part on a reference device configured to be worn by the wearer, a first standardized positional indicator located at an upper left outer corner of a front of the reference device, and a second standardized positional indicator located at an upper right outer corner of the front of the reference device; wherein the second data representative of the wearer preference is obtained using the reference device when worn by the wearer;
a processor for determining a change to at least a portion of an eyewear frame based at least partly on the first data and the second data, the change allowing the eyewear frame to reside substantially in the desired position; and
an eyewear modifier for modifying the portion of the eyewear frame so that the eyewear frame will reside substantially in the desired position,
wherein the second data representative of the wearer preference further comprises data regarding at least one of a pressure exerted by an earstem of the reference device on the wearer's head and an amount of deflection of the reference device while being worn by the wearer.

29. The system of claim 28, wherein determining the change to at least the portion of the eyewear frame comprises selecting a modular component, for installation in a portion of the eyewear frame, from a plurality of modular components configured to be installed in at least the portion of the eyewear frame, wherein the modular component comprises at least one of a modular nosepad, a modular nosepiece, a modular earstem, a modular orbital, a modular bridge, and a modular component comprising a nosepiece and a bridge.

30. The system of claim 28, wherein the reference device comprises at least one of a pressure sensor, at least one manually adjustable lens panel to measure at least one eyelash, and at least one manually adjustable earstem to correct or measure at least a vertical displacement of one ear with respect to a second ear.

31. The system of claim 1, wherein the horizontal reference position is a virtual horizontal reference position to define an upper location of the eyewear frame with respect to the wearer's head while being worn.

32. The system of claim 1, wherein the horizontal reference position is based at least in part on a virtual horizontal reference line to define an upper location of the eyewear frame with respect to the wearer's head while being worn, the virtual horizontal reference line based at least in part on the first and the second standardized positional indicators.

33. The system of claim 1, wherein the desired position is further based at least in part on a reference difference between a reference first distance and a reference second distance, the reference first distance being from a first tear duct of the wearer's face to a first nosepiece side of the reference device and the reference second distance being from a second tear duct of the wearer's face to a second nosepiece side of the reference device, and
wherein the eyewear modifier modifies the portion of the eyewear frame such that the portion of the eyewear frame comprises a bilateral asymmetry configured to complement and not accentuate a bilateral asymmetry of the wearer's face to maintain the eyewear frame in the desired position, the bilateral asymmetry of the portion of the eyewear frame comprising a difference between a first distance and a second distance that is less than the reference difference, the first distance being from the first tear duct of the wearer's face to a first nosepiece side of the eyewear frame and the second distance being from the second tear duct of the wearer's face to a second nosepiece side of the eyewear frame.

\* \* \* \* \*